United States Patent
Buchberger, Jr. et al.

(10) Patent No.: US 7,196,283 B2
(45) Date of Patent: Mar. 27, 2007

(54) PLASMA REACTOR OVERHEAD SOURCE POWER ELECTRODE WITH LOW ARCING TENDENCY, CYLINDRICAL GAS OUTLETS AND SHAPED SURFACE

(75) Inventors: Douglas A. Buchberger, Jr., Livermore, CA (US); Daniel J. Hoffman, Saratoga, CA (US); Olga Regelman, Daly City, CA (US); James Carducci, Sunnyvale, CA (US); Keiji Horioka, Chiba (JP); Jang Gyoo Yang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 261 days.

(21) Appl. No.: 11/046,538

(22) Filed: Jan. 28, 2005

(65) Prior Publication Data

US 2005/0178748 A1    Aug. 18, 2005

Related U.S. Application Data

(63) Continuation-in-part of application No. 10/754,280, filed on Jan. 8, 2004, which is a continuation-in-part of application No. 10/028,922, filed on Dec. 19, 2001, now Pat. No. 7,030,335, which is a continuation-in-part of application No. 09/527,342, filed on Mar. 17, 2000, now Pat. No. 6,528,751.

(51) Int. Cl.
*B23K 9/00* (2006.01)

(52) U.S. Cl. ............................ 219/121.43; 219/121.52; 219/121.51; 204/298.33; 315/111.21; 315/111.51; 156/345.34

(58) Field of Classification Search ............. 219/121.4, 219/121.41, 121.43, 121.52, 121.51, 121.48; 315/111.21, 111.51; 204/298.33; 156/345.34; 118/723 R, 723 I
See application file for complete search history.

(56) References Cited

U.S. PATENT DOCUMENTS 2,951,960 A    9/1960    Watrous, Jr. ................. 313/36

(Continued)

FOREIGN PATENT DOCUMENTS

EP    0 343 500 A1    11/1989

(Continued)

OTHER PUBLICATIONS

King, Ronald W.P., "Transmission-Line Theory", Dover Publications, Inc., 1965, New York, pp. 1-10 and 282-286.

(Continued)

*Primary Examiner*—Mark Paschall
(74) *Attorney, Agent, or Firm*—Robert M. Wallace

(57) ABSTRACT

An overhead gas distribution electrode forming at least a portion of the ceiling of a plasma reactor has a bottom surface facing a processing zone of the reactor. The electrode includes a gas supply manifold for receiving process gas at a supply pressure at a top portion of the electrode and plural pressure-dropping cylindrical orifices extending axially relative to the electrode from the gas supply manifold at one end of each the orifice. A radial gas distribution manifold within the electrode extends radially across the electrode. Plural axially extending high conductance gas flow passages couple the opposite ends of respective ones of the plural pressure-dropping orifices to the radial gas distribution manifold. Plural high conductance cylindrical gas outlet holes are formed in the plasma-facing bottom surface of the electrode and extend axially to the radial gas distribution manifold.

48 Claims, 26 Drawing Sheets

U.S. PATENT DOCUMENTS

| | | | |
|---|---|---|---|
| 2,967,926 A | 1/1961 | Edstrom | 219/75 |
| 3,355,615 A | 11/1967 | Bihan et al. | 313/63 |
| 3,610,986 A | 10/1971 | King | 313/63 |
| 4,458,180 A | 7/1984 | Sohval | 315/111.81 |
| 4,464,223 A | 8/1984 | Gorin | 156/643 |
| 4,570,106 A | 2/1986 | Sohval et al. | 315/111.81 |
| 4,579,618 A | 4/1986 | Celestino et al. | 156/345 |
| 4,792,378 A | 12/1988 | Rose et al. | 156/643 |
| 4,859,908 A | 8/1989 | Yoshida et al. | 315/111.81 |
| 4,888,518 A | 12/1989 | Grunwald | 313/40 |
| 4,973,883 A | 11/1990 | Hirose et al. | 315/111.41 |
| 4,990,229 A | 2/1991 | Campbell et al. | 204/298.06 |
| 5,006,760 A | 4/1991 | Drake, Jr. | 315/111.21 |
| 5,017,835 A | 5/1991 | Oechsner | 315/111.81 |
| 5,032,202 A | 7/1991 | Tsai et al. | 156/345 |
| 5,053,678 A | 10/1991 | Koike et al. | 315/111.81 |
| 5,055,853 A | 10/1991 | Garnier | 343/769 |
| 5,077,499 A | 12/1991 | Oku | 315/111.21 |
| 5,089,083 A | 2/1992 | Kojima et al. | 156/643 |
| 5,107,170 A | 4/1992 | Ishikawa et al. | 313/362.1 |
| 5,115,167 A | 5/1992 | Ootera et al. | 315/111.21 |
| 5,122,251 A | 6/1992 | Campbell et al. | 204/298.06 |
| 5,140,223 A | 8/1992 | Gesche et al. | 315/111.21 |
| 5,175,472 A | 12/1992 | Johnson et al. | 315/111.21 |
| 5,195,045 A | 3/1993 | Keane et al. | 364/482 |
| 5,198,725 A | 3/1993 | Chen et al. | 315/111.41 |
| 5,210,466 A | 5/1993 | Collins et al. | 315/111.21 |
| 5,213,658 A | 5/1993 | Ishida | 156/643 |
| 5,218,271 A | 6/1993 | Egorov et al. | 315/111.61 |
| 5,223,457 A | 6/1993 | Mintz et al. | 437/225 |
| 5,225,024 A | 7/1993 | Hanley et al. | 156/345 |
| 5,246,532 A | 9/1993 | Ishida | 156/345 |
| 5,256,931 A | 10/1993 | Bernadet | 313/360.1 |
| 5,272,417 A | 12/1993 | Ohmi | 315/111.21 |
| 5,273,610 A | 12/1993 | Thomas, III et al. | 156/62.7 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,314,603 A | 5/1994 | Sugiyama et al. | 204/298.32 |
| 5,325,019 A | 6/1994 | Miller et al. | 315/111.21 |
| 5,401,351 A | 3/1995 | Samukawa | 156/345 |
| 5,432,315 A | 7/1995 | Kaji et al. | 219/121.43 |
| 5,453,305 A | 9/1995 | Lee | 427/562 |
| 5,463,525 A | 10/1995 | Barnes et al. | 361/234 |
| 5,467,013 A | 11/1995 | Williams et al. | 324/127 |
| 5,474,648 A | 12/1995 | Patrick et al. | 156/627.1 |
| 5,512,130 A | 4/1996 | Barna et al. | 156/651.1 |
| 5,534,070 A | 7/1996 | Okamura et al. | 118/723 |
| 5,537,004 A | 7/1996 | Imahashi et al. | 315/111.21 |
| 5,554,223 A | 9/1996 | Imahashi | 118/723 |
| 5,556,549 A | 9/1996 | Patrick et al. | 216/61 |
| 5,556,717 A | 9/1996 | Kondo | 428/694 |
| 5,567,268 A | 10/1996 | Kadomura | 156/345 |
| 5,576,600 A | 11/1996 | McCrary et al. | 315/111.21 |
| 5,576,629 A | 11/1996 | Turner et al. | 324/709 |
| 5,587,038 A | 12/1996 | Cecchi et al. | 156/345 |
| 5,592,055 A | 1/1997 | Capacci et al. | 315/111.21 |
| 5,595,627 A | 1/1997 | Inazawa et al. | 156/643.1 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,660,671 A | 8/1997 | Harada et al. | 156/345 |
| 5,662,770 A | 9/1997 | Donohoe | 438/716 |
| 5,674,321 A | 10/1997 | Pu et al. | 118/723 |
| 5,685,914 A | 11/1997 | Hills et al. | 118/723 |
| 5,705,019 A | 1/1998 | Yamada et al. | 156/345 |
| 5,707,486 A | 1/1998 | Collins | 156/643.1 |
| 5,710,486 A | 1/1998 | Ye et al. | 315/111.21 |
| 5,720,826 A | 2/1998 | Hayashi et al. | 136/249 |
| 5,733,511 A | 3/1998 | De Francesco | 422/186.05 |
| 5,770,922 A | 6/1998 | Gerrish et al. | 315/111.21 |
| 5,792,376 A | 8/1998 | Kanai et al. | 216/71 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,858,819 A | 1/1999 | Miyasaka | 438/149 |
| 5,863,376 A | 1/1999 | Wicker et al. | 156/345 |
| 5,866,986 A | 2/1999 | Pennington | 315/111.21 |
| 5,868,848 A | 2/1999 | Tsukamoto | 118/723 |
| 5,885,358 A | 3/1999 | Maydan et al. | 118/723 |
| 5,904,799 A | 5/1999 | Donohoe | 156/345 |
| 5,914,568 A | 6/1999 | Nonaka | 315/111.21 |
| 5,929,717 A | 7/1999 | Richardson et al. | 333/17.3 |
| 5,936,481 A | 8/1999 | Fuji | 333/17.3 |
| 5,939,886 A | 8/1999 | Turner et al. | 324/464 |
| 5,942,074 A | 8/1999 | Lenz et al. | 156/345 |
| 5,971,591 A | 10/1999 | Vona et al. | 364/478.08 |
| 5,997,962 A | 12/1999 | Ogasawara et al. | 427/535 |
| 6,016,131 A | 1/2000 | Sato et al. | 343/895 |
| 6,043,608 A | 3/2000 | Samukawa et al. | 315/111.51 |
| 6,079,356 A | 6/2000 | Umotoy et al. | 118/723 |
| 6,089,182 A | 7/2000 | Hama | 118/723 |
| 6,093,457 A | 7/2000 | Okumura et al. | 427/569 |
| 6,095,084 A | 8/2000 | Shamouilian et al. | 118/723 E |
| 6,096,160 A | 8/2000 | Kadomura | 156/345 |
| 6,106,663 A | 8/2000 | Kuthi et al. | 156/345 |
| 6,110,395 A | 8/2000 | Gibson, Jr. | 216/67 |
| 6,113,731 A | 9/2000 | Shan et al. | 156/345 |
| 6,142,096 A | 11/2000 | Sakai et al. | 118/723 |
| 6,152,071 A | 11/2000 | Akiyama et al. | 118/723 |
| 6,155,200 A | 12/2000 | Horijke et al. | 118/723 |
| 6,162,709 A | 12/2000 | Raoux et al. | 438/513 |
| 6,174,450 B1 | 1/2001 | Patrick et al. | 216/61 |
| 6,188,564 B1 | 2/2001 | Hao | 361/234 |
| 6,213,050 B1 | 4/2001 | Liu et al. | 118/723 |
| 6,218,312 B1 | 4/2001 | Collins et al. | 438/723 |
| 6,245,190 B1 | 6/2001 | Masuda et al. | 156/345 |
| 6,251,216 B1 | 6/2001 | Okamura et al. | 156/345 |
| 6,262,538 B1 | 7/2001 | Keller | 315/111.21 |
| 6,284,673 B2 | 9/2001 | Dunham | 438/758 |
| 6,290,806 B1 | 9/2001 | Donohoe | 156/345 |
| 6,291,999 B1 | 9/2001 | Nishimori et al. | 324/464 |
| 6,337,292 B1 | 1/2002 | Kim et al. | 438/787 |
| 6,346,915 B1 | 2/2002 | Okumura et al. | 343/701 |
| RE37,580 E | 3/2002 | Barnes et al. | 361/234 |
| 6,449,568 B1 | 9/2002 | Gerrish | 702/60 |
| 6,451,703 B1 | 9/2002 | Liu et al. | 438/710 |
| 6,462,481 B1 | 10/2002 | Holland et al. | 315/111.21 |
| 6,528,751 B1 | 3/2003 | Hoffman et al. | 219/121.43 |
| 6,586,886 B1 | 7/2003 | Katz et al. | 315/111.21 |
| 6,599,367 B1 | 7/2003 | Nakatsuka | 118/715 |
| 6,652,712 B2 | 11/2003 | Wang et al. | 156/345.48 |
| 6,663,715 B1 | 12/2003 | Yuda et al. | 118/723 |
| 6,894,245 B2 | 5/2005 | Hoffman et al. | 219/121.43 |
| 2002/0139477 A1 | 10/2002 | Ni et al. | 156/345.44 |
| 2003/0132195 A1 | 7/2003 | Edamura et al. | 216/59 |
| 2003/0168427 A1 | 9/2003 | Flamm et al. | 216/2 |

FOREIGN PATENT DOCUMENTS

| | | |
|---|---|---|
| EP | 0 678 903 | 10/1995 |
| EP | 0 719 447 | 7/1998 |
| WO | WO 01/71765 | 9/2001 |

OTHER PUBLICATIONS

U.S. Appl. No. 10/007,367, filed Oct. 22, 2001, entitled "Merie Plasma Reactor With Overhead RF Electrode Tuned to the Plasma With Arcing Suppression", by Daniel Hoffman, et al.

PLASMA REACTOR OVERHEAD SOURCE POWER ELECTRODE WITH LOW ARCING TENDENCY, CYLINDRICAL GAS OUTLETS AND SHAPED SURFACE

CROSS-REFERENCE TO RELATED APPLICATIONS

This application is a continuation-in-part of U.S. patent application Ser. No. 10/754,280, filed Jan. 8, 2004 entitled PLASMA REACTOR WITH OVERHEAD RF SOURCE POWER ELECTRODE WITH LOW LOSS, LOW ARCING TENDENCY AND LOW CONTAMINATION by Daniel J. Hoffman et al., which is a continuation-in-part of U.S. patent application Ser. No. 10/028,922, filed Dec. 19, 2001, now U.S. Pat. No. 7,030,335 entitled PLASMA REACTOR WITH OVERHEAD RF ELECTRODE TUNED TO THE PLASMA by Daniel Hoffman et al., which is a continuation-in-part of U.S. patent application Ser. No. 09/527,342, filed Mar. 17, 2000 entitled PLASMA REACTOR WITH OVERHEAD RF ELECTRODE TUNED TO THE PLASMA by Daniel Hoffman et al., now issued as U.S. Pat. No. 6,528,751, and all of which are assigned to the present assignee.

BACKGROUND ART

An overhead gas showerhead with many small gas inlet orifices can cause plasma arcing when used as an electrode to capacitively couple plasma source power. Plasma tends to enter into many of the gas outlet orifices of the electrode and arc inside each orifice. The arcing can melt or sputter metal atoms from the electrode, creating contamination in the plasma and thereby causing the plasma process (e.g., a plasma-enhance reactive ion etch process carried out on a semiconductor workpiece) to fail. Moreover, such arcing damages the electrode by widening different orifices, thereby distorting gas flow distribution at the electrode surface. Finally, if the electrode is metal and is covered with a semiconductor protective layer, such arcing further damages the electrode or generates contamination by attacking the bonding adhesive placed between the semiconductive protective layer and the metallic electrode. A very narrow gas outlet orifice diameter was employed in order to prevent migration of plasma into the gas outlet orifices, but this actually worsened the arcing problem. This was because the greater pressure occasioned by the narrowing of the orifices promoted arcing. Moreover, such narrow orifices were difficult to clean, so that residue from the plasma (e.g., polymers) accumulated within the gas outlet orifices.

Our efforts to avoid arcing in an overhead VHF source power electrode/gas showerhead led to the concept of configuring the gas outlet orifices in the overhead electrode as narrow annuli, which is disclosed in the parent application referenced above. The gas pressure was dropped well above the gas outlet orifices by extremely narrow internal pressure-dropping orifices extending in a radial direction. The arcuate or circumferential length (in the plane of the electrode) of each annular gas outlet orifice enhanced the gas flow conductance within the orifice, which minimized the gas pressure within the high electric field existing at the surface of the electrode. This feature reduced the tendency of gas in the orifices to arc. The narrow width of each annular orifice increased the rate at which the electric field dropped inside the orifice as a function of axial height, so as to confine the high electric fields near the bottom of the gas outlet orifices and away from the upper regions of the electrode where the narrow pressure-dropping orifices were located. This feature minimized the electric field near the upper region of the electrode where the gas pressure dropped from a very high to a very low pressure, thus avoiding coincidence of a high gas pressure and a high electric field in the same location, in order to better suppress arcing.

Such annular-shaped gas outlet orifices require complex machining to fabricate, and are not readily adapted to a curved topology. Therefore, such gas distribution electrodes are essentially confined to a flat shape to avoid excessive fabrication costs. This is particularly true in the case where a semiconductor protective layer covers the bottom surface of the electrode, requiring formation of mutually aligned annular gas outlet orifices in the metal electrode and the semiconductor protective layer.

We have found that in a reactor of the type disclosed in FIGS. 1–30, the plasma ion density distribution can be slightly center high, with low plasma density and low etch rate prevailing at the wafer periphery. In some cases, the plasma ion density at the wafer edge may be 55% or less than the plasma ion density at the wafer center. The etch rate is similarly depressed at the wafer edge relative to the wafer center. There is a need for an overhead gas distribution source power electrode capable of improving plasma uniformity while retaining the advantages described above of low arcing tendency. One way of correcting for a center-high plasma ion density distribution is to configure the electrode surface in an arcuate shape, such as a dome shape or a multi-radius dome shape. However, the complexity of the machining steps required to fabricate an electrode having a low tendency to arc (i.e., one with the annular shaped gas outlet orifices described above) cannot be realized in an arcuate shape, or at least not a shape having a significant curvature. For example, in an electrode that is on the order of 300 mm in diameter, it would not be cost-effective to provide a curvature having more than a few millimeters deviation from center to edge. Such a small curvature may be inadequate to correct or significantly improve a 55% deviation in plasma ion density non-uniformity. The problem is how to provide sufficient curvature in the electrode without increasing the tendency for arcing to occur within the gas outlet orifices.

SUMMARY OF THE INVENTION

An overhead gas distribution electrode forming at least a portion of the ceiling of a plasma reactor has a bottom surface facing a processing zone of the reactor. The electrode includes a gas supply manifold for receiving process gas at a supply pressure at a top portion of the electrode and plural pressure-dropping cylindrical orifices extending axially relative to the electrode from the gas supply manifold at one end of each the orifice. A radial gas distribution manifold within the electrode extends radially across the electrode. Plural axially extending high conductance gas flow passages couple the opposite ends of respective ones of the plural pressure-dropping orifices to the radial gas distribution manifold. Plural high conductance cylindrical gas outlet holes are formed in the plasma-facing bottom surface of the electrode and extend axially to the radial gas distribution manifold.

The bottom surface can be a planar surface or a non-planar surface which is either a curved surface or a stepped surface, and can be center-high. The non-planar bottom surface can have a center-to-edge height difference that is between about 20% and 100% of the diameter of the electrode.

A protective layer can cover the bottom surface, and can be formed of a process-compatible material, the gas outlet holes continuing through the protective layer. The protective layer can be a semiconductor-containing material such as silicon or silicon carbide, for example.

DETAILED DESCRIPTION OF THE INVENTION

Figure 1:
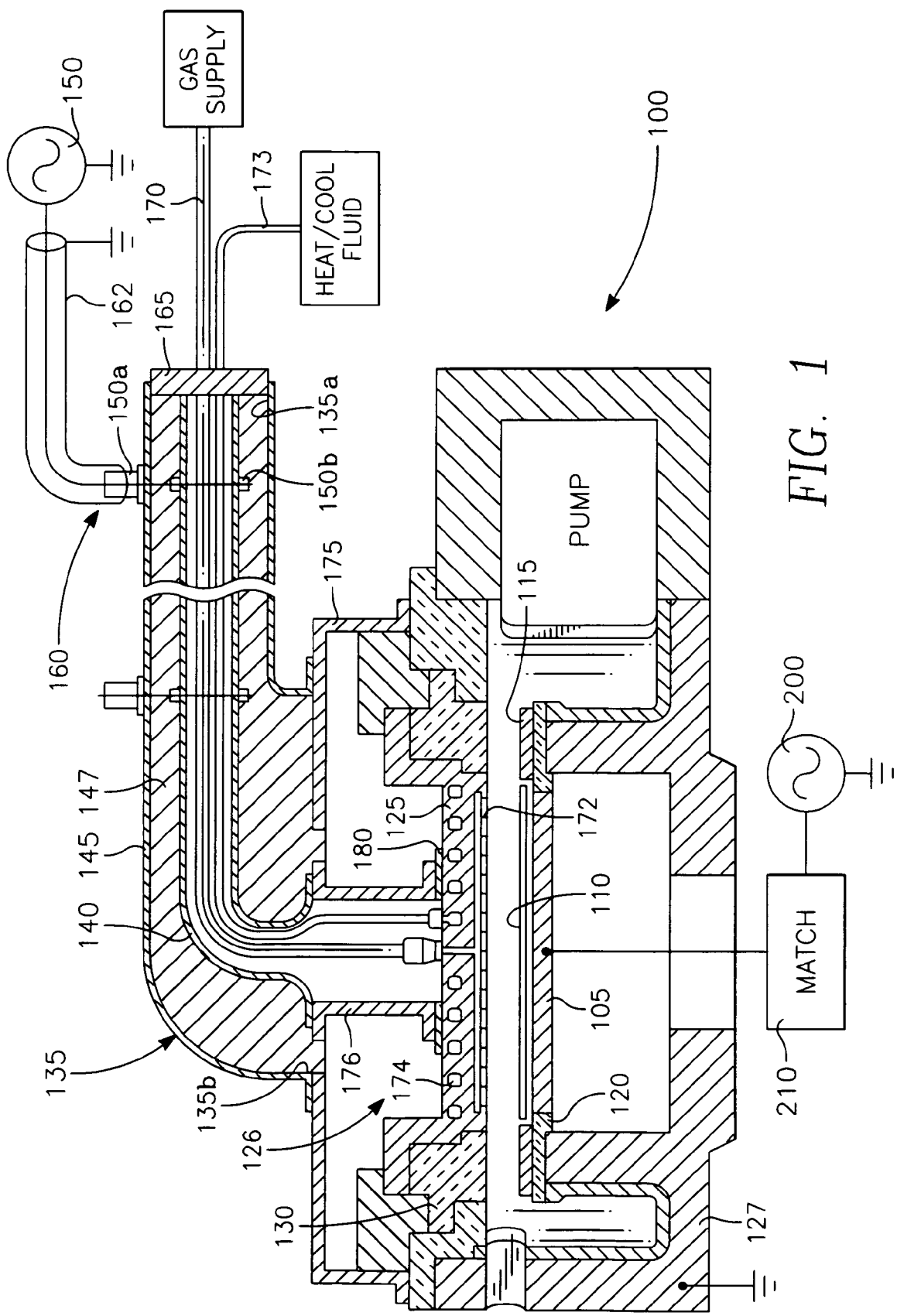
FIG. 1 is a cut-away cross-sectional side view of a plasma reactor.

Referring to FIG. 1, a plasma reactor includes a reactor chamber 100 with a wafer support 105 at the bottom of the chamber supporting a semiconductor wafer 110. A semiconductor ring 115 surrounds the wafer 110. The semiconductor ring 115 is supported on the grounded chamber body 127 by a dielectric (quartz) ring 120. In one embodiment, this is of a thickness of 10 mm and dielectric constant of 4. The chamber 100 is bounded at the top by a disc shaped overhead aluminum electrode supported at a predetermined gap length above the wafer 110 on grounded chamber body 127 by a dielectric (quartz) seal. The overhead electrode 125 also may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the 50 Ohm coaxial cable 162 or the 50 Ohm output of the RF power generator 150, as will be more fully described below. The chamber body is connected to the RF return (RF ground) of the RF generator 150. The RF path from the overhead electrode 125 to RF ground is affected by the capacitance of the semiconductor ring 115, the dielectric ring 120 and the dielectric seal 130. The wafer support 105, the wafer 110 and the semiconductor ring 115 provide the primary RF return path for RF power applied to the electrode 125.

The capacitance of the overhead electrode assembly 126, including the electrode 125, the dielectric ring 120 and dielectric seal 130 measured with respect to RF return or ground can be 180 pico farads. The electrode assembly capacitance is affected by the electrode area, the gap length (distance between wafer support and overhead electrode), and by factors affecting stray capacitances, especially the dielectric values of the seal 130 and of the dielectric ring 120, which in turn are affected by the dielectric constants and thicknesses of the materials employed. More generally, the capacitance of the electrode assembly (an unsigned number or scalar) is equal or nearly equal in magnitude to the negative capacitance of the plasma (a complex number) at a particular source power frequency, plasma density and operating pressure, as will be discussed below.

Many of the factors influencing the foregoing relationship are in great part predetermined due to the realities of the plasma process requirements needed to be performed by the reactor, the size of the wafer, and the requirement that the processing be carried out uniformly over the wafer. Thus, the plasma capacitance is a function of the plasma density and the source power frequency, while the electrode capacitance is a function of the wafer support-to-electrode gap (height), electrode diameter, and dielectric values of the insulators of the assembly. Plasma density, operating pressure, gap, and electrode diameter must satisfy the requirements of the plasma process to be performed by the reactor. In particular, the ion density must be within a certain range. For example, silicon and dielectric plasma etch processes generally require the plasma ion density to be within the range of $10^9$ B $10^{12}$ ions/cc. The wafer electrode gap provides an optimum plasma ion distribution uniformity for 8 inch wafers, for example, if the gap is about 1.25 to about 2.0 inches. For 300 mm diameter wafers, an optimum gap size is about 1.25 inches. The electrode diameter can be at least as great as, if not greater than the diameter of the wafer. Operating pressures similarly have practical ranges for typical etch and other plasma processes.

But it has been found that other factors remain which can be selected to achieve the above relationship, particularly choice of source frequency and choice of capacitances for the overhead electrode assembly 126. Within the foregoing dimensional constraints imposed on the electrode and the constraints (e.g., density range) imposed on the plasma, the electrode capacitance can be matched to the magnitude of the negative capacitance of the plasma if the source power frequency is selected to be a VHF frequency, and if the dielectric values of the insulator components of electrode assembly 126 are selected properly. Such selection can achieve a match or near match between source power frequency and plasma-electrode resonance frequency.

Accordingly in one aspect, for an 8-inch wafer the overhead electrode diameter is approximately 11 inches, the gap is about 2 inches, the plasma density and operating pressure is typical for etch processes as above-stated, the dielectric material for the seal 130 has a dielectric constant of 9 and a thickness of the order of 1 inch, the ring 115 has an inner diameter of slightly in excess of 10 inches and an outer diameter of about 13 inches, the ring 120 has a dielectric constant of 4 and a thickness of the order of 10 mm, the VHF source power frequency is 210 MHz (although other VHF frequencies could be equally effective), and the source power frequency, the plasma electrode resonance frequency and the stub resonance frequency are all matched or nearly matched. For 300 mm diameter wafers, an optimum source power frequency is 162 MHz, with the plasma electrode resonance frequency and the stub resonance frequency being matched or slightly offset from 162 MHz.

More particularly, these three frequencies can be slightly offset from one another, with the source power frequency being 162 MHz (optimized for 300 mm wafers), the electrode-plasma resonant frequency being slightly below 162 MHz, and the stub frequency being slightly above 162 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

The coaxial stub 135 is a specially configured design which further contributes to the overall system stability, its wide process window capabilities, as well as many other valuable advantages. It includes an inner cylindrical conductor 140 and an outer concentric cylindrical conductor 145. An insulator 147 (denoted by cross-hatching in FIG. 1) having, for example, a relative dielectric constant of 1 fills the space between the inner and outer conductors 140, 145. The inner and outer conductors 140, 145 are formed of nickel-coated aluminum. The outer conductor 145 can have a diameter of about 4 inches and the inner conductor 140 can have a diameter of about 1.5 inches. The stub characteristic impedance is determined by the radii of the inner and outer conductors 140, 145 and the dielectric constant of the insulator 147. The stub 135 of one embodiment has a characteristic impedance of 30 Ohms (where the VHF source power frequency is 162 MHz for a 300 mm wafer diameter). More generally, the stub characteristic impedance exceeds the source power output impedance by about 20%–40% and by about 30%. The stub 135 has an axial length corresponding to a quarter wavelength slightly above 162 MHz (e.g., near 170 MHz) in order to have a slightly offset from (above) the VHF source power frequency of 162 MHz.

A tap 160 is provided at a particular point along the axial length of the stub 135 for applying RF power from the RF generator 150 to the stub 135, as will be discussed below. The RF power terminal 150b and the RF return terminal 150a of the generator 150 are connected at the tap 160 on the stub 135 to the inner and outer coaxial stub conductors 140, 145, respectively. These connections are made via a generator-to-stub coaxial cable 162 having a characteristic impedance that matches the output impedance of the generator 150 (typically, 50 Ohms) in the well-known manner. A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 can provide a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 while the metallic coolant line 173 feeds coolant passages or jackets 174 within the overhead electrode 125.

An active and resonant impedance transformation is thereby provided by this specially configured stub match between the RF generator 150, and the overhead electrode assembly 126 and processing plasma load, minimizing reflected power and providing a very wide impedance match space accommodating wide changes in load impedance. Consequently, wide process windows and process flexibility is provided, along with previously unobtainable efficiency in use of power, all while minimizing or avoiding the need for typical impedance match apparatus. As noted above, the stub resonance frequency is also offset from ideal match to further enhance overall system Q, system stability and process windows and multi-process capability.

Matching the Electrode-Plasma Resonance Frequency and the VHF Source Power Frequency:

As outlined above, a principal feature is to configure the overhead electrode assembly 126 for resonance with the plasma at the electrode-plasma resonant frequency and for the matching (or the near match of) the source power frequency and the electrode-plasma frequency. The electrode assembly 126 has a predominantly capacitive reactance while the plasma reactance is a complex function of frequency, plasma density and other parameters. (As will be described below in greater detail, a plasma is analyzed in terms of a reactance which is a complex function involving imaginary terms and generally corresponds to a negative capacitance.) The electrode-plasma resonant frequency is determined by the reactances of the electrode assembly 126 and of the plasma (in analogy with the resonant frequency of a capacitor/inductor resonant circuit being determined by the reactances of the capacitor and the inductor). Thus the electrode-plasma resonant frequency may not necessarily be the source power frequency, depending as it does upon the plasma density. The problem, therefore, is to find a source power frequency at which the plasma reactance is such that the electrode-plasma resonant frequency is equal or nearly equal to the source power frequency, given the constraints of practical confinement to a particular range of plasma density and electrode dimensions. The problem is even more difficult, because the plasma density (which affects the plasma reactance) and the electrode dimensions (which affect electrode capacitance) must meet certain process constraints. Specifically, for dielectric and metal plasma etch processes, the plasma density should be within the range of $10^9$–$10^{12}$ ions/cc, which is a constraint on the plasma reactance. Moreover, a more uniform plasma ion density distribution for processing 300 mm diameter wafers for example, is realized by a wafer-to-electrode gap or height of about 1.25 inches and an electrode diameter on the order of the wafer diameter, or greater, which is a constraint on the electrode capacitance. On the other hand, a different gap length may be used for processing an even larger wafer.

Accordingly in one feature of the embodiment, by matching (or nearly matching) the electrode capacitance to the magnitude of the negative capacitance of the plasma, the electrode-plasma resonant frequency and the source power frequency are at least nearly matched. For the general metal and dielectric etch process conditions enumerated above (i.e., plasma density between $10^9$–$10^{12}$ ions/cc, a 2-inch gap and an electrode diameter on the order of roughly 11 inches), the match is possible if the source power frequency is a VHF frequency. Other conditions (e.g., different wafer diameters, different plasma densities, etc.) may dictate a different frequency range to realize such a match in carrying out this feature of the reactor. As will be detailed below, under favored plasma processing conditions for processing 8-inch wafers in several principal applications including dielectric and metal plasma etching and chemical vapor deposition, the plasma capacitance in one typical working example having plasma densities as set forth above was between −50 and B400 pico farads. In a working embodiment employing a source power frequency of 210 MHz, the capacitance of the overhead electrode assembly 126 was matched to the magnitude of this negative plasma capacitance by using an electrode diameter of 11 inches, a gap length (electrode to pedestal spacing) of approximately 2 inches, choosing a dielectric material for seal 130 having a dielectric constant of 9, and a thickness of the order of one inch, and a dielectric material for the ring 120 having a dielectric constant of 4 and thickness of the order of 10 mm. For 300 mm wafers, the source power frequency may be about 162 MHz.

The combination of electrode assembly 126 and the plasma resonates at an electrode-plasma resonant frequency that at least nearly matches the source power frequency applied to the electrode 125, assuming a matching of their capacitances as just described. We have discovered that for favored etch plasma processing recipes, environments and plasmas, this electrode-plasma resonant frequency and the source power frequency can be matched or nearly matched at VHF frequencies; and that it is highly advantageous that such a frequency match or near-match be implemented. In the foregoing embodiment, the electrode-plasma resonance frequency corresponding to the foregoing values of plasma negative capacitance can be slightly below 162 MHz. The source power frequency is 162 MHz, a near-match in which the source power frequency is offset slightly above the electrode-plasma resonance frequency in order to realize other advantages to be discussed below. If the source power frequency is 210 MHz, then the plasma resonance frequency may be 200 MHz and the stub resonance frequency may be 220 MHz.

The plasma capacitance is a function of among other things, plasma electron density. This is related to plasma ion density, which needs, in order to provide good plasma processing conditions, to be kept in a range generally $10^9$ to $10^{12}$ ions/cc. This density, together with the source power frequency and other parameters, determines the plasma negative capacitance, the selection of which is therefore constrained by the need to optimize plasma processing conditions, as will be further detailed below. But the overhead electrode assembly capacitance is affected by many physical factors, e.g. gap length (spacing between electrode 125 and the wafer); the area of electrode 125; the choice of dielectric constant of the dielectric seal 130 between electrode 125 and grounded chamber body 127; the choice of dielectric constant for the dielectric ring 120 between semiconductor ring 115 and the chamber body; and the thickness of the dielectric structures of seal 130 and ring 120 and the thickness and dielectric constant of the ring 180. This permits some adjustment of the electrode assembly capacitance through choices made among these and other physical factors affecting the overhead electrode capacitance. We have found that the range of this adjustment is sufficient to achieve the necessary degree of matching of the overhead electrode assembly capacitance to the magnitude of the negative plasma capacitance. In particular, the dielectric materials and dimensions for the seal 130 and ring 120 are chosen to provide the desired dielectric constants and resulting dielectric values. Matching the electrode capacitance and the plasma capacitance can then be achieved despite the fact that some of the same physical factors influencing electrode capacitance, particularly gap length, will be dictated or limited by the following practicalities: the need to handle larger diameter wafers; to do so with good uniformity of distribution of plasma ion density over the full diameter of the wafer; and to have good control of ion density vs ion energy.

Accordingly, for plasma ion density ranges as set forth above favorable to plasma etch processes, and for chamber dimensions suitable for processing 8 inch wafers, a capacitance for the electrode assembly 126 was achieved which matched the plasma capacitance of −50 to B400 pico farads by using an electrode diameter of 11 inches, a gap length of approximately 2 inches, and a material for the seal 130 having a dielectric constant of 9, and a material for the ring 120 having a dielectric constant of 4.

Given the foregoing range for the plasma capacitance and the matching overhead electrode capacitance, the electrode-plasma resonance frequency was approximately 200 MHz for a source power frequency of 210 MHz. The foregoing values can be adjusted to optimize performance for 300 mm wafers using a source power frequency of 162 MHz.

A great advantage of choosing the capacitance of the electrode assembly 126 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. The entire processing system is rendered less sensitive to variations in operating conditions, e.g., shifts in plasma impedance, and therefore more reliable along with a greater range of process applicability. As will be discussed later in the specification, this advantage is further enhanced by the small offset between the electrode-plasma resonant frequency and the source power frequency.

Why the Plasma Has a Negative Capacitance:

The capacitance of the plasma is governed by the electrical permittivity of the plasma, $\epsilon$, which is a complex number and is a function of the electrical permittivity of free space $\epsilon_0$, the plasma electron frequency $T_{pe}$, the source power frequency T and the electron-neutral collision frequency $0_{en}$ in accordance with the following equation:

$$\epsilon = \epsilon_0 [1 - T_{pe}^2/(T(T+i0_{en}))] \text{ where } i=(-1)^{1/2}.$$

(The plasma electron frequency $T_{pe}$ is a simple function of the plasma electron density and is defined in well-known publications on plasma processing.)

In one working example, the neutral species was Argon, the plasma electron frequency was slightly below about 162 MHz, the RF source power frequency was about 162 MHz with chamber pressure in the range of 5 mT to 1000 mT with sufficient RF power applied so that the plasma density was between $10^9$ and $10^{12}$ $cc^{-1}$. Under these conditions, which are typical of those favorable to plasma etch processes, the plasma generally has a negative capacitance because its effective electrical permittivity defined by the foregoing equation is negative. Under these conditions, the plasma had a negative capacitance of −50 to B400 pico farads. Then as we have seen above in more general terms, the plasma capacitance, as a function of plasma electron density (as well as source power frequency and electron-neutral collision frequency) tends to be generally limited by favored plasma process realities for key applications such as dielectric etch, metal etch and CVD, to certain desired ranges, and to have a negative value at VHF source power frequencies. By exploiting these characteristics of the plasma, the electrode capacitance matching and frequency-matching features of the reactor achieve a process window capability and flexibility and stability of operation not previously possible.

Impedance Transformation Provided by the Stub 135:

The stub 135 provides an impedance transformation between the 50 Ohm output impedance of the RF generator 150 and the load impedance presented by the combination of the electrode assembly 126 and the plasma within the chamber. For such an impedance match, there must be little or no reflection of RF power at the generator-stub connection and at the stub-electrode connection (at least no reflection exceeding the VSWR limits of the RF generator 150). How this is accomplished will now be described.

At the desired VHF frequency of the generator 150 and at a plasma density and chamber pressure favorable for plasma etch processes (i.e., $10^9$ B $10^{12}$ ions/cm$^3$ and 5 mT B 1000 mT, respectively), the impedance of the plasma itself is about (0.3+(i)7)Ohm, where 0.3 is the real part of the plasma impedance, $i=(-1)^{1/2}$, and 7 is the imaginary part of the plasma impedance. The load impedance presented by the electrode-plasma combination is a function of this plasma impedance and of the capacitance of the electrode assembly 126. As described above, the capacitance of the electrode assembly 126 is selected to achieve a resonance between the electrode assembly 126 and the plasma with an electrode-plasma resonant frequency at or slightly less than about 162 MHz for 300 mm wafers. Reflections of RF power at the stub-electrode interface are minimized or avoided because the resonant frequency of the stub 135 is set to be at or near the electrode-plasma resonant frequency so that the two at least nearly resonate together.

At the same time, reflections of RF power at the generator-stub interface are minimized or avoided because the location of the tap 160 along the axial length of the stub 135 is such that, at the tap 160, the ratio of the standing wave voltage to the standing wave current in the stub 135 is near the output impedance of the generator 150 or characteristic impedance of the cable 162 (both being about 50 Ohms). How the tap 160 is located to achieve this will now be discussed.

Axial Location of the Stub Tap 160:

The axial length of the coaxial stub 135 can be a multiple of a quarter wavelength of a "stub" frequency (e.g., slightly above 162 MHz) which, as stated above, is near the electrode-plasma resonant frequency. In one embodiment, this multiple is two, so that the coaxial stub length is about a half wavelength of the "stub" frequency.

Figure 2A:
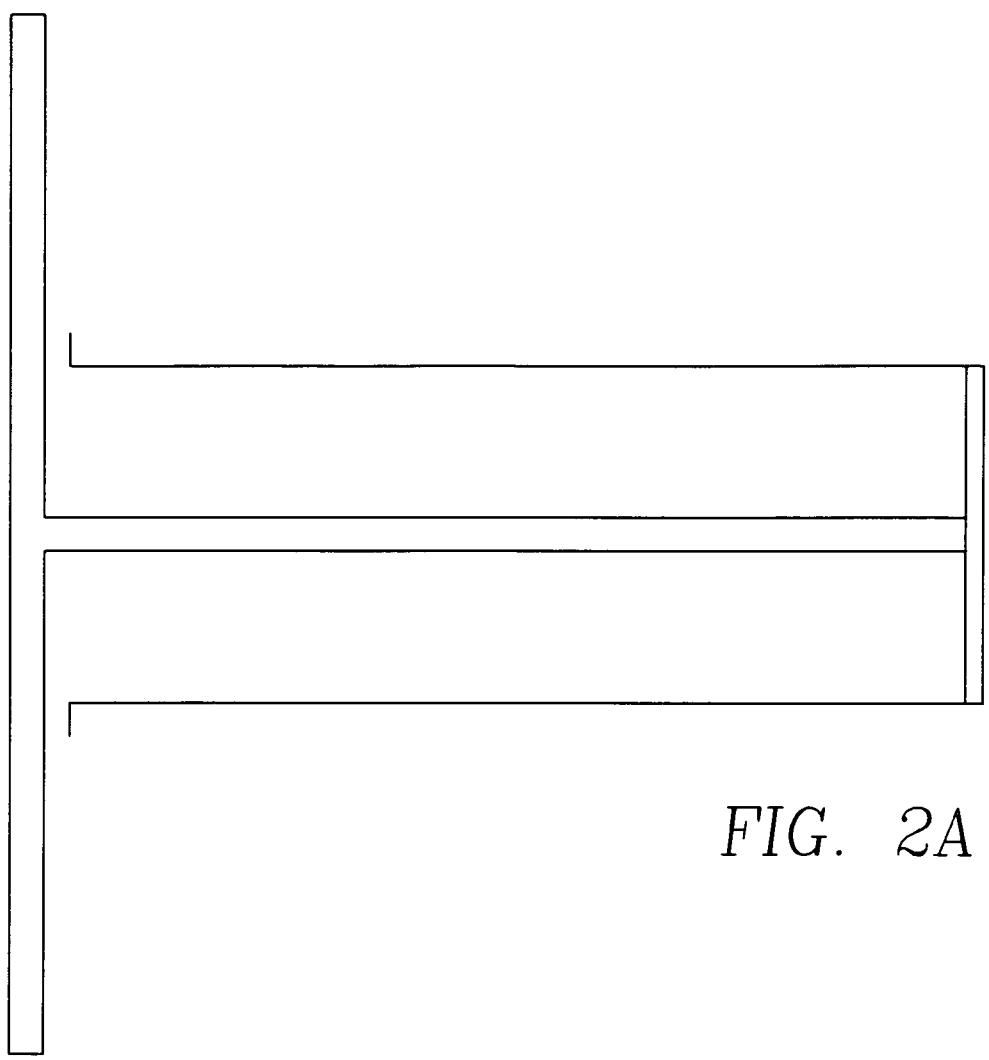
FIGS. 2A and 2B are diagrams illustrating, respectively, the coaxial stub of FIG. 1 and the voltage and current standing wave amplitudes as a function of position along the coaxial stub.
Figure 2B:
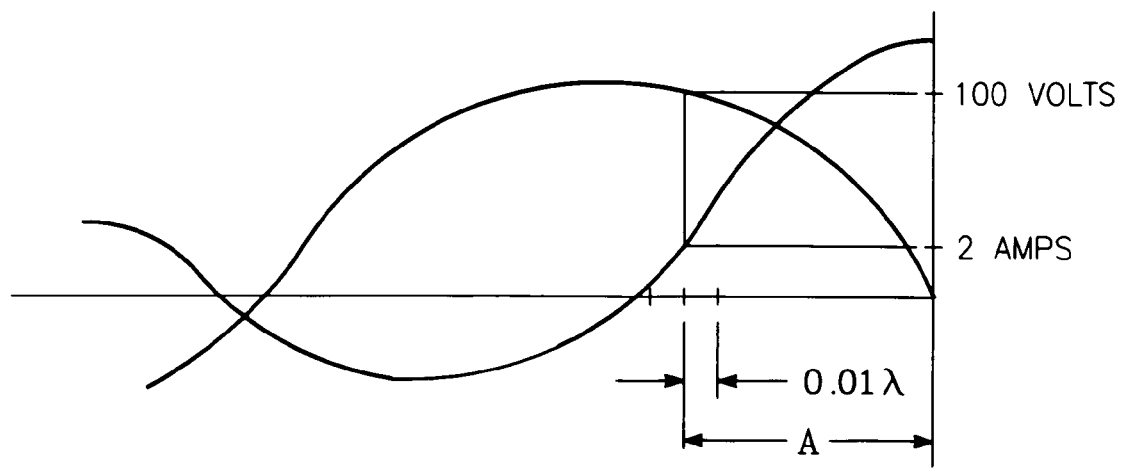

The tap 160 is at a particular axial location along the length of the stub 135. At this location, the ratio between the amplitudes of the standing wave voltage and the standing wave current of an RF signal at the output frequency of the generator 150 corresponds to an input impedance matching the output impedance of the RF generator 150 (e.g., 50 Ohms). This is illustrated in FIGS. 2A and 2B, in which the voltage and current standing waves in the stub 135 have a null and a peak, respectively, at the shorted outer stub end 135a. A desired location for the tap 160 is at a distance A inwardly from the shorted end, where the ratio of the standing wave voltage and current corresponds to 50 Ohms. This location is readily found by the skilled worker by empirically determining where the standing wave ratio is 50 Ohms. The distance or location A of the tap 160 that provides a match to the RF generator output impedance (50

Ohms) is a function of the characteristic impedance of the stub 135, as will be described later in this specification. When the tap 160 is located precisely at the distance A, the impedance match space accommodates a 9:1 change in the real part of the load impedance, if the RF generator is of the typical kind that can maintain constant delivered power over a 3:1 voltage standing wave ratio (VSWR).

The impedance match space can be greatly expanded to accommodate a nearly 60:1 change in the real part of the load impedance. This dramatic result is achieved by slightly shifting the tap 160 from the precise 50 Ohm point at location A toward the shorted external end 135*a* of the coaxial stub 135. This shift can be, for example, 5% of a wavelength (i.e., about 7.5 inch at 162 MHz for 30 Ohm characteristic impedance). It is our discovery that at this slightly shifted tap location, the RF current contribution at the tap 160 subtracts or adds to the current in the stub, which ever becomes appropriate, to compensate for fluctuations in the plasma load impedance, as will be described below with reference to FIGS. 3 and 4. This compensation is sufficient to increase the match space from one that accommodates a 9:1 swing in the real part of the load impedance to a 60:1 swing.

It is felt that this behavior is due to a tendency of the phase of the standing wave current in the stub 135 to become more sensitive to an impedance mismatch with the electrode-plasma load impedance, as the tap point is moved away from the location at A. As described above, the electrode assembly 126 is matched to the negative capacitance of the plasma under nominal operating conditions. This capacitance is B50 to B400 pico farads at the VHF source power frequency. At this capacitance the plasma exhibits a plasma impedance of (0.3+i7)Ohm. Thus, 0.3 Ohm is the real part of the plasma impedance for which the system is tuned. As plasma conditions fluctuate, the plasma capacitance and impedance fluctuate away from their nominal values. As the plasma capacitance fluctuates from that to which the electrode 125 was matched, the phase of the electrode-plasma resonance changes, which affects the phase of the current in the stub 135. As the phase of the stub's standing wave current thus shifts, the RF generator current supplied to the tap 160 will either add to or subtract from the stub standing wave current, depending upon the direction of the phase shift. The displacement of the tap 160 from the 50 Ohm location at A is limited to a small fraction of the wavelength (e.g., 5%).

Figure 3:
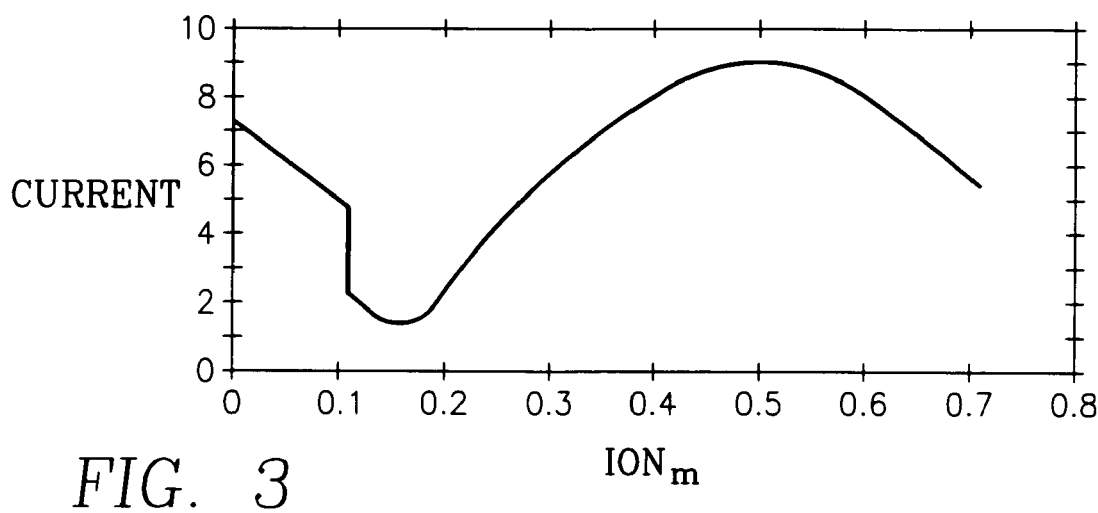
FIG. 3 illustrates the subtraction of current at the input power tap point on the coaxial stub that occurs in response to high plasma load impedance to maintain a more constant delivered VHF power level in a larger match space.

FIG. 3 illustrates the standing wave current in the stub 135 when the real part of the plasma impedance has increased due to plasma fluctuations. In FIG. 3, the current standing wave amplitude is plotted as a function of axial location along the stub 135. A discontinuity in the standing wave current amplitude at the location 0.1 on the horizontal axis corresponds to the position of the tap 160. In the graph of FIG. 3, an impedance mismatch occurs because the real part of the plasma impedance is high, above the nominal plasma impedance for which the system is tuned (i.e., at which the electrode capacitance matches the negative plasma capacitance). In this case, the current at the tap 160 subtracts from the standing wave current in the stub 135. This subtraction causes the discontinuity or null in the graph of FIG. 3, and reduces the delivered power to offset the increased load. This avoids a corresponding increase in delivered power ($I^2R$), due to the higher load (R).

Figure 4:
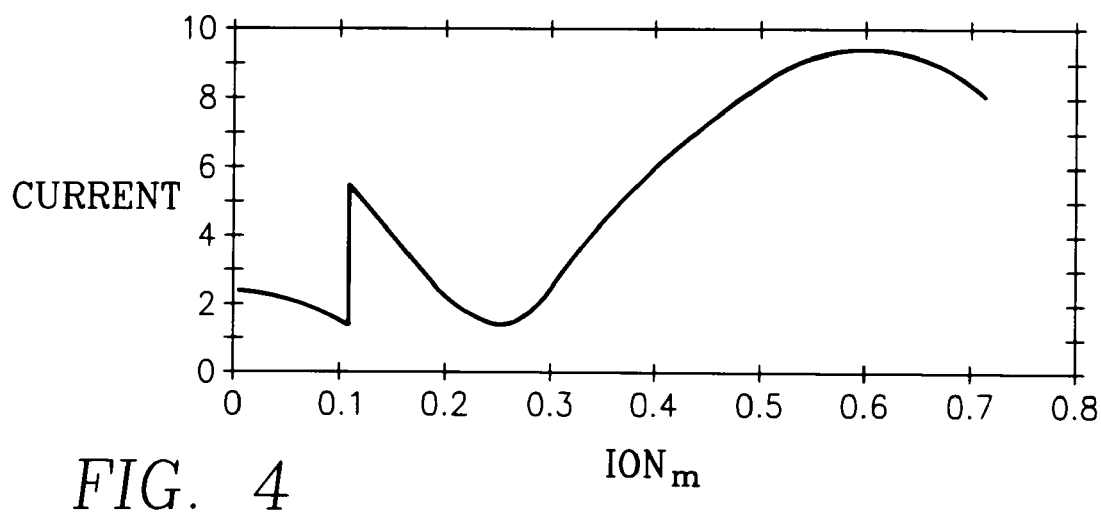
FIG. 4 illustrates the addition of current at the input power tap point on the coaxial stub that occurs in response to low plasma load impedance to maintain a more constant delivered VHF power level in a larger match space.

FIG. 4 illustrates the standing wave current in the stub 135 when the real part of the plasma impedance decreases. In FIG. 4, the current standing wave amplitude is plotted as a function of axial location along the stub 135. A discontinuity in the standing wave current amplitude at the location 0.1 marks the position of the tap 160. In the graph of FIG. 4, the real part of the plasma impedance is low, below the nominal plasma impedance for which the system is tuned. In this case, the current at the tap 160 adds to the standing wave current in the stub 135. This addition increases the delivered power to offset the decreased load, to avoid a concomitant decrease in delivered power, $I^2R$, due to the decreased load, R. With such compensation, much greater changes in load impedance can be accommodated so that the match space in increased significantly.

This expansion of the match space to accommodate a 60:1 swing in the real part of the load impedance enhances process window and reliability of the reactor. This is because as operating conditions shift during a particular process or application, or as the reactor is operated with different operating recipes for different applications, the plasma impedance will change, particularly the real part of the impedance. In the prior art, such a change could readily exceed the range of the conventional match circuit employed in the system, so that the delivered power could no longer be controlled sufficiently to support a viable process, and the process could fail. In the present reactor, the range of the real part of the load impedance over which delivered power can be maintained at a desired level has been increased so much that changes in plasma impedance, which formerly would have led to a process failure, have little or no effect on a reactor embodying this aspect of the reactor. Thus, the reactor can withstand far greater changes in operating conditions during a particular process or application. Alternatively, it enables the reactor to be used in many different applications involving a wider range of process conditions, a significant advantage.

As a further advantage, the coaxial stub 135 that provides this broadened impedance match is a simple passive device with no "moving parts" such as a variable capacitor/servo or a variable frequency/servo typical of conventional impedance match apparatus. It is thus inexpensive and far more reliable than the impedance match apparatus that it replaces.

De-Tuning the Operating and Resonant Frequencies to Broaden the Process Window:

In accordance with a further aspect, the system Q is reduced to broaden the process window by slightly offsetting the stub resonant frequency, the electrode plasma resonant frequency and the plasma source power frequency from one another. As described above, the stub resonant frequency is that frequency at which the axial length of the stub 135 is a half wavelength, and the electrode-plasma resonant frequency is the frequency at which the electrode assembly 126 and the plasma resonate together. In one embodiment, the stub 135 was cut to a length at which its resonant frequency was slight above 162 MHz, the RF source power generator 150 was selected to operate at 162 MHz and the resulting electrode-plasma resonant frequency was slight less than about 162 MHz, for 300 mm wafers.

By choosing three such differing frequencies for plasma resonance, stub resonance and source power frequency, rather than the same frequency for all three, the system has been somewhat "de-tuned". It therefore has a lower "Q". The use of the higher VHF source power frequency proportionately decreases the Q as well (in addition to facilitating the match of the electrode and plasma capacitances under etch-favorable operating conditions).

Decreasing system Q broadens the impedance match space of the system, so that its performance is not as susceptible to changes in plasma conditions or deviations from manufacturing tolerances. For example, the electrode-plasma resonance may fluctuate due to fluctuations in plasma conditions. With a smaller Q, the resonance between the stub 135 and the electrode-plasma combination that is necessary for an impedance match (as described previously in this specification) changes less for a given change in the plasma-electrode resonance. As a result, fluctuations in plasma conditions have less effect on the impedance match. Specifically, a given deviation in plasma operating conditions produces a smaller increase in VSWR at the output of RF generator 150. Thus, the reactor may be operated in a wider window of plasma process conditions (pressure, source power level, source power frequency, plasma density, etc). Moreover, manufacturing tolerances may be relaxed to save cost and a more uniform performance among reactors of the same model design is achieved, a significant advantage. A related advantage is that the same reactor may have a sufficiently wide process window to be useful for operating different process recipes and different applications, such as metal etch, dielectric etch and/or chemical vapor deposition.

Minimizing the Stub Characteristic Impedance to Broaden the Process Window:

Another choice that broadens the tuning space or decreases the system Q is to decrease the characteristic impedance of the stub 135. However, the stub characteristic impedance can exceed the generator output impedance, to preserve adequate match space. Therefore, the system Q can be reduced, to the extent of reducing the amount by which the characteristic impedance of the stub 135 exceeds the output impedance of the signal generator 150.

The characteristic impedance of the coaxial stub 135 is a function of the radii of the inner and outer conductors 140, 145 and of the dielectric constant of the insulator 147 therebetween. The stub characteristic impedance is chosen to provide the requisite impedance transformation between the output impedance of the plasma power source 150 and the input impedance at the electrode 135. This characteristic impedance lies between a minimum characteristic impedance and a maximum characteristic impedance. Changing the characteristic impedance of the stub 135 changes the waveforms of FIG. 2 and therefore changes the desired location of the tap 160 (i.e., its displacement, A, from the far end of the stub 135). The allowable minimum characteristic impedance of the stub 135 is the one at which the distance A of FIG. 2 is zero so that tap 160 would have to be located on the far end 135a of the coaxial stub 135 opposite the electrode 125 in order to see a 50 Ohm ratio between the standing wave current and voltage. The allowable maximum characteristic impedance of the stub 135 is the one at which the distance A of FIG. 2 is equal to the length of the stub 135 so that the tap 160 would have to be close to the near end 135b of the coaxial stub 135 adjacent the electrode 125 in order to see a 50 Ohm ratio between the standing wave current and voltage.

In an initial embodiment, the coaxial stub characteristic impedance was chosen to be greater (by about 30%) than the output impedance of the RF generator 150, in order to provide an adequate match space. The stub impedance must exceed the RF generator output impedance because the impedance match condition is achieved by selecting the location of the tap point 160 to satisfy $$Z_{gen} = a^2 [Z_{stub}^2 / r_{plasma}]$$

where a is determined by the location of the tap point and varies between zero and one. (The quantity a corresponds to the ratio of the inductance of the small portion of the stub 135 between the far end 135b and the tap 160 to the inductance of the entire stub 135.) Since a cannot exceed one, the stub characteristic impedance must exceed the generator output impedance in order to find a solution to the foregoing equation. However, since the Q of the system is directly proportional to the stub characteristic impedance, the amount by which the stub characteristic impedance exceeds the generator output impedance can be somewhat minimized to keep the Q as low as practical. In the exemplary embodiment, the stub characteristic impedance exceeds the generator output impedance by only about 15 Ohms.

However, in other embodiments, the coaxial stub characteristic impedance may be chosen to be less than the plasma power source (generator) output impedance to achieve greater power efficiency with some reduction in impedance match.

Increased Power Efficiency Provided by the Impedance Transformation of the Stub:

As discussed earlier in this specification, plasma operating conditions (e.g., plasma density) that favor plasma etch processes result in a plasma impedance that has a very small real (resistive) part (e.g., less 0.3 Ohm) and a small imaginary (reactive) part (e.g., 7 Ohms). Capacitive losses predominate in the combination electrode-plasma area of the system, because the electrode capacitance is the predominant impedance to power flow in that part of the reactor. Therefore, power loss in the electrode-plasma combination is proportional to the voltage on the electrode-plasma combination. In contrast, inductive and resistive losses predominate in the stub 135, because the inductance and resistance of the stub 135 are the predominant elements of impedance to power flow in the stub 135. Therefore, power loss in the stub 135 is proportional to current in the stub. The stub characteristic impedance is much greater than the real part of the impedance presented by the electrode-plasma combination. Therefore, in the higher impedance stub 135 the voltage will be higher and the current lower than in the lower impedance plasma in which the current will be higher and the voltage lower. Thus, the impedance transformation between the stub 135 and the plasma-electrode combination produces a higher voltage and lower current in the stub 135 (where resistive and inductive losses dominate and where these are now minimized) and a correspondingly lower voltage and higher current at the plasma/electrode (where capacitive losses dominate and where these are now minimized). In this manner overall power loss in the system is minimized so that power efficiency is greatly improved, a significant advantage. In the foregoing embodiment, power efficiency is about 95% or greater.

Thus, the stub 135, configured as described above, serves not only to provide an impedance match or transformation between the generator and the electrode-plasma impedances across a very wide range or window of operating conditions, but in addition provides a significant improvement in power efficiency.

Cross-Grounding:

The ion energy at the wafer surface can be controlled independently of the plasma density/overhead electrode power. Such independent control of the ion energy is achieved by applying an HF frequency bias power source to the wafer. This frequency, (typically 13.56 MHz) is significantly lower than the VHF power applied to the overhead electrode that governs plasma density. Bias power is applied to the wafer by a bias power HF signal generator 200 coupled through a conventional impedance match circuit 210 to the wafer support 105. The power level of the bias generator 200 controls the ion energy near the wafer surface, and is generally a fraction of the power level of the plasma source power generator 150.

As referred to above, the coaxial stub 135 includes a shorting conductor 165 at the outer stub end providing a short circuit between the inner and outer coaxial stub conductors 140, 145. The shorting conductor 165 establishes the location of the VHF standing wave current peak and the VHF standing wave voltage null as in FIG. 2. However, the shorting conductor 165 does not short out the VHF applied power, because of the coupling of the stub resonance and the plasma/electrode resonance, both of which are at or near the VHF source power frequency. The conductor 165 does appear as a direct short to ground for other frequencies, however, such as the HF bias power source (from the HF bias generator 200) applied to the wafer. It also shorts out higher frequencies such as harmonics of the VHF source power frequency generated in the plasma sheath.

The combination of the wafer 110 and wafer support 105, the HF impedance match circuit 210 and the HF bias power source 200 connected thereto provides a very low impedance or near short to ground for the VHF power applied to the overhead electrode 125. As a result, the system is cross-grounded, the HF bias signal being returned to ground through the overhead electrode 125 and the shorted coaxial stub 135, and the VHF power signal on the overhead electrode 135 being returned to ground through a very low impedance path (for VHF) through the wafer, the HF bias impedance match 210 and the HF bias power generator 200.

The exposed portion of the chamber side wall between the plane of the wafer and the plane of the overhead electrode 125 plays little or no role as a direct return path for the VHF power applied to the overhead electrode 125 because of the large area of the electrode 125 and the relatively short electrode-to-wafer gap. In fact, the side wall of the chamber may be isolated from the plasma using magnetic isolation or a dielectric coating or an annular dielectric insert or removable liner.

In order to confine current flow of the VHF plasma source power emanating from the overhead electrode 125 within the vertical electrode-to-pedestal pathway and away from other parts of the chamber 100 such as the sidewall, the effective ground or return electrode area in the plane of the wafer 110 is enlarged beyond the physical area of the wafer or wafer support 105, so that it exceeds the area of the overhead electrode 125. This is achieved by the provision of the annular semiconductor ring 115 generally coplanar with and surrounding the wafer 110. The semiconductor ring 115 provides a stray capacitance to the grounded chamber body and thereby extends the effective radius of the "return" electrode in the plane of the wafer 110 for the VHF power signal from the overhead electrode. The semiconductor ring 115 is insulated from the grounded chamber body by the dielectric ring 120. The thickness and dielectric constant of the ring 120 is selected to achieve a desirable ratio of VHF ground currents through the wafer 110 and through the semiconductor ring 115. In a one embodiment, the dielectric ring 120 was quartz, having a dielectric constant of 4 and was of a thickness of 10 mm.

In order to confine current flow from the HF plasma bias power from the bias generator 200 within the vertical path between the surface of the wafer and the electrode 125 and avoid current flow to other parts of the chamber (e.g., the sidewall), the overhead electrode 135 provides an effective HF return electrode area significantly greater than the area of the wafer or wafer support 105. The semiconductor ring 115 in the plane of the wafer support 105 does not play a significant role in coupling the HF bias power into the chamber, so that the effective electrode area for coupling the HF bias power is essentially confined to the area of the wafer and wafer support 105.

Enhancement of Plasma Stability:

Plasma stability was enhanced by eliminating D.C. coupling of the plasma to the shorting conductor 165 connected across the inner and outer stub conductors 140, 145 at the back of the stub 135. This is accomplished by the provision of the thin capacitive ring 180 between the coaxial stub inner conductor 140 and the electrode 125. In the embodiment of FIG. 1, the ring 180 is sandwiched between the electrode 125 on the bottom and the conductive annular inner housing support 176. In the exemplary embodiments described herein, the capacitive ring 180 had a capacitance of about 180 picoFarads, depending on the frequency of the bias chosen, about 13 MHz. With such a value of capacitance, the capacitive ring 180 does not impede the cross-grounding feature described above. In the cross-grounding feature, the HF bias signal on the wafer pedestal is returned to the RF return terminal of the HF bias generator 150 via the stub 135 while the VHF source power signal from the electrode 125 is returned to the RF return terminal of the VHF source power generator 150 via the wafer pedestal.

Figure 5:
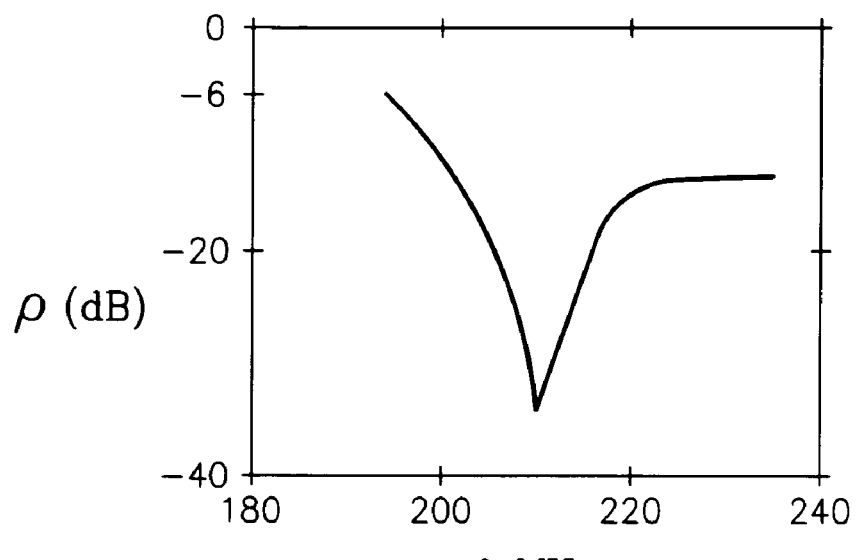
FIG. 5 is a graph illustrating the low-Q reflection coefficient as a function of frequency of the embodiment of FIG. 1.

FIG. 5 is a graph illustrating the reflection coefficient between the VHF power source and the overhead electrode 125 as a function of frequency. This graph illustrates the existence of a very broad band of frequencies over which the reflection coefficient is below 6 dB, which is indicative of the highly advantageous low system Q discussed above.

Figure 6:
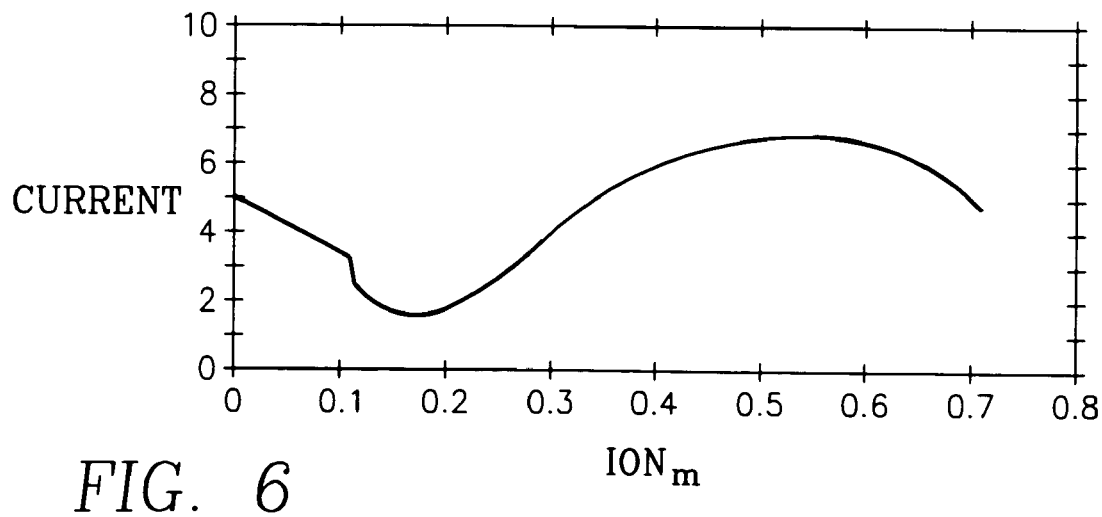
FIG. 6 is a graph illustrating the interaction of the current contribution at the input power tap point on the coaxial stub with the standing wave current and voltage along the stub length.

FIG. 6 illustrates the standing wave current (solid line) as a function of position along the coaxial stub 135 in the case in which the tap 160 is placed at the distance A of FIG. 2B from the shorted end of the stub.

Figure 7:
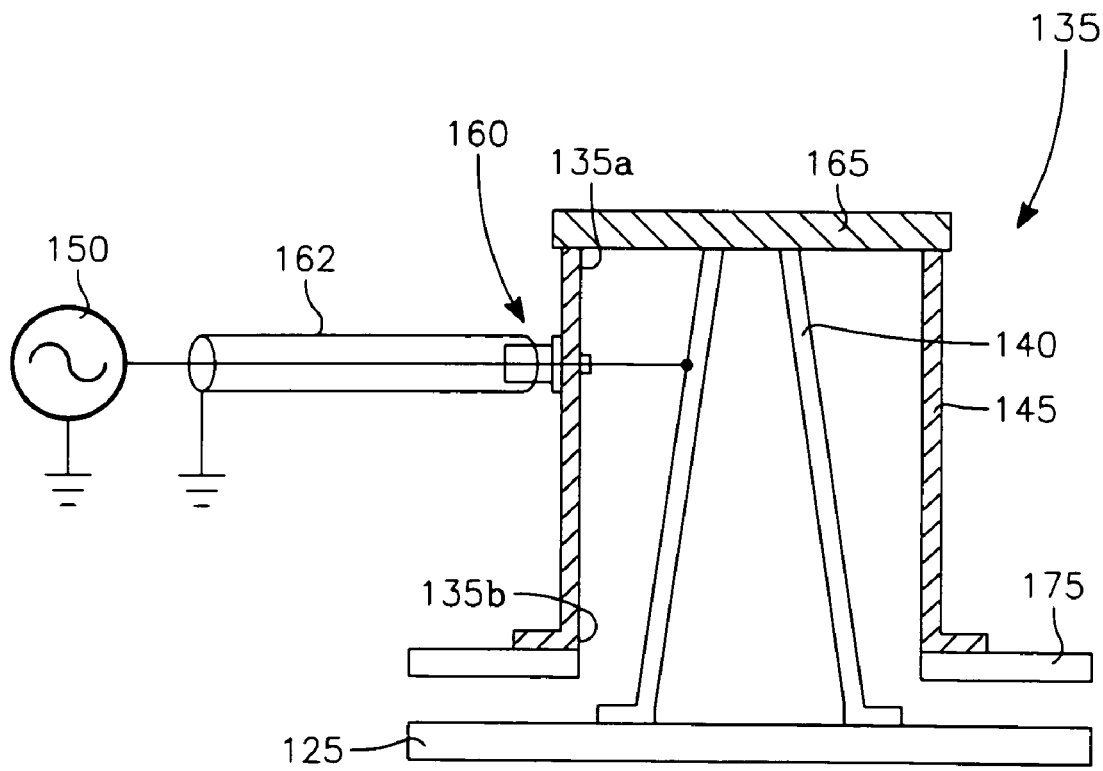
FIG. 7 illustrates an alternative embodiment of the coaxial stub of FIG. 1.

FIG. 7 illustrates an alternative embodiment of the reactor in which the inner conductor 140 of the coaxial stub 135 is tapered, having a larger radius at the near stub end 135b adjacent the overhead electrode 125 and a smaller radius at the far stub end 135a. This feature provides a transition between a low impedance (e.g., 50 Ohms) presented by the coaxial stub 135 at the tap 160 and a higher impedance (e.g., 64 Ohms) presented by the coaxial stub 135 at the overhead electrode 125. Also, as shown in FIG. 7, the stub 135 need not be curved, but can instead be straight.

The process gases are desirably introduced through the overhead VHF source power electrode. For this purpose, the overhead electrode is endowed with the function of a gas distribution showerhead, by providing an array of small gas injection nozzles or ports through the overhead electrode. The process gases are fed to these injection ports through the center conductor of the coaxial tuning stub. Since the center conductor is coupled to the overhead electrode, the process gas feeds are completely protected from the plasma and from electric fields.

Arcing and other potential issues are avoided while retaining all of the above described advantages through a combination of features, one of which is to put the overhead electrode at a floating D.C. potential by capacitively isolating it from the VHF tuning stub. This is accomplished by placing a dielectric film between the coaxial tuning stub and the overhead electrode. This feature prevents DC plasma current from returning through the tuning stub via the overhead electrode, and thereby reduces arcing within the gas injection holes in the overhead electrode.

Another feature that reduces arcing is to provide capacitance between the plasma and the overhead electrode. For this purpose a dielectric layer is formed on the electrode surfaces of the overhead electrode that face the plasma. This can be done by anodizing such electrode surfaces, particularly the interior surfaces of the gas injection ports in the electrode. This feature helps to obviate plasma arcing in the gas injection ports in the overhead electrode. One reason for this is that the capacitance of the anodized electrode surfaces provides charge storage capacity which permits some charge of the RF current from the plasma to be stored rather than passing on to the electrode surfaces. To the extent charge is thus diverted from the surfaces of the gas inlet ports in the overhead electrode, plasma ignition therein is avoided.

In addition to avoiding plasma arcing within the gas injection ports of the overhead electrode, the feature of capacitively isolating the overhead electrode extends the useable life of the electrode because it results in no net D.C. current between the plasma and the electrode, a significant advantage.

In order to further reduce the risk of plasma arcing in the gas injection ports, another feature is introduced, namely a metal "foam" layer between the coaxial stub and the capacitive layer lying between the electrode and the coaxial tuning stub. In one embodiment, the metal foam layer is of a diameter that is generally coextensive with the overhead electrode. The metal foam layer is of the commercially available type well-known in the art and typically consists of an aluminum matrix having a random cell structure. The advantage of the metal foam layer is that it suppresses electric fields near the electrode (i.e., within a plenum above the overhead electrode) and thereby reduces the tendency of plasma to arc inside the gas injection ports in the overhead electrode.

A metal foam layer is also employed to baffle the incoming process gas in order to achieve an even gas distribution across the array of gas injection ports in the overhead electrode. The gas injection holes or ports in the overhead ceiling can be divided into a radially inner group and a radially outer group. One metal foam layer baffles gas between a first gas supply and the outer group of ports, while another metal foam layer baffles gas between a second gas supply and the inner group of ports. The radial distribution of process gas flow may be adjusted by independently adjusting the gas flow rates of the two gas supplies.

The coaxial tuning stub and overhead electrode offer a low impedance RF return path to ground for the HF bias power applied to the wafer support pedestal. However, it has been discovered that the new capacitive dielectric layer now inserted between the coaxial tuning stub and the overhead electrode can be used to tune the return HF path through the overhead electrode to a particular HF frequency. One advantage of the choice of a VHF source power frequency (on the overhead electrode) is that the capacitive layer (between the overhead electrode and the tuning stub), if tuned for HF frequencies, does not affect the VHF signal applied to the overhead electrode because it is an electrical short for a broad band of VHF frequencies.

Initially, a narrow HF frequency pass band to which the RF return path is tuned by the added capacitive layer was centered at the frequency of the HF bias source power applied to the wafer support pedestal. However, the problem of sheath-generated harmonics can be solved by instead selecting this capacitance to tune the HF return path through the overhead electrode to the second harmonic of the HF bias power signal. The result of this selection is that the HF second harmonic generated in the plasma sheath near the overhead electrode is shunted to ground through the overhead electrode before it can significantly affect the bulk plasma. The etch rate was found to be improved by this feature by 10% to 15% in one embodiment. In this case, it is believed the fundamental of the HF bias signal is returned to ground through other available RF paths, such as the chamber side wall.

As will be described below in detail, the selection of the capacitance of this added capacitive layer (between the overhead electrode and the tuning stub) for resonance at the selected HF frequency must take into account not only the capacitance of the thin plasma sheath at the overhead electrode but also the capacitance of the thick plasma sheath at the wafer support pedestal.

The highly efficient VHF plasma source of the present reactor is capable of maintaining a plasma of sufficiently high density so that it may be used to thoroughly dry-clean the chamber interior periodically. As employed in this specification, the term "dry-clean" refers to a cleaning procedure requiring no application of liquid chemical agents but only the application of a plasma, so that the vacuum enclosure need not be opened. Since in this manner the chamber can be thoroughly cleaned of polymer residue, its surfaces during wafer processing may be kept at a sufficiently high temperature to continually evaporate any polymer deposits thereon, so that the chamber is kept at least nearly free of polymer deposits throughout processing. (In contrast, for a reactor that cannot be thoroughly cleaned, plasma conditions must be controlled so that polymer deposits on chamber wall surfaces continue to adhere rather than being removed, to avoid contamination of the process.) For this purpose, the overhead electrode assembly includes liquid passages for introducing fluid for heating or cooling the overhead electrode, enabling temperature control of the external surfaces thereof. Generally, the plasma conditions (ion energy, wall temperatures, etc.) are such that no polymer accumulates on the chamber surfaces during processing. Any minor accumulations are thoroughly removed during cleaning.

One advantage of such a feature is that an optical window may be provided on or adjacent the overhead electrode, because it will remain clear or free of polymer deposits during processing. Thus, the reactor performance may be optically monitored. Accordingly, the overhead electrode can include an optical window near its center, with a light transmitting optical fiber cable extending upwardly for connection to sensors outside of the chamber. The optical monitoring of the plasma process may be employed to perform end-point detection. For example, the optical monitor may measure decreasing layer thickness in a plasma etch process or increasing layer thickness in a plasma-assisted chemical vapor deposition process, using conventional optical measurement techniques.

In order to solve the problem of contamination from material of the exposed surfaces of the overhead electrode entering the plasma and eventually reaching the wafer or workpiece, an additional outer layer is introduced onto the bottom (plasma-facing) surface of the overhead electrode. This additional outer layer is formed of a material compatible with the particular process being carried out. For example, in a silicon dioxide etch process, the outer layer on the overhead electrode would be silicon or silicon carbide. Generally, prior to the placement of this outer layer, the overhead electrode plasma-facing surface is anodized, as mentioned hereinabove.

Another discovery of the present reactor is that the plasma can exhibit a greater resistive load impedance variation and a smaller reactive load impedance variation than was earlier expected. Specifically, the resistive load impedance may vary by as much as 100:1 (instead of 60:1) while the reactive load impedance may vary by only 20% (instead of 35%). This difference enables the characteristic impedance of the coaxial tuning stub to be reduced from 65 Ohms (above the RF generator's 50 Ohm output impedance) down to 30 Ohms (below the RF generator's output impedance). This reduction achieves a proportional increase in tuning space with a very small compromise in efficiency. Specifically, the range of variations in plasma resistive load impedance which can be matched by the tuning stub is increased from 60:1 to 100:1, due to the reduction in coaxial stub characteristic impedance. The characteristic impedance of the coaxial stub is determined by the radii of its inner and outer conductors.

In order to reduce the footprint of the coaxial tuning stub, an equivalent strip line circuit is substituted in its stead. The outer conductor of the coaxial tuning stub becomes a ground plane surface as the metal lid capping the reactor, while the center conductor of the coaxial tuning stub becomes the strip line conductor. The characteristic impedance of the strip line conductor is adjusted by adjusting the spacing between the strip line conductor and the ground plane (the lid). The footprint of the tuning device is reduced because, while the coaxial tuning stub extends along a straight line, the strip line conductor can wind around circularly inside the lid, thereby reducing the area or footprint. All of the features of the coaxial tuning stub are retained in the strip line circuit. Thus, the length of the strip line conductor is determined in the same manner as the length of the coaxial tuning stub as described above. Also, the location along the length of the strip line conductor for the feed point or tap connected to the VHF generator is the same as that of the tap to the coaxial tuning stub. Also, the strip line conductor is hollow and utilities are fed through the strip line conductor, in the same manner that utilities are fed through the coaxial tuning stub center conductor.

Figure 8:
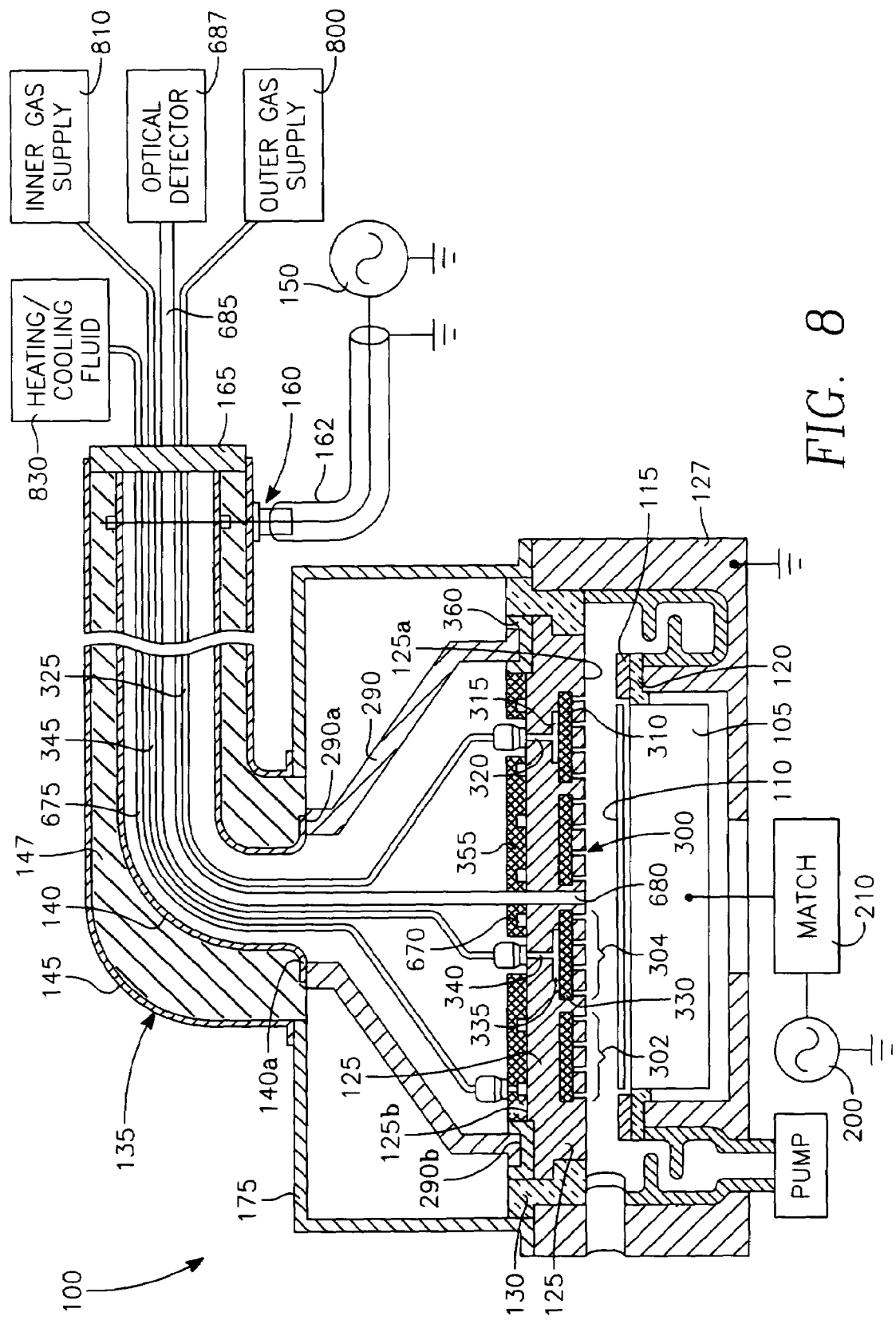
FIG. 8 depicts a further embodiment.
Figure 9:
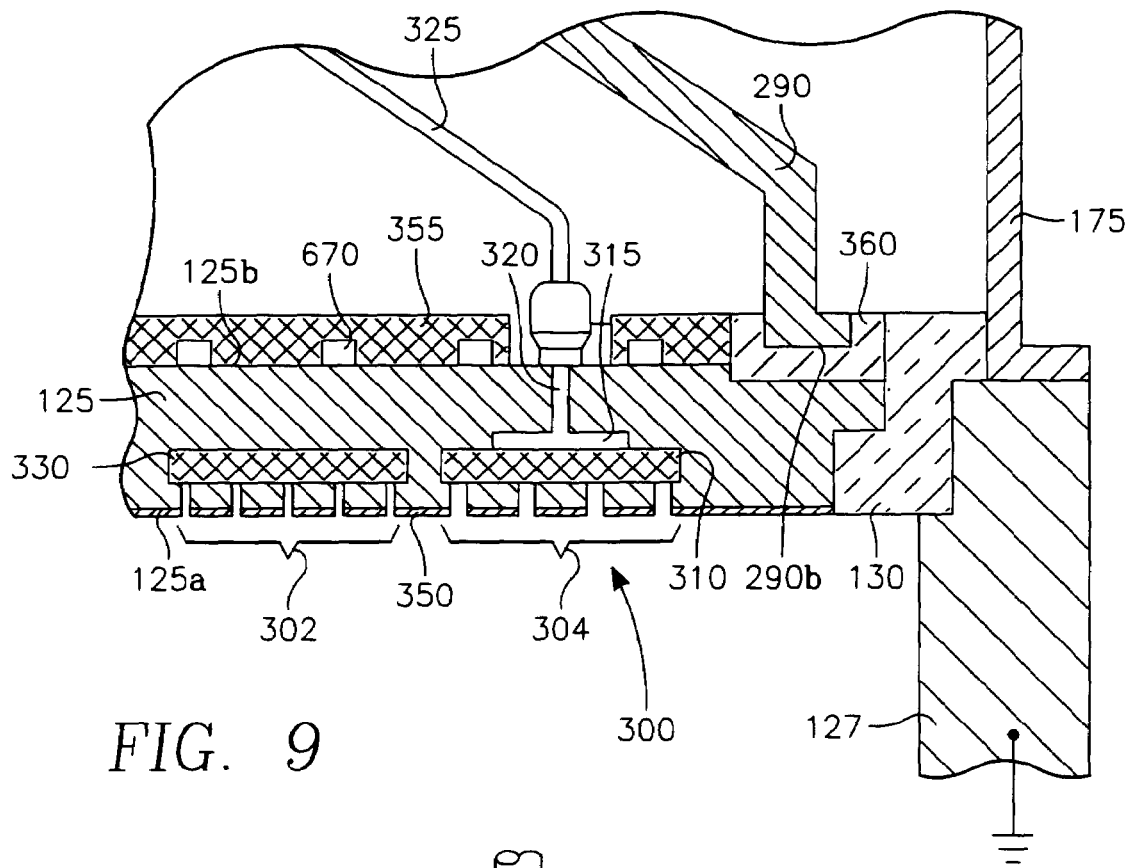
FIG. 9 is an enlarged view corresponding to FIG. 8.

Introduction of Process Gas Through the Overhead Electrode:

Referring now to FIGS. 8 and 9, the overhead electrode 125 is a gas distribution showerhead, and therefore has a large number of gas injection ports or small holes 300 in its bottom surface 125a facing the workpiece support 105. In an exemplary embodiment, the ports 300 were between 0.01 and 0.03 inch in diameter and their centers are uniformly spaced apart by about 3/8 inch. In the embodiment illustrated in FIG. 8, the annular top 290a of a conical metal housing 290 supports the near end 140a of the coaxial stub inner conductor 140 and its annular base 290b rests on the aluminum overhead electrode 125. The conical shape of the housing 290 defines a large open plenum over the overhead electrode 125 within which various utilities may be fed from the hollow coaxial inner conductor 140 to the overhead electrode 125. As will be described in more detail below, the conical housing base 290b is near the outer circumference of the overhead electrode 125, leaving nearly all of the upper surface of the overhead electrode 125 accessible.

Generally, the ports 300 consist of a radially outer group of 0.020 in diameter ports 302 and a radially inner group of 0.010 in diameter ports 304. Generally, the outer group of ports 302 extends beyond the circumference of the wafer by about half the radius of the wafer, in order to ensure uniform gas flow at the wafer periphery. One advantage of this feature is that the radial distribution of process gas flow can be adjusted in such a manner as to compensate for the tendency of the VHF capacitively coupled reactor of FIGS. 1–7 to produce a plasma density that is greater over the center of the wafer and less over the wafer periphery. A radially outer metallic foam layer 310 within the overhead electrode 125 overlies the ports 302. A radially outer gas distribution manifold or plenum 315 overlying the outer foam layer 310 is coupled through an axial gas passageway 320 to a gas supply line 325 passing through the interior conductor 140 of the coaxial tuning stub 135. A radially inner aluminum foam layer 330 within the overhead electrode 125 overlies the ports 304. A radially inner gas distribution manifold or plenum 335 overlying the inner foam layer 330 is coupled through an axial gas passageway 340 to a gas supply line 345 passing through the interior conductor 140 of the coaxial tuning stub 135. The aluminum foam layers 310 and 330 baffle the incoming process gases. The radial distribution of process gas flow rate is adjusted by independent selection of process gas flow rates within each one of the gas supply lines 325 and 345.

Figure 10:
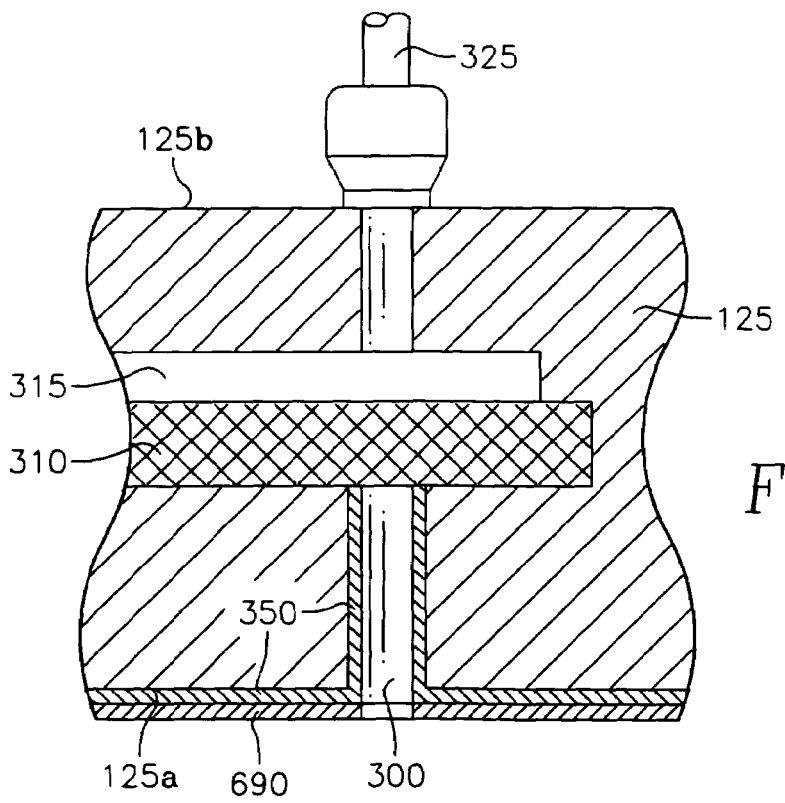
FIG. 10 is an enlarged view of FIG. 9.

Suppression of Arcing in the Gas Injection Ports:

In order to provide some capacitance between the plasma and the overhead electrode as a means of reducing arcing, the overhead electrode bottom surface 125a is coated with a dielectric layer. In one embodiment, the overhead electrode 125 is aluminum and the dielectric coating is formed by anodizing the electrode bottom surface 125a. Such anodization forms a very thin dielectric coating not only on the flat bottom surface 125a but also on the interior surfaces of the gas injection ports 300. This feature tends to suppress arcing within the gas injection ports by providing a charge storage capability that can compensate for RF plasma currents flowing to the overhead electrode 125. FIG. 10 is an enlarged partial view corresponding to FIG. 8 illustrating the resulting fine structure near one of the gas inlet ports 300. In particular, an aluminum oxide layer 350 formed by anodization covers the electrode bottom surface 125a and covers the interior surface of the gas injection port 300.

In order to suppress electric fields near the overhead electrode 125, the top surface 125b of the overhead electrode 125 is covered with a relatively thick (0.25 in) layer of aluminum foam 355. The thick aluminum foam 355 tends to keep the electric potential near the overhead electrode constant in the axial (vertical) direction, thereby suppressing electric fields in that vicinity which would otherwise contribute to plasma arcing within the gas injection ports 300.

In order to block D.C. plasma currents from flowing through the overhead electrode to the coaxial stub center conductor 140, a thin insulative layer 360 is placed between the overhead electrode 125 and the base 290b of the conductive housing 290 that connects the overhead electrode 125 to the coaxial center conductor 140. This feature allows the D.C. potential of the overhead electrode to float. A capacitor is thereby formed between the overhead electrode 125 and the conductive housing base 290b. The capacitance of this capacitor is determined by the area of the base 290b as well as by the thickness and dielectric constant of the thin insulative layer 360. The capacitance of this capacitor may be selected to provide a narrow resonance or low impedance path at a particular HF frequency, while providing an RF short across the entire VHF band. In this way, the overhead electrode 125 provides a return path for HF bias power applied to the wafer support pedestal 105, but does not affect the behavior of the overhead electrode 125 at the VHF source power frequency. By thus, blocking D.C. plasma current that would otherwise flow to the overhead electrode, plasma arcing within the gas injection ports 300 is suppressed because such D.C. currents would contribute to arcing.

In summary, plasma arcing within the gas injection ports 300 is suppressed by forming a dielectric coating 350 on the bottom of the overhead electrode 125 and on the interior surfaces of the gas injection ports 300, by providing an aluminum foam layer 355 on top of the overhead electrode 125, and by placing a thin insulative layer 360 between the overhead electrode 125 and the conductive housing 290.

Suppression of Plasma Sheath-Generated Harmonics:

The thin insulative layer 360 can play an important role in suppressing plasma sheath-generated harmonics of the HF bias signal applied to the wafer support pedestal 105. The presence of such harmonics degrades process performance, and specifically reduces etch rates. By selecting the capacitance-determining characteristics of the insulative layer 360 (i.e., dielectric constant and thickness), the return path from the plasma through the overhead electrode 125 and coaxial inner conductor 140 is tuned to resonate (and therefore have a very high admittance) at a particular HF frequency. While one choice for this resonant frequency would be the fundamental of the HF bias signal applied to the wafer support pedestal 105, it is a discovery of the reactor that the etch rate is improved by 10% to 15% by selecting this resonance to be the second harmonic of the bias signal. Such a favorable result is achieved because harmonics generated by the non-linear load presented by the plasma sheath are quickly returned to ground through the low impedance path presented by the overhead electrode and coaxial center conductor 140 by virtue of the capacitive layer 360.

Selection of the thickness of the capacitor layer 360 to tune the return path through the overhead electrode 125 to a particular HF frequency is affected by a number of factors, including the capacitance of the thin plasma sheath at the overhead electrode 125, the capacitance of the thick plasma sheath at the wafer support pedestal 105 as well as the capacitance of the plasma itself. Numerous conventional techniques may be readily employed by the skilled worker to find the correct thickness of the capacitor layer 360 to achieve resonance at the selected HF frequency given the particular plasma operating conditions, including trial and error.

Electrode Surface Temperature Control:

In an oxide etch reactor, polymer deposits are a serious problem because the process gas must be able to form polymer layers over non-oxide containing surfaces on the workpiece in order to achieve a suitable etch selectivity between silicon dioxide materials and other materials that are not to be etched. During plasma processing using fluorocarbon gases, the simpler fluorine ions and radicals perform the etching while the carbon-rich species deposit polymer over all non-oxygen-containing materials on the workpiece as well as all interior surfaces of the reactor chamber. In order to avoid contamination of the workpiece by polymer particles falling from chamber interior surfaces into the plasma, these surfaces must be kept at a sufficiently low temperature and the plasma electron energy must be kept sufficiently low to avoid tearing such deposits off of the chamber interior surfaces. Alternatively, the chamber vacuum must be interrupted and a chemical cleaning step performed to remove such deposits, a step that greatly reduces productivity of the reactor.

The capacitively coupled VHF source described with reference to FIG. 1 is highly efficient and therefore capable of producing, during a non-chemical cleaning step, a sufficiently high plasma density to thoroughly remove from the chamber interior surfaces any polymer residue deposited during wafer processing. During such a cleaning step, the usual plasma process gases may be replaced by a more volatile gas (e.g., one tending to produce a plasma with a very high free fluorine content). Since no liquid chemicals need be introduced into the chamber, the chamber remains closed so that the cleaning step may be performed quickly and frequently to keep the chamber free of polymer deposits. Therefore, one operating mode of the reactor of FIG. 8 is one in which the chamber surface temperatures and the plasma ion energies are sufficiently great to avoid accumulation of polymer on the interior chamber surfaces.

For this purpose, the reactor of FIG. 8 includes passages 670 (for heat-conducting fluid) on the overhead electrode 125. In the implementation of FIG. 8, the fluid passages 670 are formed between the upper aluminum foam layer 355 and the upper surface of the overhead electrode 125. Alternatively, such passages may be formed completely internally within the overhead electrode 125. A temperature-controlling fluid or gas is fed to the fluid passages 670 from a fluid supply line 675 passing through the hollow inner coaxial conductor 140. Thus, the temperature of the overhead electrode 125 may be precisely controlled. By thus controlling the electrode temperature and by controlling other plasma process parameters such plasma ion energy, the reactor may be operated in either deposition mode (in which the surfaces are sufficiently cool to accumulate polymer) or in a depletion mode (in which the surfaces are sufficiently hot to allow plasma ions to tear away polymer from the surfaces and thereby avoid accumulation of polymer). One desirable mode is the depletion mode because this mode avoids particle contamination.

Optical Monitoring of the Plasma Process:

Since the reactor of FIG. 8 can be operated so as to be free of polymer deposits on the chamber interior surfaces, an optical window 680 may be provided in the bottom surface of the overhead electrode 125. An optical channel such as an optical fiber or light pipe 685 is connected at one end to the optical window 680 and passes through the hollow inner coaxial conductor 140. The light pipe 685 is connected to a convention optical detector 687 at the outer end.

With this feature, end point detection and other measurements may be performed using such an optical detector. Specifically, the detector 687 measures the thickness of a selected layer on the workpiece or semiconductor wafer 110, using well-known optical techniques. During an etch process, for example, the process would be halted after the thickness of the material being etched is reduced to a predetermined thickness, as measured by the detector 687.

Figure 11:
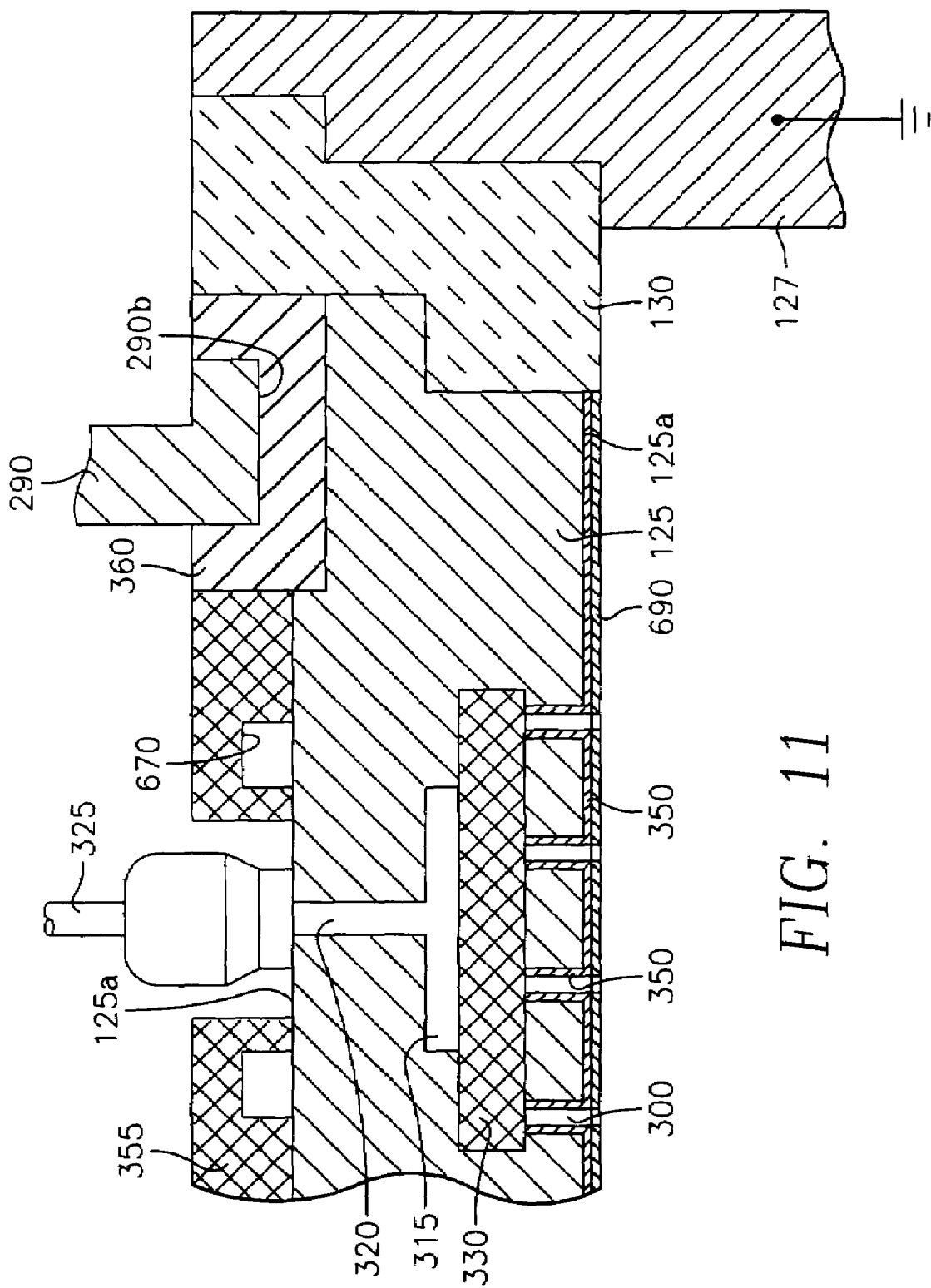
FIG. 11 is another enlarged view of FIG. 8.

Prevention of Contamination:

Since the chamber interior surfaces can be maintained free of polymer deposits, they remain exposed to the plasma. In particular, the bottom surface of the aluminum overhead electrode 125 is continually subject to attack from the plasma, and is therefore liable to contribute aluminum species into the plasma, leading to contamination of the workpiece and hence process failure. In order to prevent such a problem, the bottom surface of the overhead electrode 125, which may be anodized, is coated with a process-compatible material such as silicon or silicon carbide. Thus, as shown in FIGS. 10 and 11, a thin silicon carbide film 690 covers the bottom anodized surface of the aluminum overhead electrode 125. The thin silicon or silicon carbide film 690 prevents the plasma from attacking the aluminum material of the electrode 125. To the extend the plasma removes material from the silicon-containing film 690, the species thus introduced into the plasma cannot contaminate the process because such species (silicon and carbon) are already present in the plasma and/or workpiece and therefore are compatible with the process. Silicon is present in the plasma where silicon oxide is being etched. Carbon is in the plasma wherein fluorocarbon gases are employed as process etch gases.

In an alternative embodiment, the overhead electrode is not anodized and the silicon carbide film 690 is formed over a pure aluminum surface of the electrode 125.

Increasing the Tuning Space of the Coaxial Stub:

The plasma can exhibit a greater resistive load impedance variation and a smaller reactive load impedance variation. Specifically, the resistive load impedance of the plasma may vary by as much as 100:1 (instead of 60:1) while the reactive load impedance may vary by only 20% (instead of 35%). This difference enables the characteristic impedance of the coaxial tuning stub to be reduced from 65 Ohms (i.e., above the RF generator's 50 Ohm output impedance) down to 30 Ohms (i.e., below the RF generator's output impedance). This reduction achieves a proportional increase in tuning space with a very small compromise in efficiency. Specifically, the range of variations in plasma resistive load impedance which can be matched by the tuning stub is increased from 60:1 to 100:1, due to the reduction in coaxial stub characteristic impedance. The characteristic impedance of the coaxial stub is determined by the radii of its inner and outer conductors.

Results:

The reactor is thus far less sensitive to changes in operating conditions and/or variations in manufacturing tolerances. It is believed that these great advantages including lack of sensitivity to operating conditions—i.e., broad tuning or frequency space for impedance matching—are the contributions of a number of reactor features working together in combination, including an overhead reactor electrode having a capacitance matching or nearly matching the magnitude of the negative capacitance of the plasma at the most desired processing plasma ion densities, use of a VHF source power frequency matching or nearly matching the plasma-electrode resonance frequency; the close relationship of the VHF source power frequency, the plasma-electrode resonance frequency and the stub resonance frequency; offsetting the plasma-electrode resonance frequency, the stub resonance frequency and the source power frequency from one another; and the use of a resonant stub match to couple source power to the overhead electrode, for example with the source power input tap 160 offset slightly from the ideal match location.

It is believed that offsetting the plasma, stub and source power frequencies broadens the tuning space of the system by, in effect, de-tuning the system. Using a stub match broadens the tuning space by matching across a broader frequency range. Offsetting the stub tap point 160 from the ideal match point further optimizes the system to broaden the tuning space, because this feature has the effect of adding current when delivered power would otherwise decline and of subtracting current when delivered power would otherwise increase. Using a higher (VHF) source power frequency provides a decrease in system Q or an increase in tuning space proportional to the increase in source power frequency. More importantly, this selection allows the electrode-plasma resonance to be matched to the source power frequency at a plasma density favorable to etch processes.

Because the reactor is virtually immune to changes in process conditions over a broader process window, it provides the three-fold advantage of a reactor that is (a) workable over a wider range of process condition deviations, (b) useful over a broader range of applications (different process recipes) and (c) whose performance is virtually unaffected over a wider range of manufacturing tolerances, so that reactor-to-reactor characteristics are uniform.

Consequently, superior results have been attained. Specifically, the Q of the system has been minimized to about 5 in some cases to retain a superior degree of uniformity of characteristics and performance among different reactors of the same model, and to enhance process window. High plasma densities on the order of $10^{12}$ ions/cc have been achieved consistently with only 2 kW of source power. The system sustained plasmas over a pressure range of 10 mT to 200 mT with no transitions with source power levels as low as 10 W. The shorted impedance matching coaxial stub resonating near the VHF plasma and source power frequencies shorted out parasitic VHF plasma sheath harmonics while realizing a power efficiency in excess of 95%. The system accommodated plasma resistive load variations of 60:1 and reactive load variations of 1.3 to 0.75 while maintaining the source power SWR at less than 3:1.

It is believed that this increased capability to accommodate load variations, and hence expanded process windows, is due in large part to (a) the matching of the electrode and plasma capacitances under the design operating conditions, accomplished as above described by appropriate choice of dielectric values between the electrode 125 and its conductive support as well as the appropriate choice of VHF source power frequency; and (b) the specially configured coaxial stub with the optimal tap positioning, by which the tap current added to the stub current under low load conditions and subtracted from it under high load conditions. It is believed the very high power efficiency is due in large part to the impedance transformation provided by the coaxial stub, which minimizes reflection losses both at the generator connection as well as at the electrode connection, due to obtaining a match between stub resonant frequency and electrode-plasma resonant frequency, along with optimal tap positioning for realizing a low current and high voltage in the coaxial stub where resistive losses dominate and a high current low voltage at the electrode/plasma where capacitive losses dominate. Yet all these benefits are provided while avoiding or minimizing the need for conventional impedance match apparatus.

While embodiments of the reactor adapted for silicon and metal etch have been described in detail, the reactor is also advantageous for choices of plasma operating conditions other than those described above, including different ion densities, different plasma source power levels, different chamber pressures. These variations will produce different plasma capacitances, requiring different electrode capacitances and different electrode-plasma resonant frequencies and therefore require different plasma source power frequencies and stub resonant frequencies from those described above. Also, different wafer diameters and different plasma processes such as chemical vapor deposition may well have different operating regimes for source power and chamber pressure. Yet it is believed that under these various applications, the reactor will generally enhance the process window and stability as in the embodiment described above.

Figure 12:
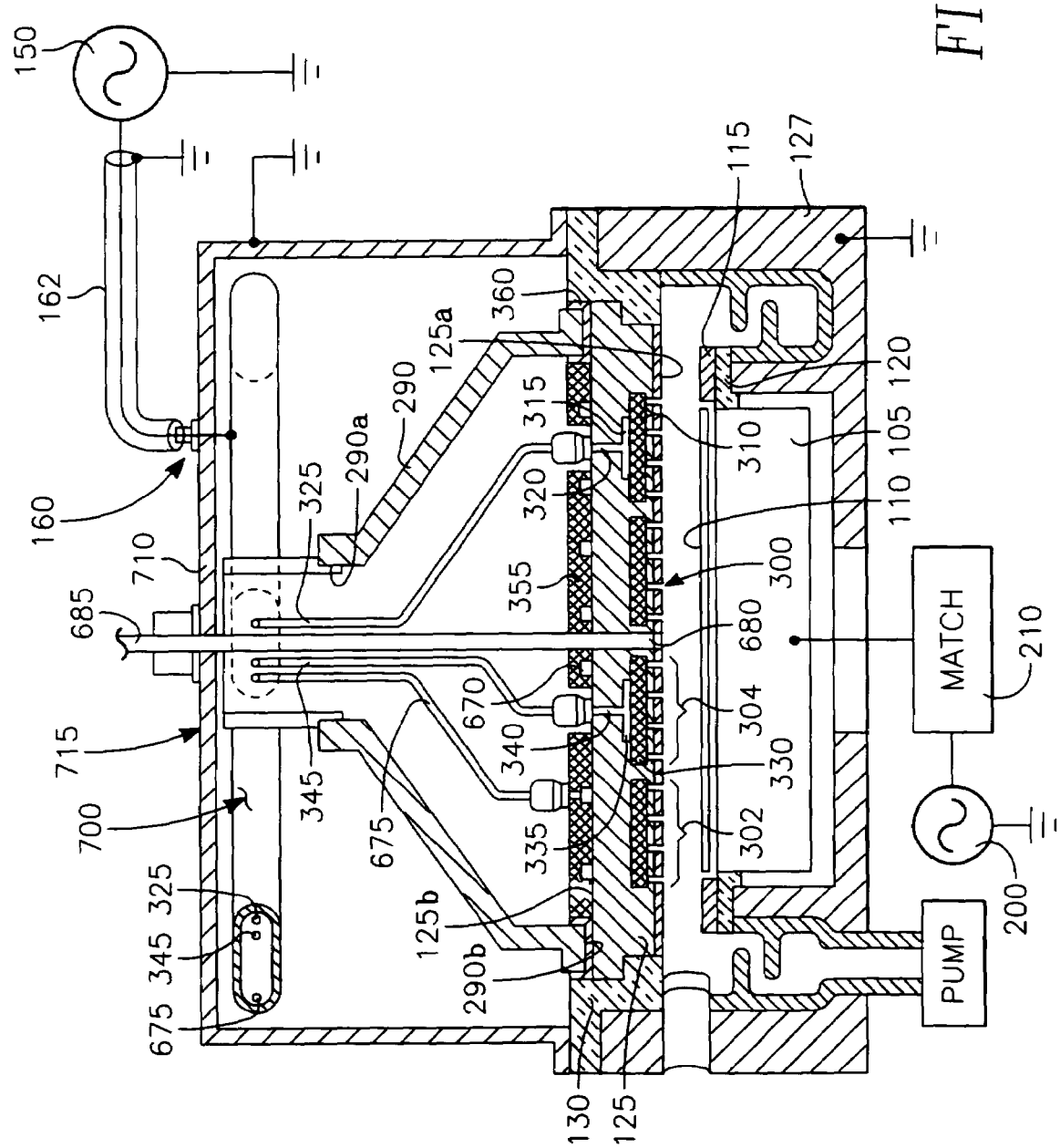
FIG. 12 depicts yet another embodiment.
Figure 13:
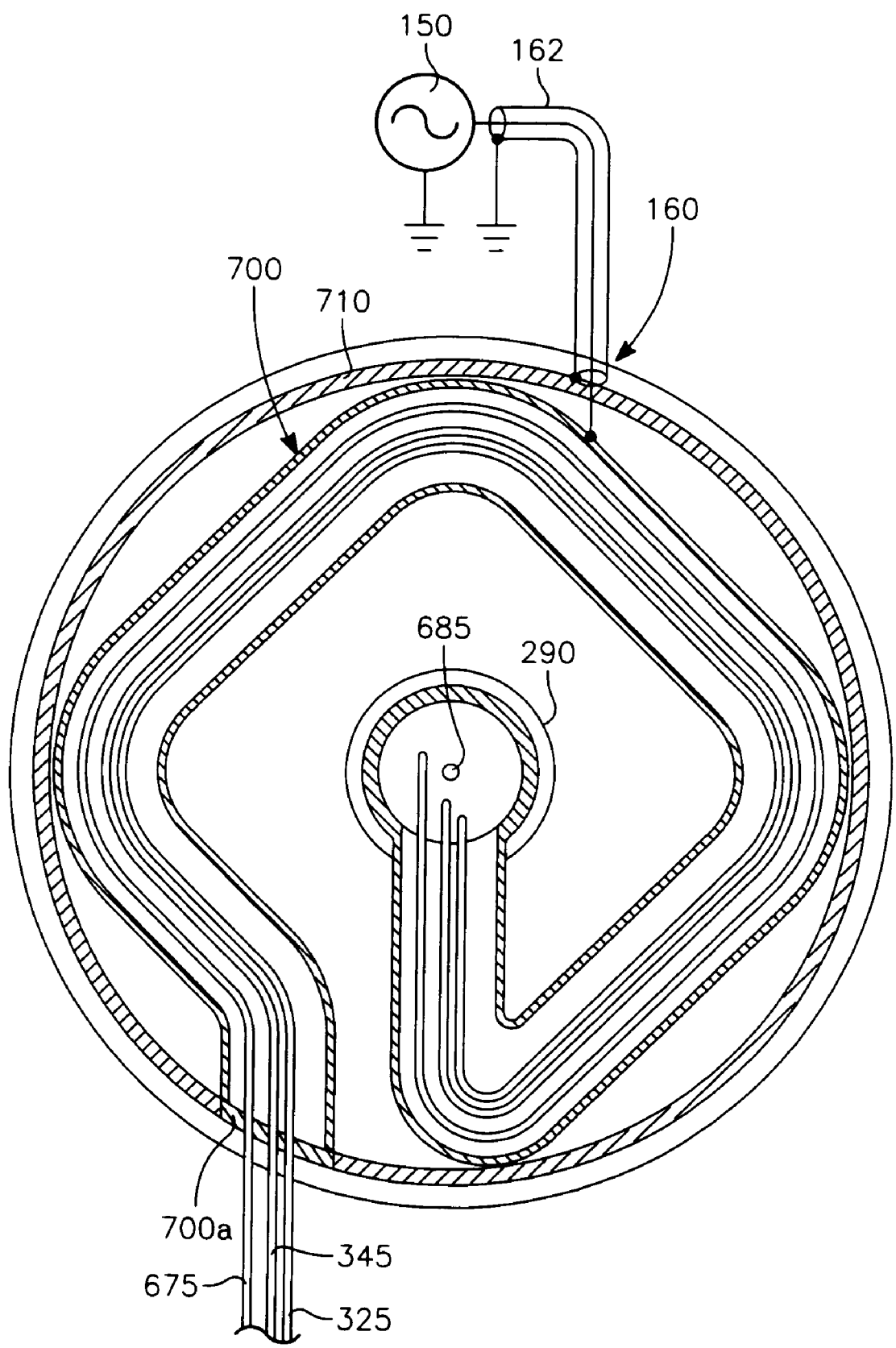
FIG. 13 is a top view corresponding to FIG. 12.
Figure 14:
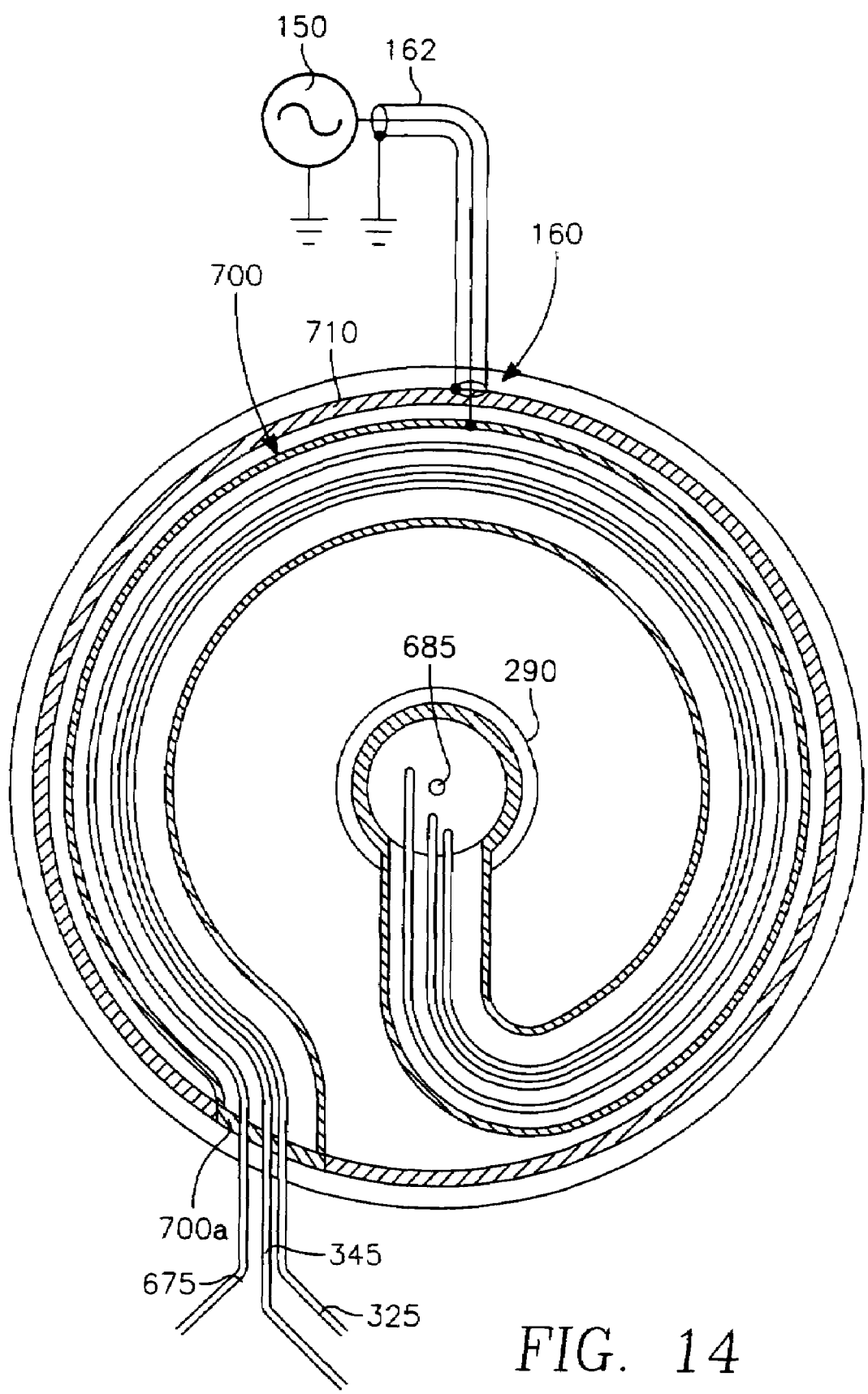
FIG. 14 is a top view corresponding to an alternate embodiment of the reactor of FIG. 13.

Compact VHF Fixed Tuning Element:

The coaxial tuning stub of FIGS. 1 and 8 is a fixed tuning element that provides an impedance match over a large tuning space, as described with reference to FIGS. 1–7. However, because of its elongate linear design, its footprint is actually larger than that of the plasma reactor chamber. In those situations where this aspect is found to be inconvenient, the coaxial tuning stub of FIGS. 1 and 8 is replaced by an equivalent strip line circuit, as illustrated in FIGS. 12, 13 and 14. The center conductor of the VHF generator 50 Ohm coaxial output connector is connected to a strip line conductor 700, while the outer conductor of the VHF generator 50 Ohm coaxial output connector is connected to the metal ceiling 710 of a housing 715 covering the top of the reactor. The conductive ceiling 710 functions as a ground plane that the strip line conductor 700 faces. The strip line conductor 700 is generally oval in cross-section, with its broader side facing the ground plane ceiling 710. The characteristic impedance of the strip line conductor is determined by its spacing from the ground plane ceiling 710. The strip line conductor 700 may be uniformly spaced from the ground plane ceiling 710 along its entire length.

In an exemplary embodiment, the strip line conductor was 0.125 inch in height, 2.5 inches wide and is displaced below the ground plane ceiling 710 by 0.5 inch. By having the wider (2.5 inch) side of the strip line conductor 700 facing the ground plane ceiling 710, current flow is more distributed across the entire 2.5 inch width of the strip line conductor 700, thereby reducing resistive losses in the outer surface where most of the current flow occurs. The length of the strip line conductor 700 is determined in the same manner as the length of the coaxial tuning stub 135, as described above in detail with reference to FIG. 1. Furthermore, the placement of the RF tap 160 along the length of the strip line conductor 700 is also determined in the same manner as the placement of the RF tap along the length of the coaxial stub 135, as described with reference to FIG. 1. Finally, the end of the strip line conductor 700 of FIG. 12 furthest from the overhead electrode 125 is, like the corresponding end of the coax stub inner conductor 140 of FIG. 1, shorted to ground. In the case of the strip line conductor 700, the short to ground is achieved by a connection at the far end 700a to the ground plane ceiling 710, as shown in FIG. 13.

Like the coaxial tuning stub 135 of FIGS. 1–8, the strip line conductor 700 has a length equal to a quarter wavelength of the resonant frequency of the fixed tuning element, in this case the strip line circuit comprising the strip line conductor 700 and the ground plane ceiling. Therefore, the selection of the length of the strip line conductor 700 is exactly as the selection of the length of the coaxial tuning stub 135 which is described above with reference to FIGS. 1–7. In one embodiment, this length was about 29 inches. The RF tap 160 of FIG. 12 connects the VHF generator to the strip line circuit at a particular point along the length of the strip line conductor 700, just as the RF tap 160 of FIG. 1 makes the corresponding connection along the length of the coaxial tuning stub 135. In the case of FIG. 12, the center conductor of the VHF generator output coaxial connector is connected at the tap 160 to the strip line conductor while the outer conductor of the VHF generator output coaxial conductor is connected to the ground plane ceiling at the point overlying the tap connection to the strip line conductor. The location of the tap point 160 in FIG. 12 along the length of the strip line conductor 700 is determined in the same manner as the location of the tap in FIG. 1 along the length of the coaxial stub, as described above in detail with respect to FIG. 1. With this feature, the strip line circuit comprising the strip line conductor 700 and the ground plane ceiling performs in the same manner as the coaxial tuning stub 135 of FIG. 1, including the feature described with respect to FIG. 1 in which the impedance match space can accommodate as much as a 100:1 variation in load resistance by slightly offsetting the tap point 160 from a theoretical optimum. As described above with reference to FIG. 1, the theoretical optimum location of the tap 160 is at a point along the length of the tuning stub 135 (or, equivalently, along the length of the strip line conductor 700 of FIG. 12) at which the ratio between the standing wave voltage and current equals the output impedance of the VHF generator or the characteristic impedance of the coaxial cable connected therebetween. The discovery described with reference to FIG. 1 is that the impedance match space is surprisingly expanded by offsetting the tap 160 by about 5% from the theoretical optimum location. Thus, the strip line conductor circuit of FIG. 12 provides all the advantages and functions of the coaxial tuning stub of FIG. 1 but further adds the advantage of compactness.

Like the inner conductor 140 of the coaxial stub of FIG. 8, the strip line conductor 700 of FIG. 12 is hollow in order to accommodate the utility lines connected to the electrode 125, and is connected to the top surface 290a of the conical housing 290. The advantage of the strip line conductor 700 (over the coaxial tuning stub of FIGS. 1 and 8) is that the strip line conductor 700 can extend in a circular fashion within the housing 715 so that its requisite length can be realized without extending beyond the "footprint" of the reactor chamber.

The length of the strip line conductor is determined in the same manner that the length of the coaxial tuning stub is determined, as described above with reference to FIG. 1. The impedance of the strip line conductor 700 is determined by adjusting its displacement from the ground plane ceiling 710. As described above, this impedance is best selected to be about 30 Ohms, or less than the VHF generator output impedance. The location of the tap 160 from the VHF generator 150 along the length of the strip line conductor 700 is made in the same manner as the location of the RF tap 160 on the coaxial tuning stub as described above with reference to FIG. 1. The strip line conductor 700 in combination with the ground plane ceiling 710 performs the same function as the coaxial tuning stub of FIGS. 1 or 8, and provides the same performance advantages as described above with reference to FIG. 1.

While the top view of FIG. 13 shows an embodiment in which the strip line conductor 700 is wound along a nearly square path (with rounded corners), FIG. 14 illustrates another embodiment in which the strip line conductor 700 is circularly wound.

Utilities Fed Through the Tuning Element:

As described above with respect to FIGS. 8 and 12, the coaxial stub inner conductor 140 of FIG. 8 and the strip line conductor 700 of FIG. 12 are both hollow in order to accommodate lines that carry various utilities to the overhead electrode. Thus, as illustrated in both FIGS. 8 and 12, the outer gas supply line 325 is connected to an outer gas flow controller 800, the inner gas supply line 345 is connected to an inner gas flow controller 810, the optical fiber or light pipe 685 is connected to the optical detector 687, and the heating/cooling line 675 is connected to a heating/cooling source controller 830.

The fixed tuning element 135 is either a coaxial tuning stub (as in the embodiments of FIGS. 1 and 8) or a strip line circuit (as in the embodiments of FIGS. 12 and 14). Antenna designers will recognize the equivalent function performed by both embodiments of the fixed tuning element in providing an impedance match between the 50 Ohm characteristic output impedance of the RF generator and the impedance of the electrode/plasma combination. Both embodiments of the fixed tuning element (or, equivalently, fixed impedance match element) share structural features in common, including the use of a center conductor (either a strip line conductor in FIG. 12 or an inner coaxial conductor in FIG. 8) and a grounded conductor (the ground plane ceiling of FIG. 12 or the grounded outer coaxial conductor of FIG. 8). In both cases, the characteristic impedance of the impedance match element is determined by the spacing between the two conductors, while the input impedance to the impedance match element is determined by the location along the center conductor of the connection to the RF generator. Also, the center conductor is hollow and therefore serves as an RF-shielded conduit for gas feed lines and heat-conductive fluid feed lines. And the most important common feature is that both embodiments of the impedance match element are physically fixed in structure, and therefore require no moving parts or intelligent controllers, a significant advantage. Other related advantages have already been described. The fixed impedance match element of both embodiments may therefore be referred to in general as a fixed two-conductor impedance match element with a hollow center conductor.

Coated Ceiling Electrode with RF Loss Invariance, Arc Suppression and Low Contamination:

The problem of arcing in gas distribution passages within the ceiling electrode is solved by combining the following features: (a) a gas passage shape which tends to have good gas flow or conductance but which also tends to produce an electric field distribution along the axial length of such gas passages in which the electric field strength decreases from a maximum strength at the bottom surface of the electrode to a minimal strength near the top of the electrode; (b) an orifice feeding the aforementioned gas passages which is sufficiently lossy to have a pressure drop representing almost the entire pressure difference between the gas supply pressure and the vacuum level of the reactor chamber, the orifice being located within or above the region of minimum field strength in the electrical field distribution of the gas passages. The result is that virtually all pressure drops occur within a region of minimal electric field strength while all electric field drops occur within a region of nearly zero pressure drops. Consequently, the combination of gas pressure and electric field strength at all locations along the axial length of the ceiling electrode are generally outside a range at which arcing can occur. This range is defined by the Paschen curve, as will be discussed below in detail. The selection of the cross-sectional shape of the gas passages, the orifice diameter and location of the orifice to accomplish the foregoing results will be described below in detail.

The problem of a wide variation of RF losses in the protective semiconductor coating on the ceiling electrode interior surface is solved by a particular selection of the electrical characteristics of the semiconductor coating in accordance with the reactor. Wide variations in RF absorption by the semiconductor coating or layer are caused by relatively small excursions in electrode temperature, electrode thickness and impurity concentration. This problem is solved in the present reactor by selecting a dopant concentration of the semiconductor layer to a level that places the loss tangent of the semiconductor layer in a range in which RF absorption is at least nearly invariant with respect to changes in the loss tangent of the material. (The loss tangent is the ratio between the real and imaginary components of the complex dielectric constant of the material.) The loss tangent is determined by dopant or intrinsic impurity concentration and varies with temperature. Moreover, the sensitivity or variation of RF absorption in the material with variations in the loss tangent is affected by the thickness of the layer. The result is that selecting the loss tangent of semiconductor coating or layer to be in a region of minimal changes in RF power absorption with respect to changes in loss tangent renders the RF power absorption nearly insensitive to changes in temperature, layer thickness and layer composition (e.g., impurity concentration).

One aspect of the present ceiling electrode is a highly simplified structure in which the semiconductor layer is a single monolithic layer in which gas injection passages are formed, and which is bonded directly to the bottom surface of the metal electrode base. The bond layer thickness to achieve an optimum bond is significant, leaving a relatively large area of bonding material exposed to the processing chamber, leading to contamination. This problem is solved without reducing the thickness of the bonding layer by dividing the bonding layer into separate spaced-apart zones, and surrounding each zone with a lip extending either downwardly from the overlying metal electrode base or (alternatively) upwardly from the underlying semiconductor layer. The lip at least partially covers the exposed thickness of the bonding layer to reduce or prevent contamination of the process gases in the chamber. A further aspect is to employ an extremely high grade adhesive material with very minimal outgassing characteristics.

Figure 15:
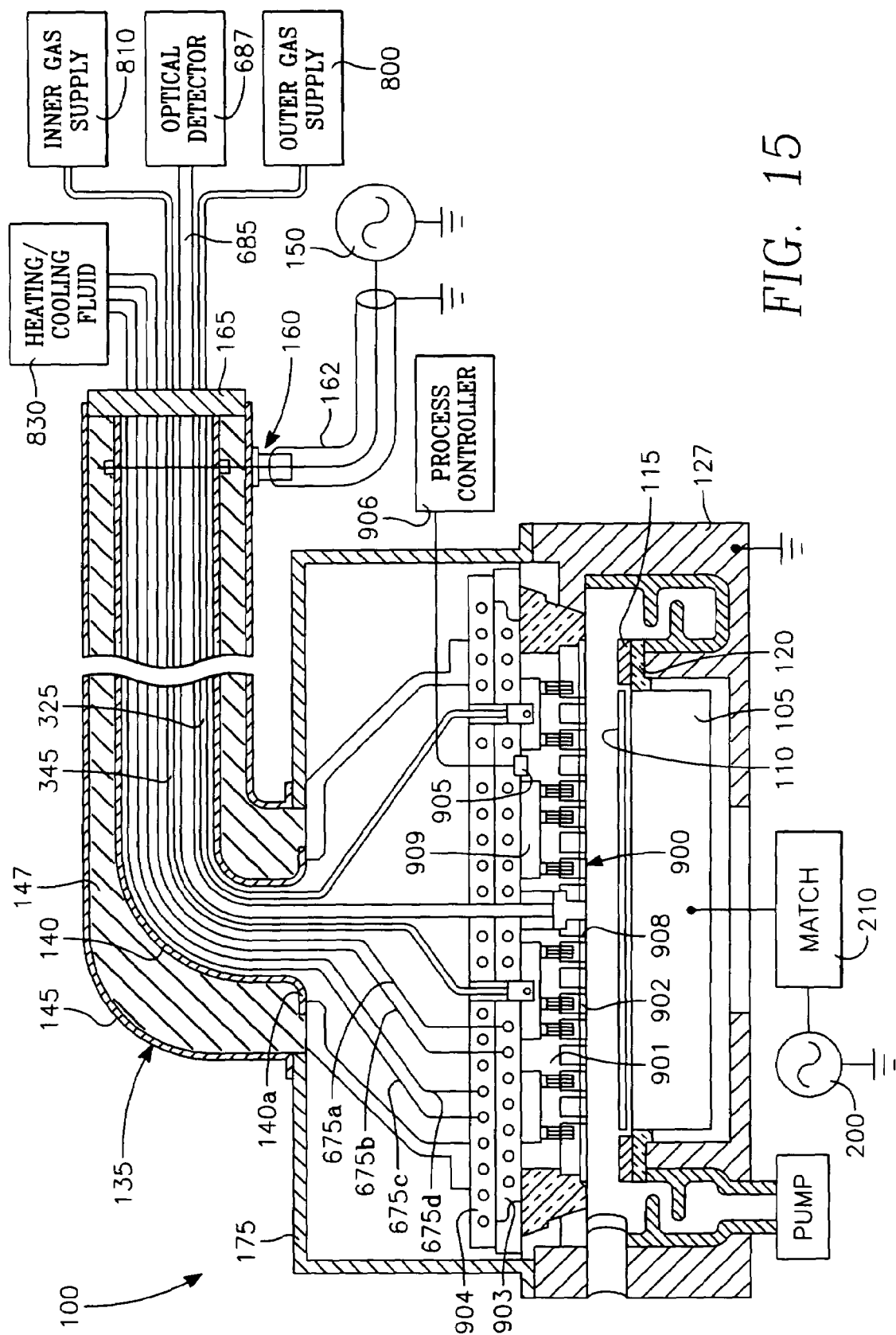
FIG. 15 illustrates a plasma reactor similar to that of FIG. 8 but in which the ceiling electrode has a protective semiconductor coating with relatively invariant RF loss and is resistant to arcing.

Reference is now made to FIG. 15. FIG. 15 illustrates a plasma reactor similar to that of FIG. 8, except that the ceiling electrode 125 of FIG. 8 is replaced by the ceiling electrode 900 of FIG. 15. The ceiling electrode 900 is shown in a cross-sectional side view in FIG. 15, and consists of a metal (e.g., aluminum) base 901 having a bottom surface facing the wafer support pedestal 105 and a protective layer (or showerhead) 902 bonded to the bottom surface of the metal base 901. The protective layer may be formed as a bulk ceramic member by chemical vapor deposition of a process-compatible material. Such a process-compatible material may be, for example, a ceramic such as silicon-carbide, which may be doped with an impurity to render the material semiconductive, in accordance with a certain feature that will be described later in this specification. The ceiling electrode 900 further includes a heating plate 903 lying on the top surface of the metal base 901 and a cooling plate 904 lying on the top surface of the heating plate 903. As indicated schematically in FIG. 15, a heating fluid feed line 675*a* and return line 675*b* supply a heating fluid for circulation in the heating plate 903, while a cooling fluid feed line 675*c* and return line 675*d* supply a cooling fluid for circulation in the cooling plate 904. A thermocouple 905 provides measurements of the temperature of the base 901 to a process controller 906.

Figure 16:
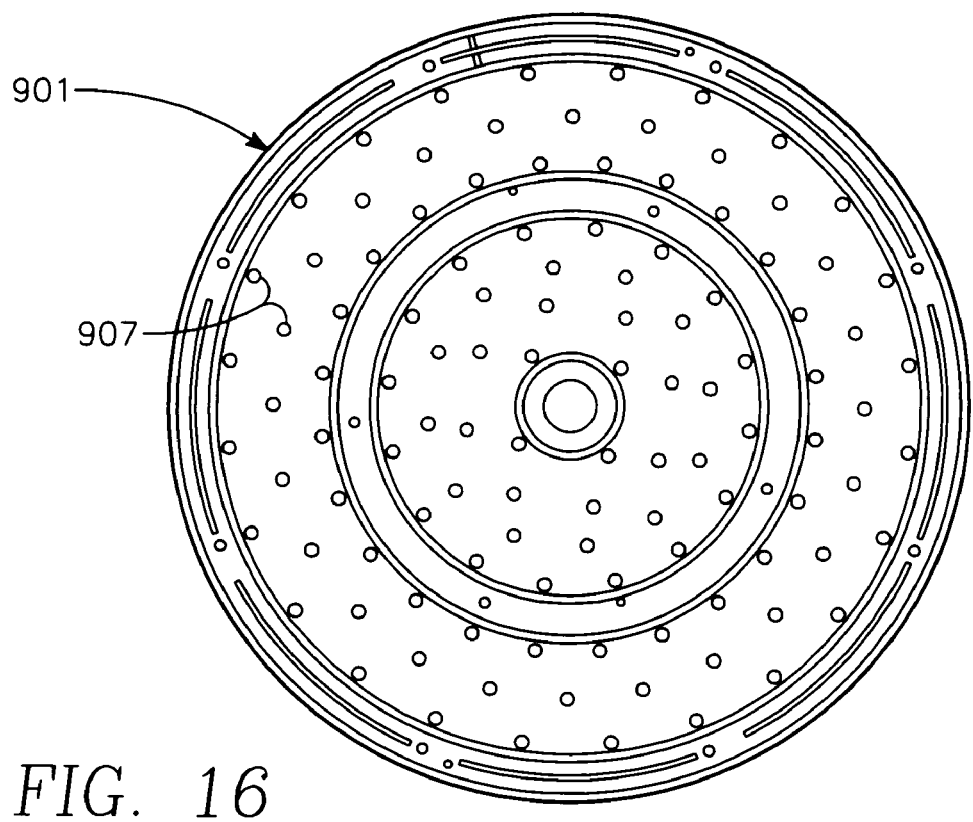
FIG. 16 is a plan view of a base of the ceiling electrode of FIG. 15.
Figure 17:
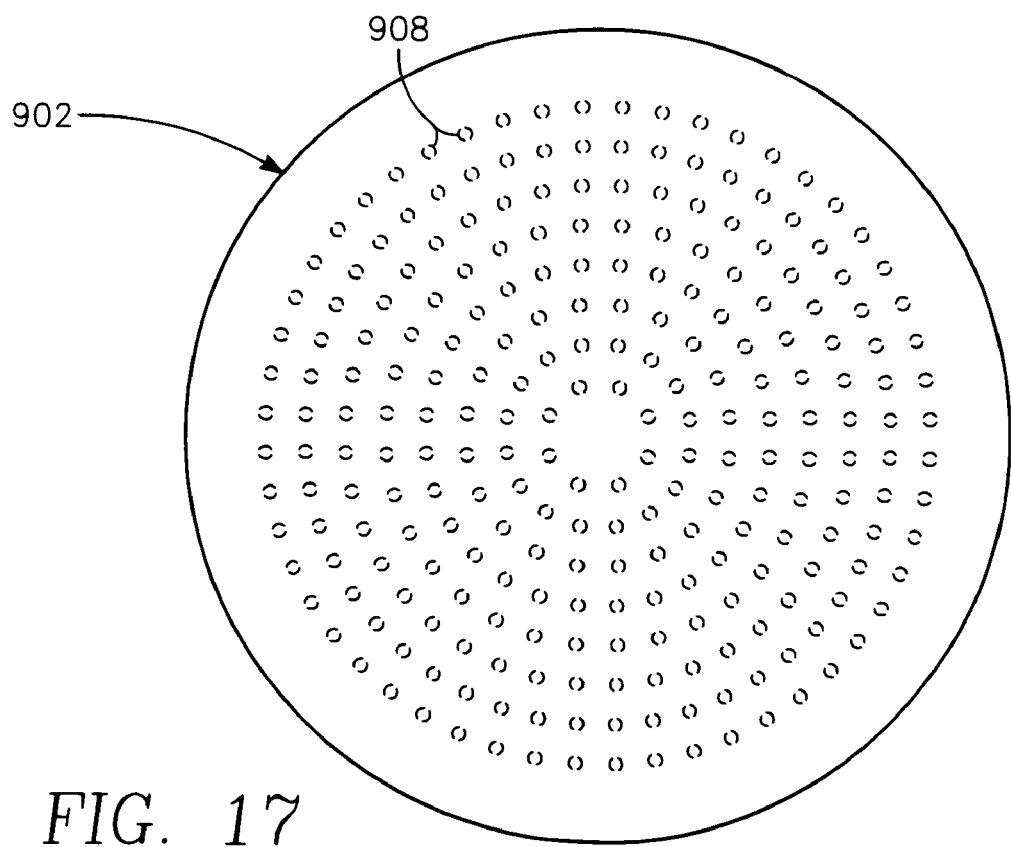
FIG. 17 is a plan view of the protective semiconductor layer of the ceiling electrode of FIG. 15.
Figure 18:
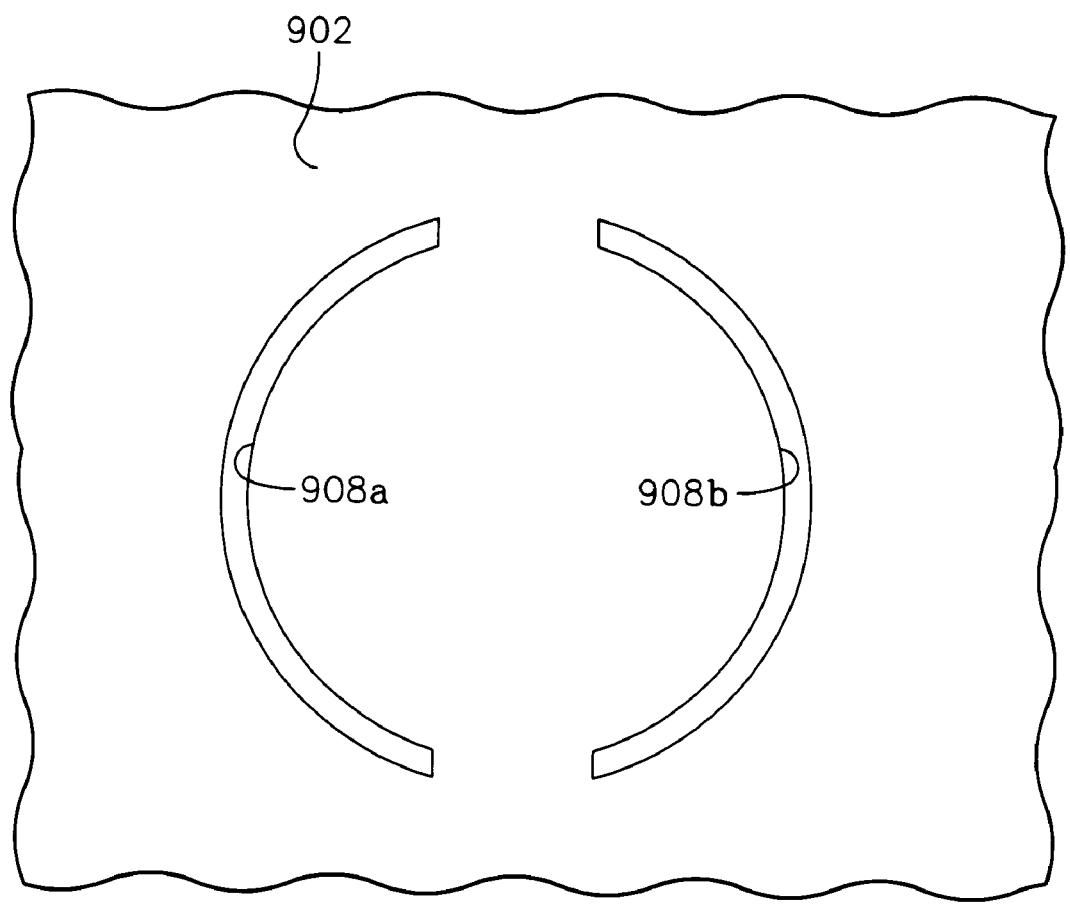
FIG. 18 is an enlarged plan view of a portion of the ceiling electrode of FIG. 15 showing the arcuate slots serving as gas distribution passages within the ceiling electrode.

FIG. 16 is a plan view of the metallic base 901, showing the placement of an array of holes 907, each hole 907 extending axially through the base 901. FIG. 17 is a plan view of the semiconductor protective layer or showerhead 902, showing the placement of an array of pairs of arcuate slots 908 extending axial through the showerhead. As illustrated in the enlarged views of FIG. 18, each pair of arcuate slots 908 can be in opposing "C" shapes 908*a*, 908*b*, forming nearly semi-circular sections of a circular annulus, although other suitable shapes may be employed instead.

Figure 19:
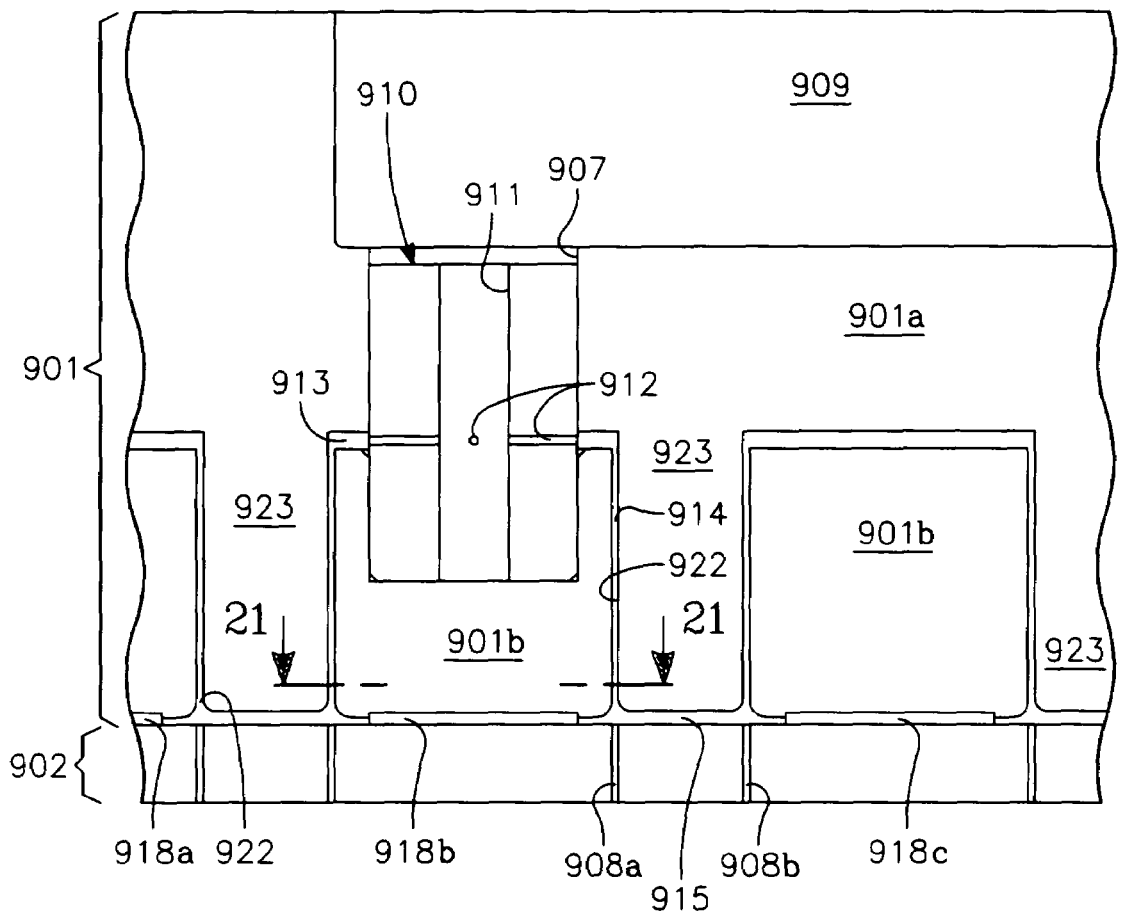
FIG. 19 is an enlarged cut-away side view of a portion of the ceiling electrode of FIG. 15.

Referring to the enlarged view of FIG. 19, the metal electrode base 901 is formed of two separate pieces, namely an upper plate 901*a* having plural downwardly extending cylindrical posts 923, and a lower plate 901*b* having plural cylindrical holes 922 in which the posts 923 nest to form annular gas passageways 914. Plural gas distribution manifolds 909 (one of which is shown in the enlarged view of FIG. 19) are formed as voids in the top of the base 901. The holes 907 extend from the bottom of respective ones of the manifolds 909 completely through the upper plate 901a and partially through the lower plate 901b. A plug 910 is press fit within each hole 907 so as to contact both the upper and lower plates 901a, 901b. The plurality of pressed plugs 910 hold the upper and lower plates 901a, 901b together. Each pressed plug 910 has a central axial aperture 911 open to the manifold 909 and four radial orifices 912 extending from the axial aperture 911 to a radial void 913 in the upper base plate 901a. The void 913 opens into the annular passages 914 in the base 901 that run to the bottom surface of the base 901. The annular passages 914 are in general alignment with the arcuate slots 908 in the semiconductor protective layer 902. Each vertical passage 914 is a circular (annular) arcuate slot co-axial with the axis of symmetry of the corresponding pair of opposing "C" shaped slots 908 in the protective layer 902. Gas flows downward from the manifold 909 through the axial plug aperture 911, and radially outwardly through the orifices 912, and thence downwardly through the annular vertical passages 914 and radially through radial slots 915 between the base 901 and the protective layer 902, and through the arcuate slots 908 and into the chamber.

The slotted passages 908, 914 provide high gas conductance in proportion to the azimuthal length of the slot, but drop the electric field within the slot at a rate which is an inverse function of the width of the slot 908 and annulus 914. The result is that there is almost no pressure difference through the passages 908, 914, i.e., from the bottom surface of the protective layer 902 up to the radial void 913. At the same time, the slots 908, 914 are sufficiently narrow (e.g., on the order of about 0.012 inch) so that the electric field drops by at least nearly half its peak magnitude (preferably more) within the distance between the bottom surface of the protective layer 902 and the radial void 913.

The orifices 912 are cylindrical and have a sufficiently small diameter (e.g., on the order of about 0.010 inch) radius so that nearly all of the pressure difference between the high pressure of the gas manifold 909 and the vacuum pressure of the chamber below the ceiling electrode 900 is dropped across the length of each orifice 912. For example, the pressure may drop by a factor of 10 across the length of each orifice 912. As will be explained below in greater detail, the result is that the highest voltage drop (electric field) occurs in the region of lowest pressure (i.e., along the axial length of the slots 908, 914) while the entire pressure drop occurs in the region of minimum electric field (i.e., within the radial orifices 912). This feature renders the ceiling electrode 900 almost impervious to arcing, as will also be explained in greater detail below.

Figure 20:
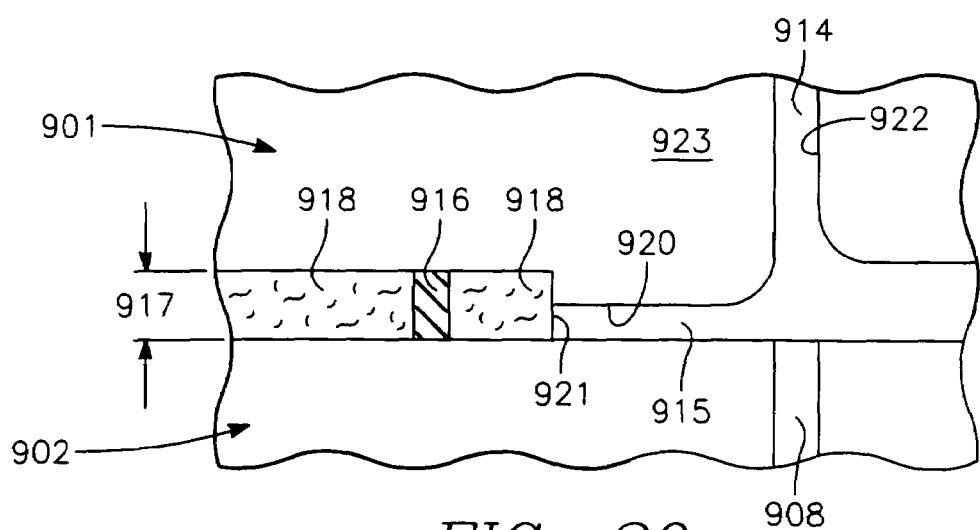
FIG. 20 is an enlargement of the view of FIG. 19.

Referring to FIG. 20, a plurality of spacers or posts 916 between the base 901 and protective layer 902 fix the width of a gap 917 in which a bonding adhesive 918 is placed to fasten the protective layer 902 to the base 901. The width of the gap 917 is sufficient to ensure an optimum bond. This width is relatively large and therefore exposes a significant area of the bonding adhesive layer 918 to the process gases in the radial passages 915, which promotes contamination by outgassing from the bonding adhesive layer 918. This problem is solved without requiring any reduction in the width of the gap 917. Instead, the adhesive layer 918 is divided into plural spaced-apart zones or islands 918a, 918b, 918c, etc., shown in FIG. 19, each island being surrounded by an axially extending lip 920 covering about half (if not all) of the otherwise exposed vertical face 921 of each bonding adhesive island 918a, 918b, 918c, etc. Each lip 920 either covers the entirety of the vertical face 921 of each bonding adhesive layer zone or leaves only a small portion of it exposed to the process gases in the radial passage 915. The lip 920 reduces the width of the radial passage 915 to less than the width of the gap 917. By reducing (or eliminating) the surface area of the bonding adhesive islands 918a, 918b, 918c exposed to the process gases, each lip 920 reduces (or eliminates) contamination in the chamber from outgassing from the adhesive bonding material. Each lip 920 may either extend downwardly from the metal base 901—i.e., from the plug 923 of the base 901 (and therefore be formed integrally with the plug 923) or extend upwardly from the protective layer 902. In the drawing of FIG. 20, the lip 920 extends downwardly from the plug 923 and is integrally formed with the plug 923.

In order to further reduce contamination from the adhesive bonding layer 918, an ultra high-grade bonding adhesive material is employed in the layer 918 that has only a minimal tendency to outgas. The preferred bonding material for the adhesive layer 918 is Dow Corning space grade low volatility adhesive 93–500 manufactured by Dow Corning Corporation.

Figure 21:
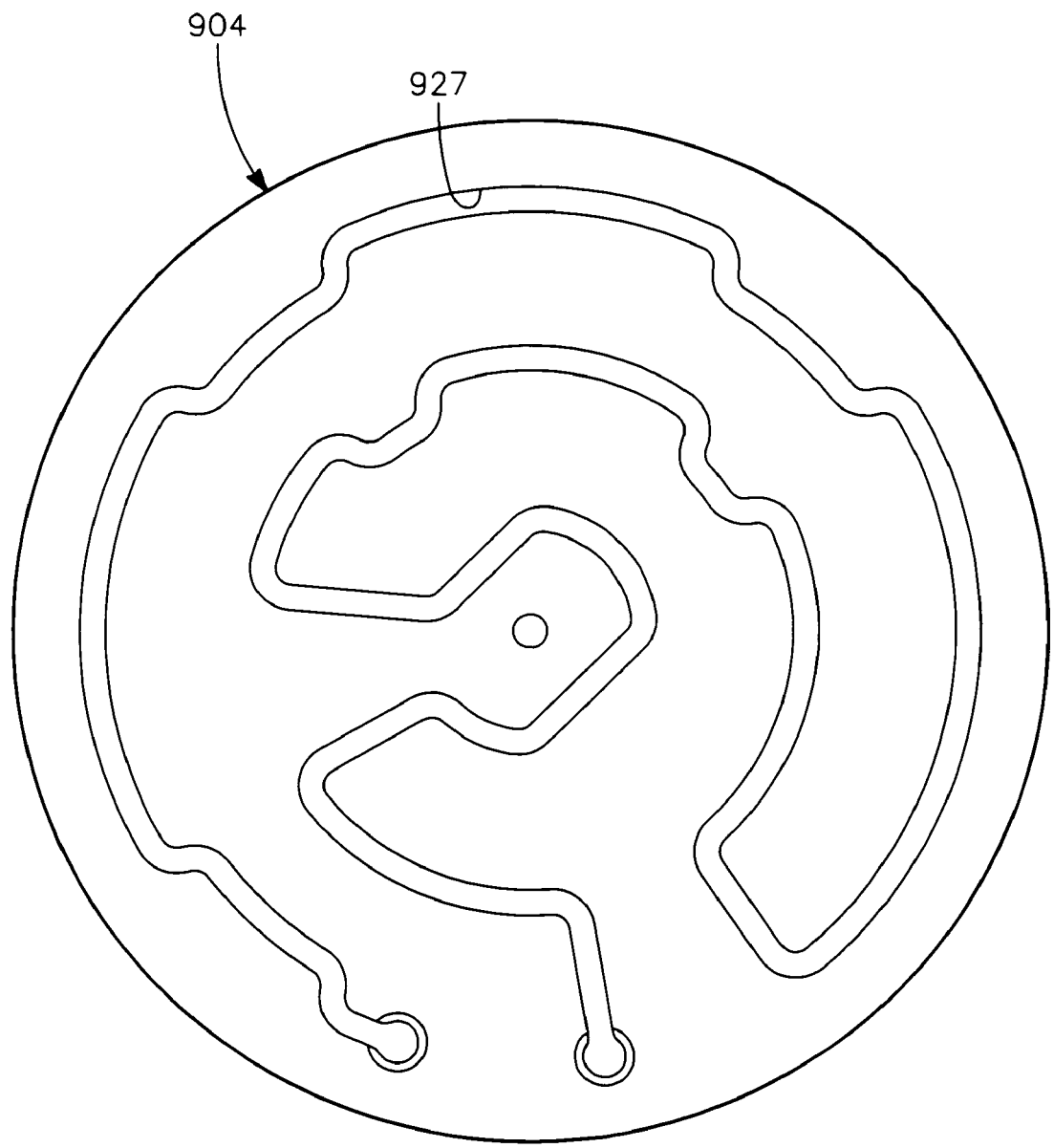
FIG. 21 is a plan view of a cooling plate of the ceiling electrode of FIG. 15.
Figure 22:
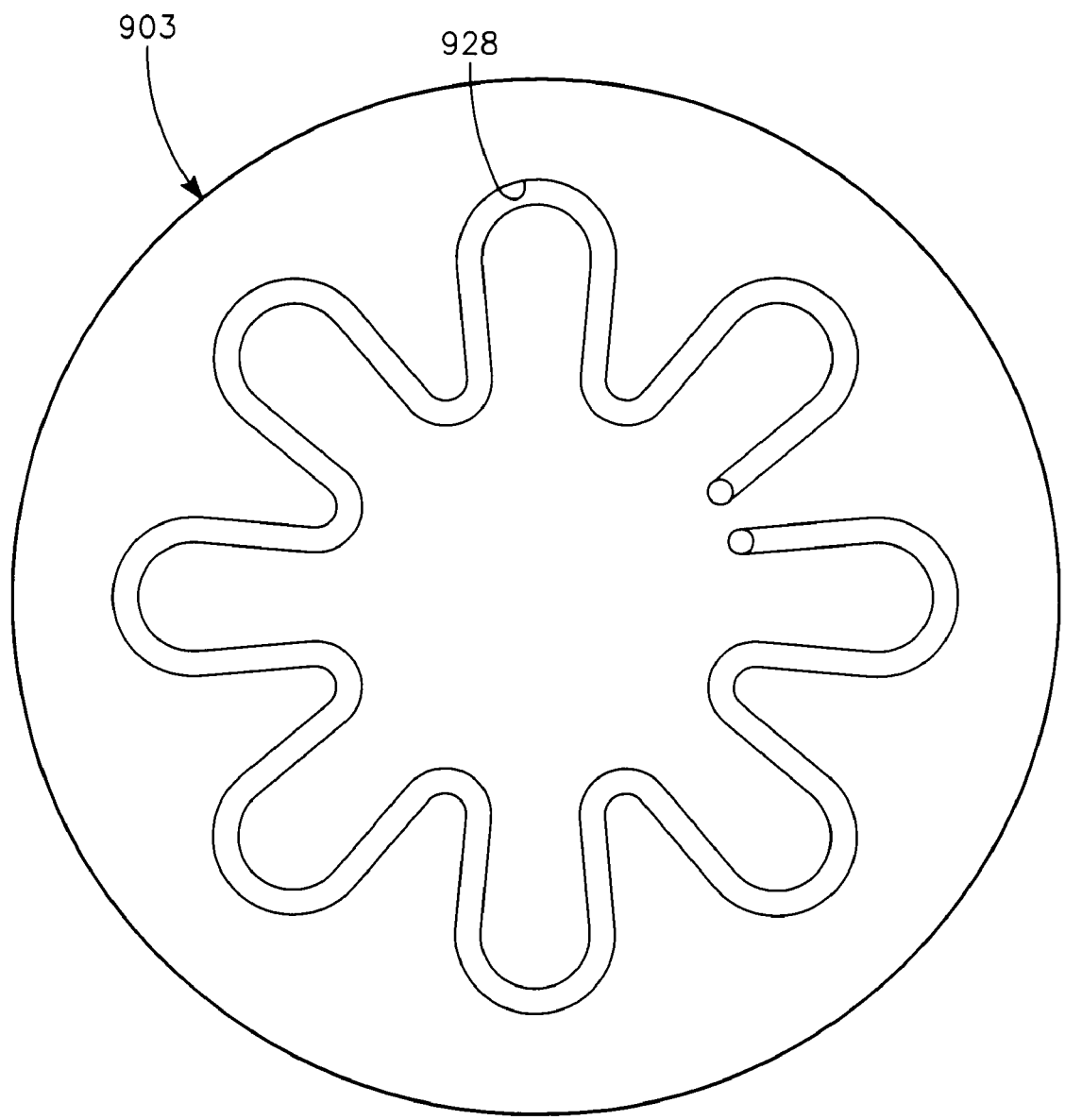
FIG. 22 is a plan view of a heating plate of the ceiling electrode of FIG. 15.

FIG. 21 is a plan view of the cooling plate 904, showing the coolant fluid jacket 927 in which a coolant fluid circulates. FIG. 22 is a plan view of the heating plate 903, showing the heating fluid jacket 928 in which a heating fluid circulates.

Figure 23:
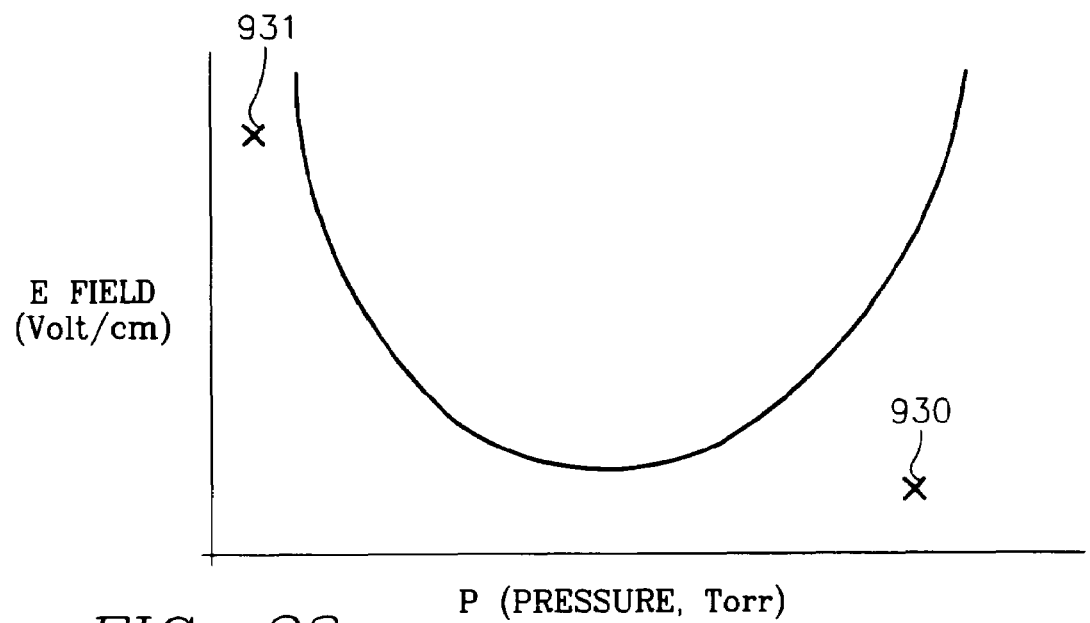
FIG. 23 is a graph including a curve depicting the threshold combination of electric field strengths and pressure levels that permit arcing of process gases in the internal gas passages of the ceiling electrode of FIG. 15.
Figure 24:
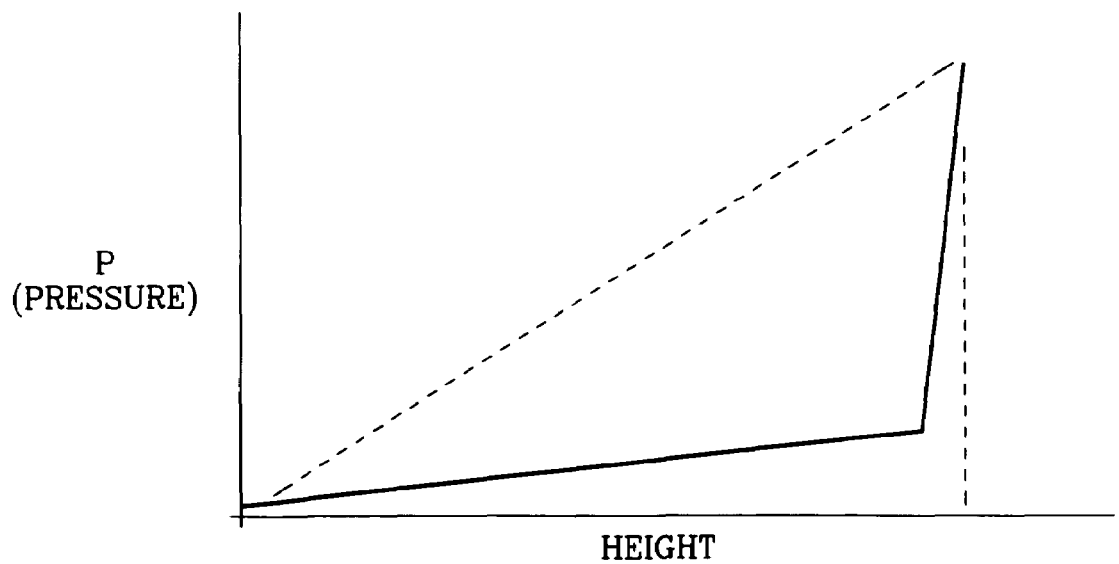
FIG. 24 illustrates the pressure drop as a function of axial height within the arcuate slots or gas passages of the ceiling electrode of FIG. 15.
Figure 25:
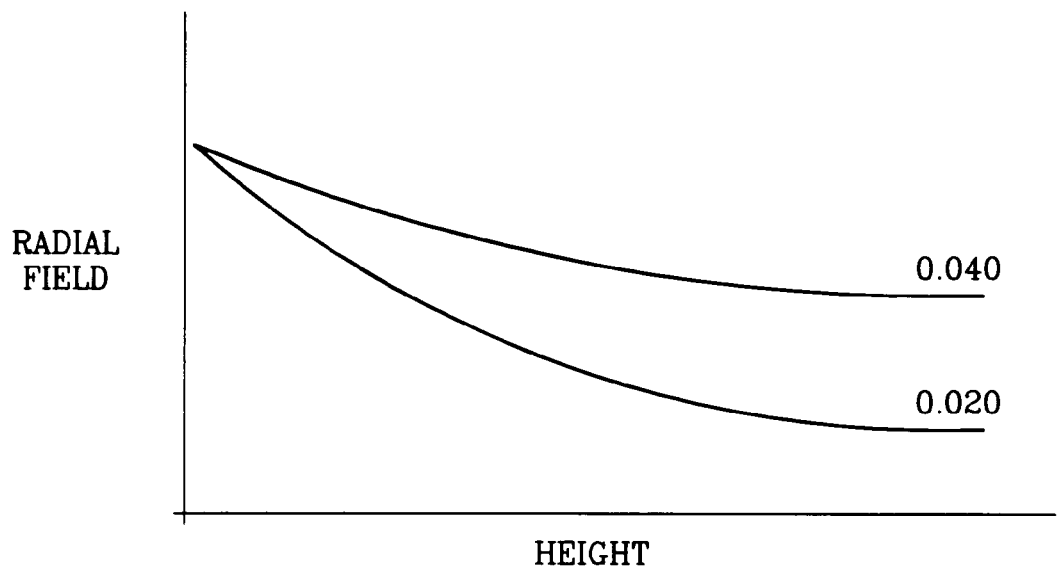
FIG. 25 illustrates the electric field distribution as a function of axial height within the arcuate slots or gas passages of the ceiling electrode of FIG. 15.

FIGS. 23, 24 and 25 are graphs illustrating how the shapes of the gas passages and orifices in the ceiling electrode of FIGS. 15–19 can be selected to prevent arcing within the ceiling electrode. FIG. 23 represents the Paschen curve for the process gas injected by the ceiling electrode into the chamber, in which the vertical axis corresponds to the electric field while the horizontal axis corresponds to the gas pressure. The region above the curve in FIG. 23 represents the locations in field strength-pressure space at which arcing or electrical discharge in the gas occurs. Below the curve of FIG. 23, arcing does not occur, and one goal is to keep the combination of pressure and electric field strength below the curve of FIG. 23 at all points along the axis (height) of the ceiling electrode. FIG. 24 illustrates the gas pressure as a function of height along an axial gas passage in the ceiling electrode. The dotted line in FIG. 24 corresponds to a small cylindrical-shaped gas passage while the nearly horizontal section of the solid line in FIG. 24 corresponds to the slotted gas passages 908, 914 in the ceiling electrode of FIGS. 15–19. The nearly vertical portion of the solid line of FIG. 23 corresponds to the pressure distribution in the small radial holes 912 of the press-fit plug 910. FIG. 25 illustrates the electrical field distribution in the slotted gas distribution passages 908, 914 as a function of height. The curves in FIG. 25 labeled "0.020" and "0.040" correspond to slot widths (gaps) of 0.020 and 0.040 inches, respectively. As applied to the arcuate slotted gas passages 908, 914 of FIG. 19, the term "width" refers to the smaller dimension of the slot, while the term "length" refers to the larger dimension of the slot. Generally, in FIG. 19, the length is nearly an order of magnitude (or more) greater than the width.

FIG. 25 shows that the electric field in the slotted gas passages decreases with height at a rate determined by the slot width. A relatively narrow slot width (e.g., 0.010 inch) is therefore employed to minimize the electric field strength at the top of the gas passages 914, by increasing the electric field drop along the combined length of the gas passages 908, 914. For example, the electric field at the top of the gas passages 914 may be one tenth (or less) of the electric field at the bottom surface of the protective layer 902. The electric field drop along the combined length of the gas passages 908, 914 is most (e.g., 80% or nearly all) of the electric field drop across the combined thickness of the base 901 and protective layer 902. The axial location of the radial orifices 912 is sufficiently high so that they are located in the region of minimum electric field in the electric distribution of FIG. 25. The diameter of each of the radial orifices 912 is sufficiently small (e.g., 0.010 inch) to achieve the very high pressure drop across each radial orifice 912 represented by the steep portion of the curve of FIG. 24, near the top of the gas passage height. The pressure drop along the length of each radial orifice 912 represents most (e.g., 80% or nearly all) of the pressure drop across the combined thickness of the base 901 and protective layer 902. The radial direction of each orifice 912 makes it orthogonal to the electric field across the axial thickness of the electrode, so that there is minimal electric field drop along the length of each orifice 912. As a result, within the radial orifices 912 (located at the maximum height), the pressure is very high (at least near the radially inner portion of each orifice 912) while the electric field is minimum (or zero) depending upon the narrowness of the slotted gas passages 908, 914. This combination of high pressure and low electric field strength corresponds to the location 930 in FIG. 23, which is well below the arcing threshold. Within the axial arcuate slots 908, 914, the pressure is very low (shallow portion of the curve of FIG. 24), while the electric field approaches its maximum value near the bottom (peak of the curve of FIG. 25). Thus, in the axial gas passages 908, 914, the electric field is high but the pressure is very low, corresponding to the location 931 of FIG. 23, which is also well-below the arcing threshold. To achieve this result, the slot length of the gas passages 908, 914 must be sufficiently large to minimize the pressure drop along the combined length of the gas passages 908, 914 to a small fraction of the pressure drop between the top and bottom of the electrode 900. The result is that nearly all the pressure drop appears along the length of each radial orifice 912, as discussed above. The slot length (e.g., the arc length) may be on the order of 0.070 inch while the slot width may be on the order of about 0.010 inch.

Figure 26:
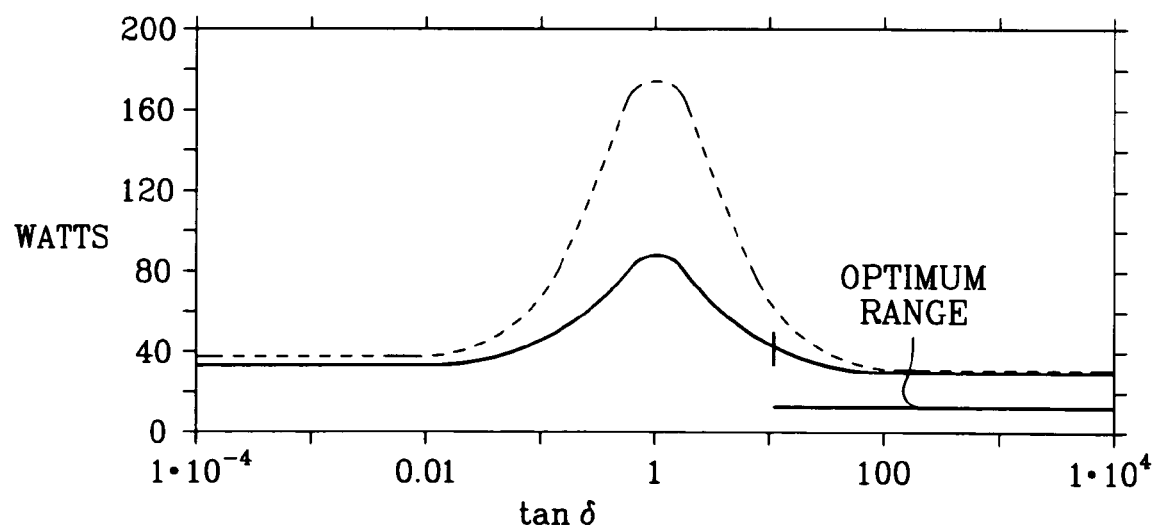
FIG. 26 is a graph depicting the RF power losses in the protective semiconductor layer of the ceiling electrode of FIG. 15 as a function of the loss tangent of the semiconductor layer for different thickness of the layer.

How to render RF losses in the protective layer 902 nearly invariant under various changing process conditions (temperature, layer thickness, impurity content) will now be described. FIG. 26 is a graph illustrating the loss of RF source power in a silicon carbide version of the protective layer 902 as a function of the loss tangent of the silicon carbide material at a particular temperature (e.g., the operating temperature of 90 degrees C.) at a particular RF source power frequency (i.e., at or near the plasma-electrode resonance frequency of, for example 162 MHz, or 210 MHz). The loss tangent is the ratio between the real and imaginary component of the complex dielectric constant of the material and determines the amount of RF power that the material absorbs. The loss tangent is the conductivity of the material divided by the product of the real dielectric constant of the material and the RF frequency. The loss tangent may be adjusted by changing the concentration of a dopant impurity in the semiconductor material. The behavior of a semiconductor material such as silicon carbide that is illustrated in FIG. 26 is readily deduced by measuring the loss tangent of silicon carbide layers of various dopant impurity concentrations (and therefore different loss tangents) and measuring the RF power absorbed in each of them. Such measurements are readily conducted by the skilled worker in accordance with principles set forth in: King, *Transmission Line Theory*, McGraw-Hill, 1955, page 8 and pages 285–286. The graph of FIG. 27 shows that the RF loss or absorption in the silicon carbide layer 902 peaks at a loss tangent of 1 and falls off from this peak with either an increase or a decrease in the loss tangent.

The loss tangent of dielectric materials generally increases with temperature, so that temperature variations will cause variations in RF power absorption. Near the peak RF loss at a loss tangent of 1, RF power losses vary dramatically with only small variations in loss tangent. If the thickness of the protective layer 902 is increased, the variance of RF losses with changes in loss tangent become even more pronounced. This is illustrated by comparison of the solid line curve of FIG. 26, representing the behavior of a thin layer, with the dashed line curve of FIG. 26, representing a thicker layer. Thus, near the peak of either curve of FIG. 26 (i.e., at a loss tangent of 1), RF power losses vary greatly with only small changes in either temperature or layer thickness. Away from the peak (i.e., at a loss tangent value greater than 10 or less than 0.1), the dashed line curve nearly merges with the solid line curve, so that differences in layer thickness cause almost imperceptible changes in RF power loss. Moreover, RF power loss is nearly constant over a wide range of loss tangent values if the loss tangent is above 10 or below 0.1, so that temperature variations corresponding to these ranges of loss tangent values cause almost imperceptible changes in RF power losses. Therefore, RF power losses in the protective layer 902 are rendered almost invariant over changes in temperature, layer thickness and impurity concentration by doping the material to a loss tangent either greater than 10 or less than 0.1 at operating temperature. In one embodiment, the loss tangent is selected to be above 10 at operating temperature to save cost, since a loss tangent of 0.1 or less requires nearly intrinsic semiconductor material which is relatively expensive. The selection of a loss tangent value above 10 permits a temperature excursion corresponding to loss tangent values from about 10 and higher with little or no measurable variation in RF losses in the semiconductor layer. The design tolerance for both temperature control and layer thickness and dopant concentration is very wide, corresponding to a range of loss tangent values extending from 10 to a very high value (as indicated by the bar labeled "optimum range" in FIG. 26. This selection reduces (nearly minimizes) the derivative of the RF power absorption (vertical axis of FIG. 26) with respect to the loss tangent. As will be seen below, the result of such a selection is to reduce (nearly minimize) the derivatives of the RF power absorption with respect to temperature, thickness and impurity concentration.

Figure 27:
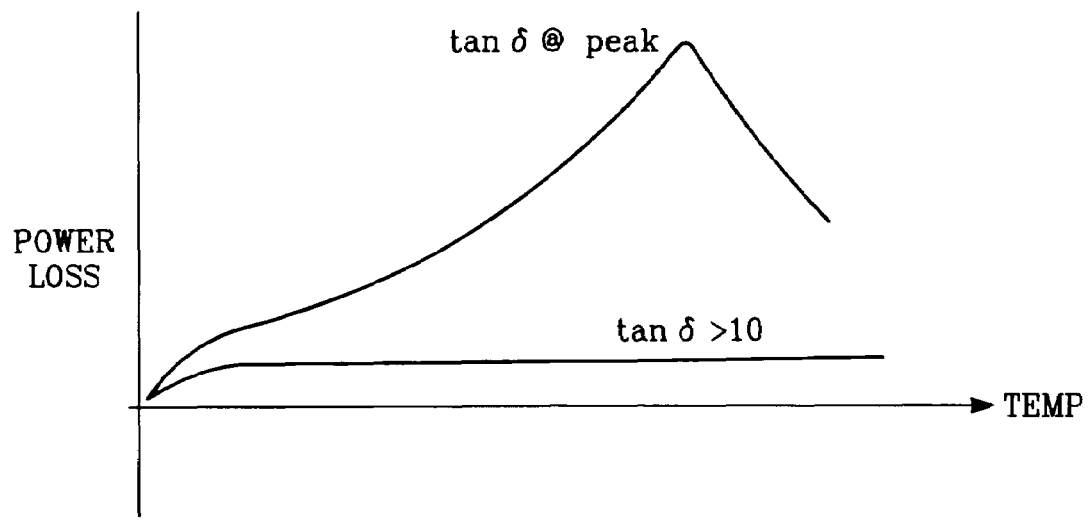
FIG. 27 is a graph depicting the variation of RF power losses in the protective semiconductor layer with variations in temperature for different values of the loss tangent of the semiconductor layer.
Figure 28:
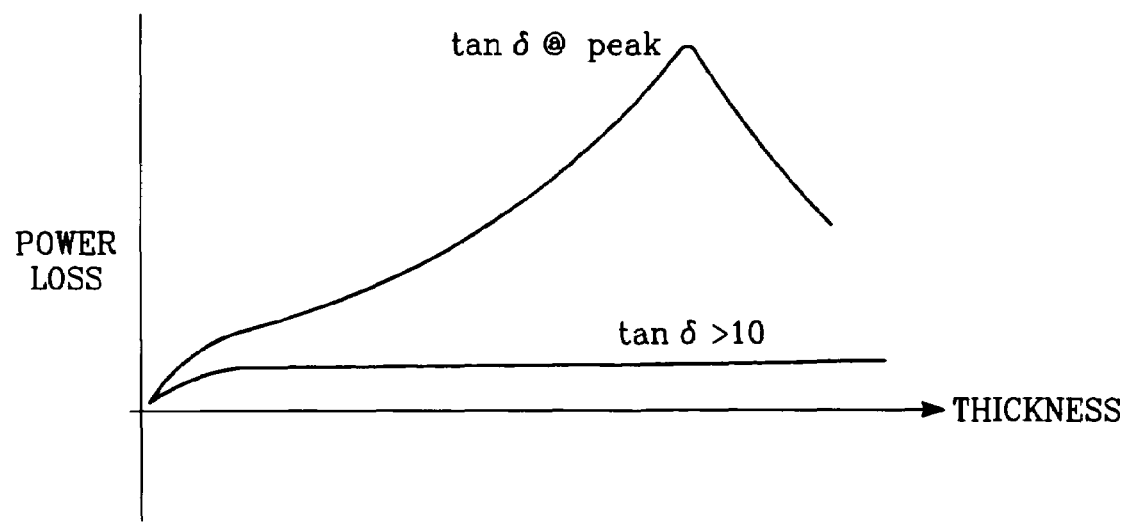
FIG. 28 is a graph depicting the variation of RF power losses in the protective semiconductor layer with variations in thickness of the layer for different values of the loss tangent of the semiconductor layer.

FIG. 27 illustrates how the power loss (vertical axis) varies with changes in temperature for different loss tangent values. One curve in FIG. 28, labeled "tan delta δ peak" corresponds to a loss tangent value of 1 in FIG. 26, and indicates a very large change in RF power loss over a given temperature range. Another curve in FIG. 27, labeled "tan delta δ 10" corresponds to a loss tangent value in excess of 10, and indicates a very small or zero change in RF power loss over the same temperature range. FIG. 28 illustrates how the power loss (vertical axis) varies with changes in layer thickness (of the protective layer 902) over a range of thicknesses. One curve of FIG. 28 labeled "tan delta δ peak" corresponds to a loss tangent value of 1 in FIG. 26, and indicates a very large change in RF power loss over a given thickness range. Another curve in FIG. 28, labeled "tan delta δ 10" corresponds to a loss tangent value in excess of 10, and indicates a very small or zero change in RF power loss over the same thickness range. FIGS. 27 and 28 therefore show the consequences of the behavior illustrated in FIG. 26 and how the correct choice of loss tangent range in accordance with the reactor widens the design window for both temperature control and layer thickness.

In general, therefore, the procedure is to select a semiconductor (or other process-compatible) material for the protective layer 902 and then determine how RF losses at the chosen RF source power frequency behave over a range of loss tangent values of the material. In particular, the loss tangent value corresponding to the maximum RF loss in the material is found. This can be done analytically or by performing a succession of RF loss measurements with different samples of the same material having different impurity concentrations. Once the loss tangent value of peak RF loss is found, a loss tangent value which is an order of magnitude greater (or less) than the loss tangent value at the peak loss is selected. The material is then doped to an impurity concentration level that yields the chosen loss tangent value in the material, and then used to form the protective layer 902. The temperature of the ceiling electrode is controlled to maintain the loss tangent value that is at least an order of magnitude greater (or less) than the loss tangent value of peak RF absorption. In silicon carbide, this temperature range for a loss tangent value of 10 or greater extends from room temperature to over 250 degrees C.

Figure 29:
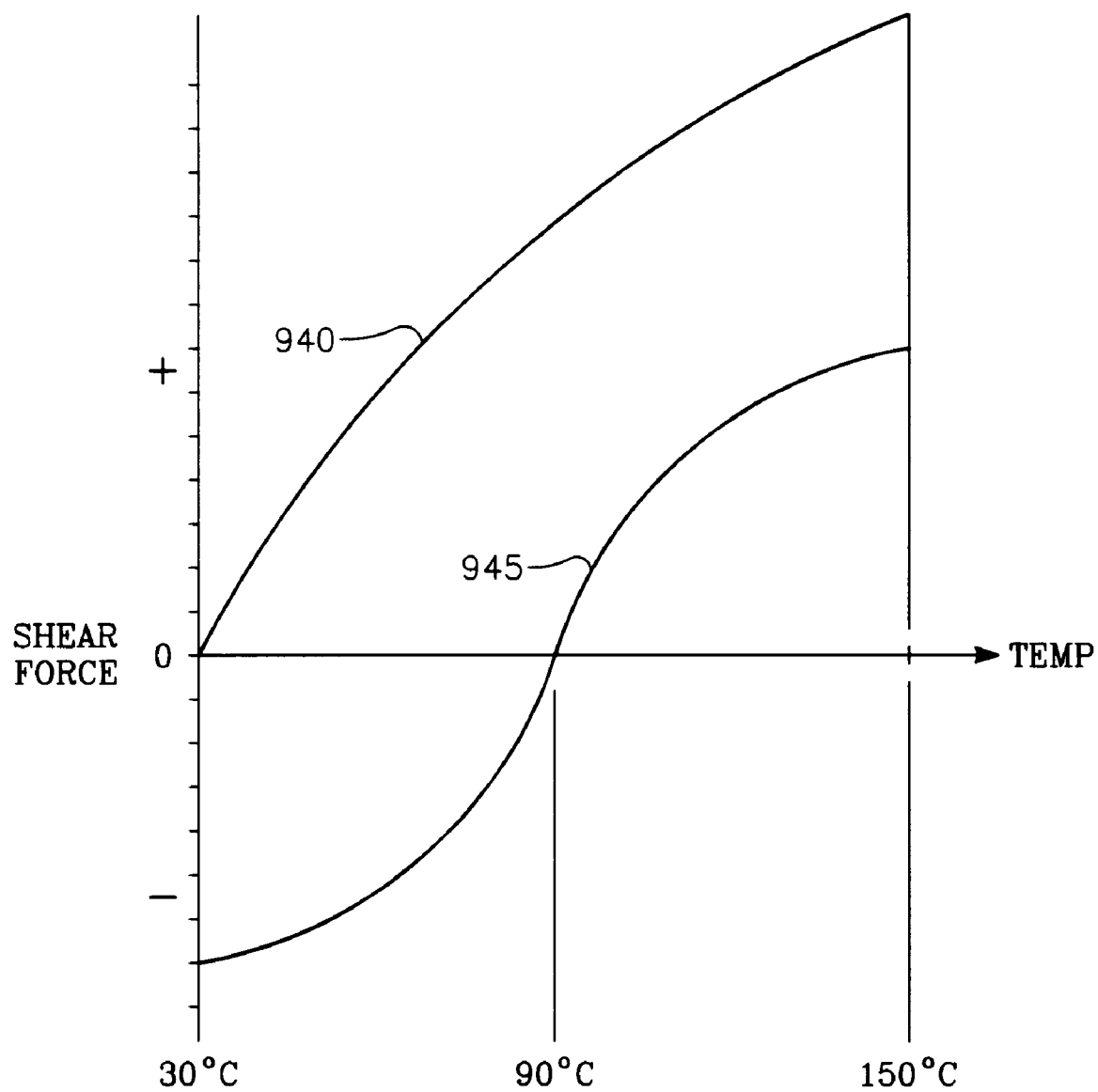
FIG. 29 is a graph depicting the shear force direction and magnitude across the bonding layer between the electrode base and the protective semiconductor layer as a function of temperature for bonding layers cured at different temperatures.

As described above with reference to FIG. 20, the feature of each lip 920 covering the exposed vertical face 921 of a respective adhesive bonding island 918 permits the thickness of the adhesive bonding layer 918 to be quite large for a bond of maximum strength without a concomitant increase in contamination from the bonding adhesive material. However, regardless of the thickness of the bonding adhesive layer 918, we have found that the temperature excursions encountered by the ceiling electrode 900 during ordinary use and particularly during cleaning cause the assembly 900 to shatter due to shear forces arising from the difference in thermal coefficients of expansion of the metal base 901 and the protective layer 902. Such temperature excursions are illustrated by the curve labeled 940 in the graph of FIG. 29. Assuming the adhesive bonding layer 918 is cured at a temperature of about 30 degrees C., the ceiling electrode temperature is raised during plasma processing to about 90 degrees C. This increase in temperature causes the metal base 901 and the protective layer 902 to expand at different rates in accordance with their respective coefficients of thermal expansion. This produces a shear force (vertical axis of FIG. 29) which increases with the temperature of the ceiling electrode 900 until it reaches the operating temperature at 90 degrees C. The problem is exacerbated when a bakeout process of the reactor is performed that requires the ceiling electrode 900 to be heated well above the operating temperature, e.g., to a bakeout temperature of about 150 degrees C. As shown in the FIG. 29, the shear force across the ceiling electrode nearly doubles when the temperature is increased from the operating temperature to the bakeout temperature. It is during this latter temperature excursion (when the shear force is nearly doubled) that the ceiling electrode 900 tends to shatter.

This problem is solved by curing the adhesive bonding layer 918 at an elevated temperature, preferably about halfway between the maximum and minimum temperature extremes to which the ceiling electrode is to be subjected. In the case illustrated in FIG. 29, the bonding adhesive layer is cured at an elevated temperature near the operating temperature of 90 degrees C. As illustrated by the curve labeled 945 in FIG. 29, by curing the adhesive bonding layer 918 at an intermediate temperature, the maximum shear forces experienced by the ceiling electrode 900 are reduced by about a factor of two, i.e., to a negative shear force at room temperature or a positive shear force at the bakeout temperature, both of which are about the same but in opposing directions, and both of which are not more than about half the maximum shear force generated in the case of the curve labeled 940 in which the bonding adhesive is cured at a lower temperature.

The method of curing the adhesive bonding layer 918 at such an intermediate temperature not only solves the problem of shattering, but also enables another method of the reactor to carried out which prevents or reduces contamination by outgassing from the adhesive bonding layer 918. In accordance with this latter method, after the adhesive bonding layer 918 has been cured and cooled but before the ceiling electrode 900 is used in plasma processing, it is heated to the highest possible temperature (e.g., the bakeout temperature of 150 degrees C.) for a sufficiently long time to at least nearly boil out or vaporize all high-volatility products from the adhesive bonding layer 918. In one embodiment of this vaporization method, the ceiling electrode was held at 150 degrees C. for at least 8 hours before it was used in the plasma processing of production wafers. This bakeout process is performed only once during the life of the ceiling electrode, so that the adhesive layer undergoes the maximum stress only once, thus avoiding shear stress fatigue of the adhesive layer over the lifetime of the ceiling electrode.

One feature of the reactor is that its structure renders it amenable to a periodic wet clean procedure that removes all contamination accumulated during many hours of wafer processing. This feature enhances of the lifetime of the ceiling electrode, making it commercially practical in the sense that its lifetime is sufficient to more than recover its cost of manufacture by profitable use. The structural features underlying this feature include the following:

- curing of the adhesive bonding layer at an elevated temperature suitable for a wet cleaning process, so that the wet clean process is carried out under conditions of minimum (or zero) shear stress across the bonding layer;
- the ceramic silicon carbide/aluminum materials constituting the ceiling electrode, which are amenable to immersion in a solvent for removing CF polymers, flushing with alcohol and heating to 110 degrees C.;
- the bulk ceramic silicon carbide layer, which can be immersed in or wiped with an acid (such as HF and/or H2NO3) for removing silicon or silicon dioxide;
- flow-through non-reentrant gas passages extending completely through the ceiling electrode, so that a high pressure gas purge through these passages can ultimately remove all contaminant materials without leaving any trapped residues.

The wet clean process begins with the removal of the ceiling electrode from the plasma reactor chamber and its installation on a fixture to be described below. Then, the entire ceiling electrode is immersed in a solvent such as acetone at room temperature for a sufficient time to remove all fluorocarbon polymers that have accumulated on the ceiling electrode. The next step is the exposure of the ceramic silicon-carbide layer (only) of the ceiling electrode to an acid such as HF or nitric acid or a mixture of both for a sufficient time to remove all silicon dioxide or silicon materials accumulated on the ceiling electrode. This may be carried out by wiping the ceramic layer or by immersing only the ceramic portion of the ceiling electrode in the acid. This step is also carried out at room temperature. The ceiling electrode is purged with nitrogen or dry air at room temperature by pressurizing one side of the ceiling electrode while permitting the gases to escape from the other side of the ceiling electrode. Finally, moisture is removed from the ceiling electrode by heating it to approximately the adhesive layer cure temperature (about 100 degrees) until all moisture has evaporated from the ceiling electrode. This last step produces a minimum amount of shear stress across the adhesive layer, since the temperature (100 degrees C.) is the cure temperature of the adhesive layer at which the shear stress is approximately zero. As a result, the wet clean process imposes only a negligible amount of shear stress on the adhesive layer, and may therefore be repeated many times over the lifetime of the ceiling electrode without appreciably detracting from its lifetime or unduly fatiguing the adhesive layer.

Figure 30:
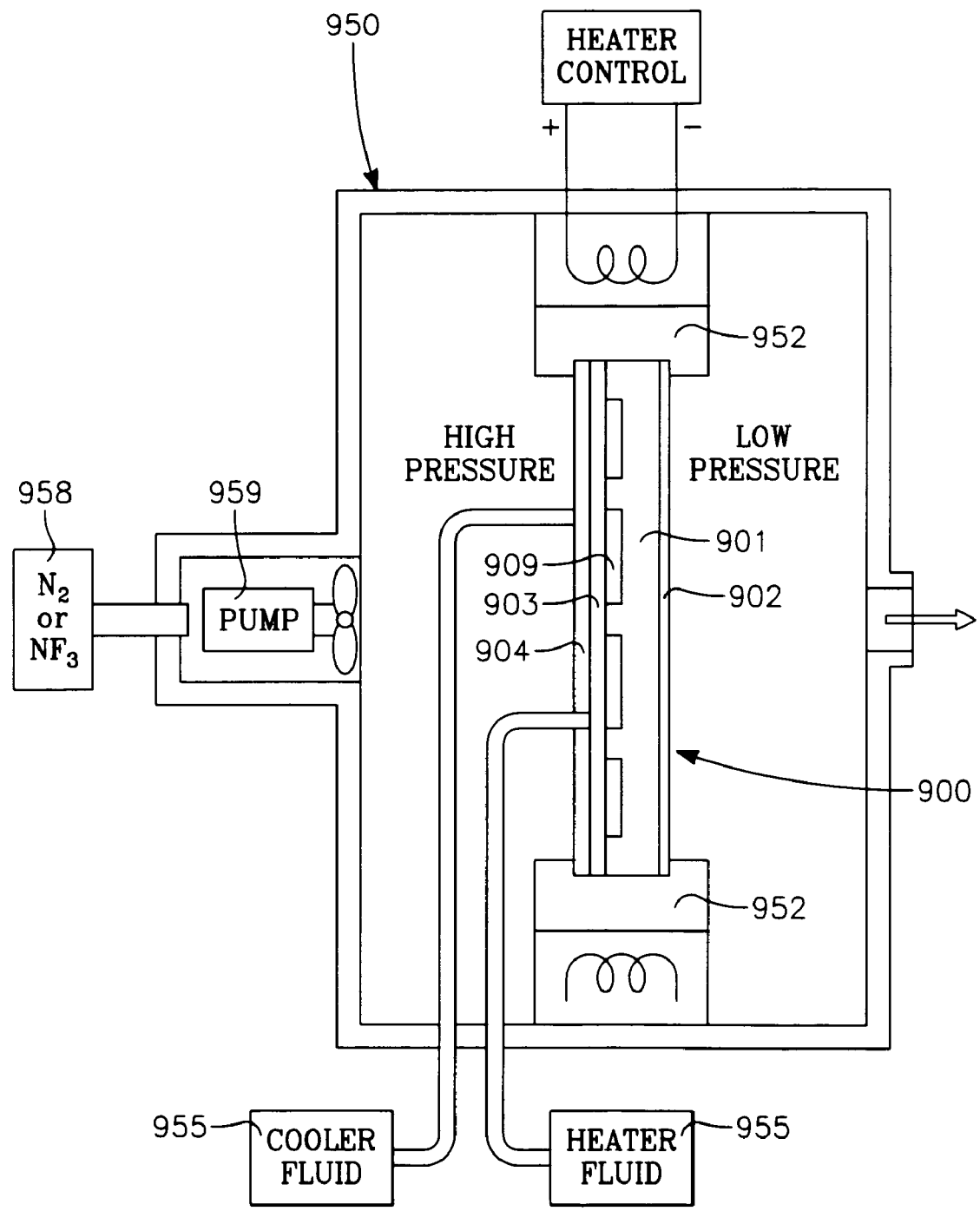
FIG. 30 illustrates apparatus for cleaning and purging the ceiling electrode of FIG. 15.

A fixture for performing either or both the bake out method and the wet cleaning method is illustrated in FIG. 30. A sealed chamber 950 has a ring 952 supported on a side wall 954, the ring 952 is able to receive and fasten the ceiling electrode 900. Heating and (optionally) cooling fluid sources 955, 956 furnish heating and cooling fluids to the heating and chill plates 903, 904 of the ceiling electrode 900, to perform temperature control for maintaining the electrode temperature at about 150 degrees C. A gas supply 958 provides gas to a pump 959 that produces a high gas pressure at the top of the ceiling electrode 900, i.e., in the gas distribution manifolds 909 of the ceiling electrode 900. An exhaust port 960 removes the gases injected through the bottom of the ceiling electrode 900.

Figure 31:
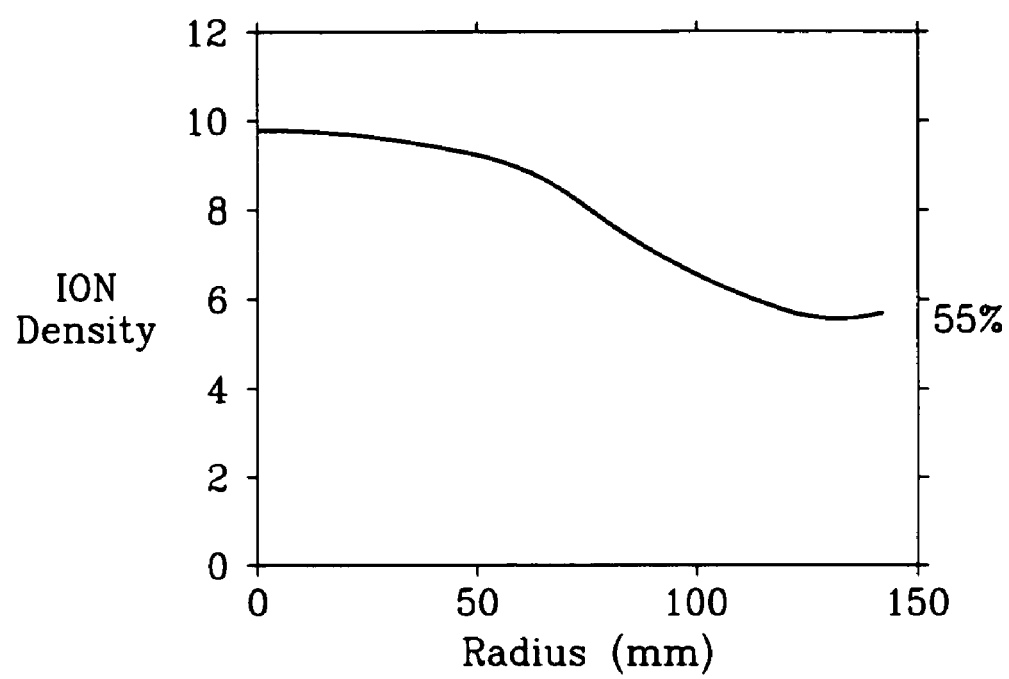
FIG. 31 is a graph illustrating etch rate radial distribution on a semiconductor wafer obtained with an overhead VHF gas distribution electrode of the type disclosed with reference to FIGS. 1–30 having a flat surface.

FIG. 31 illustrates the plasma ion density as a function of radius across the surface of a wafer held on the wafer support pedestal in a reactor of the type disclosed in FIGS. 16 through 20 having a generally flat overhead electrode. The ion density (vertical axis) is plotted using an arbitrary scale factor, and was inferred from the ash rate in an oxidation process. The graph of FIG. 31 shows that the plasma ion density at the edge of the wafer is 55% or less than the ion density at the wafer center.

Figure 34:
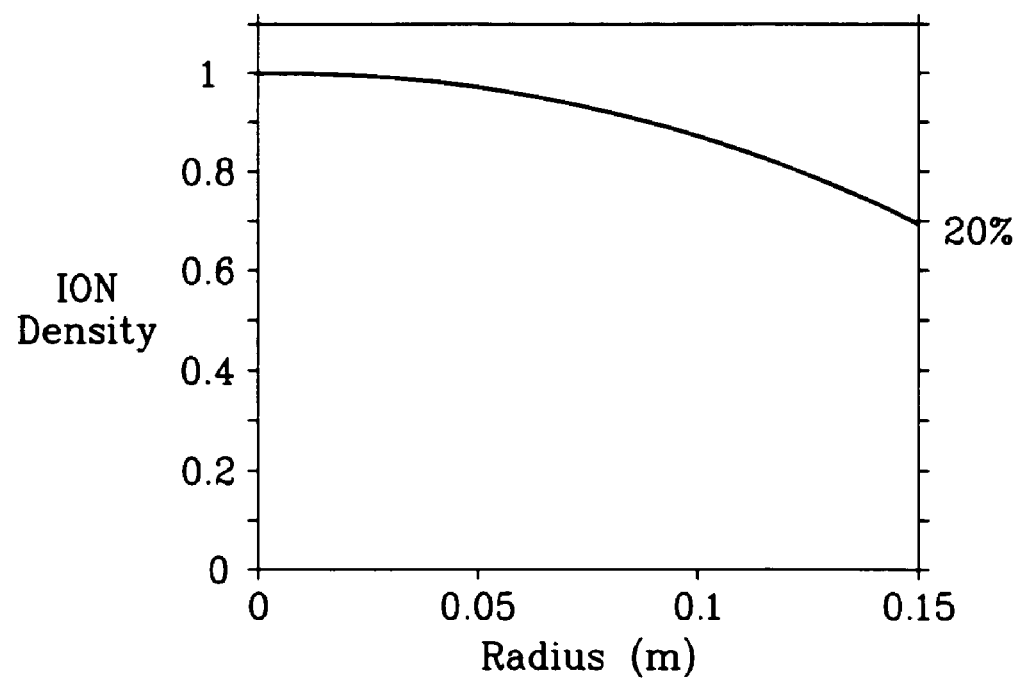
FIG. 34 is a graph illustrating etch rate radial distribution obtained using a shaped electrode of FIG. 32 or 33.
Figure 32:
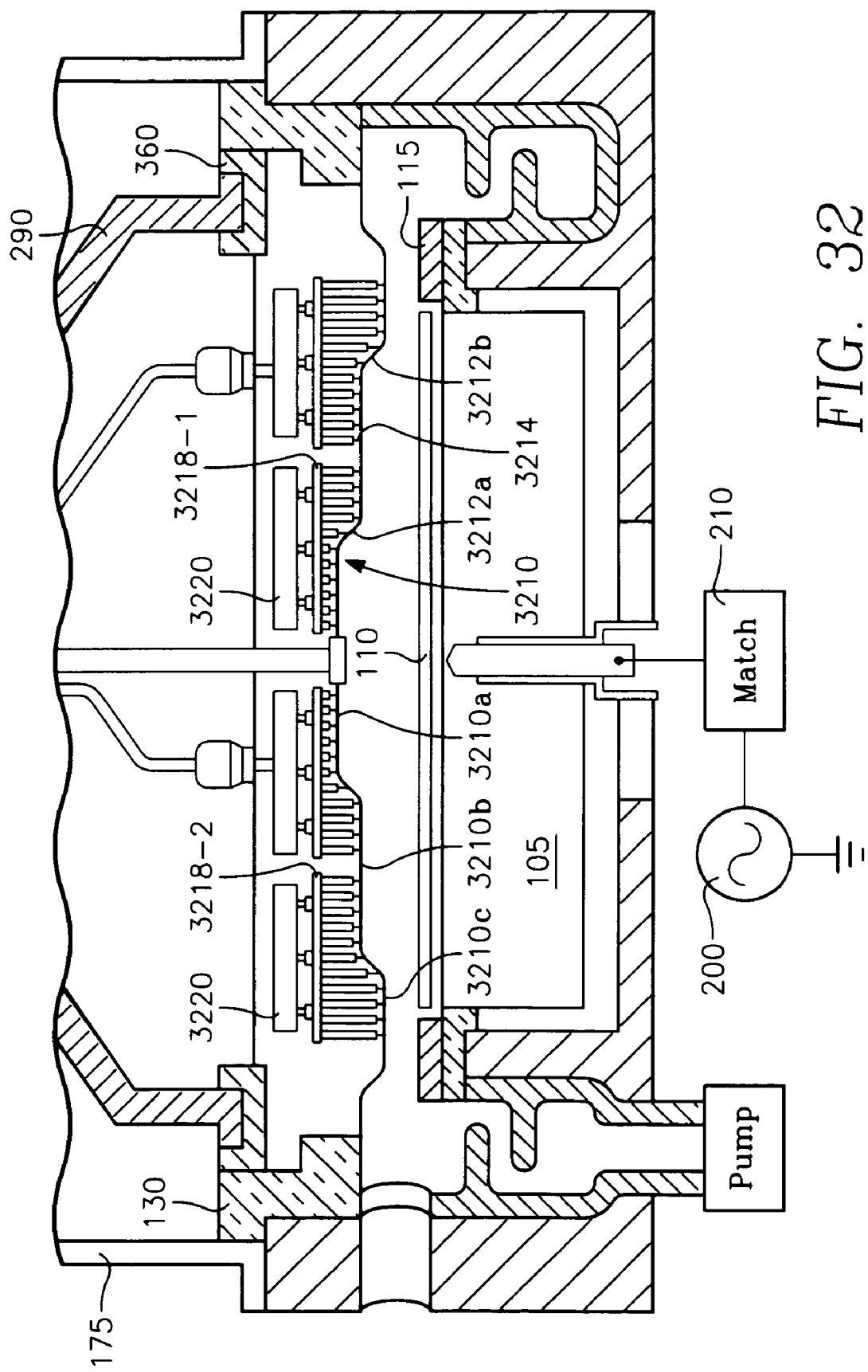
FIG. 32 depicts an embodiment of an overhead gas distribution electrode having a stepped surface.
Figure 33:
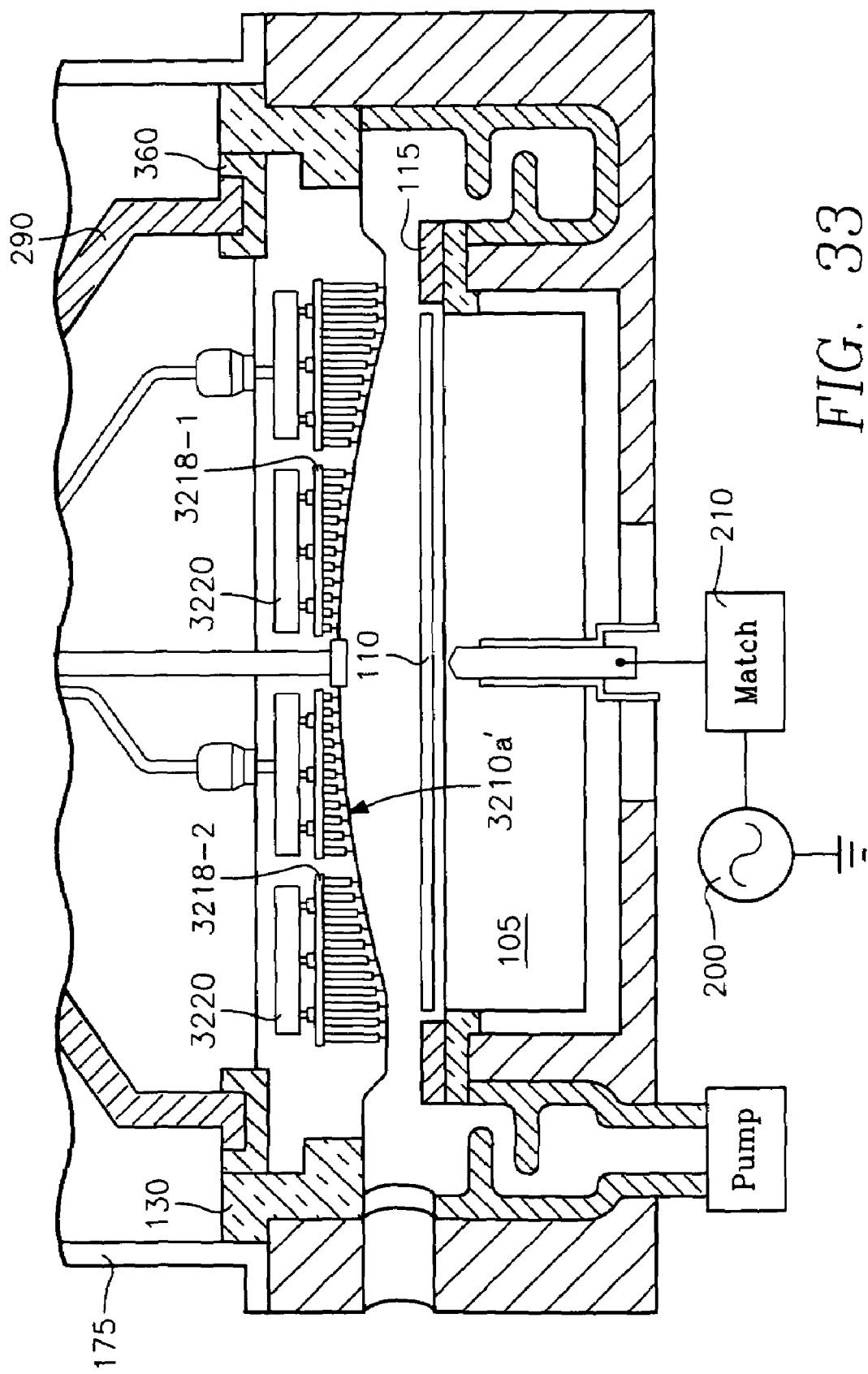
FIG. 33 depicts an embodiment of an overhead gas distribution electrode having a curved surface.

A gas distribution overhead source power ceiling electrode of the type illustrated in FIG. 32 (having a stepped shape higher at the center than at the edge) or FIG. 33 (having a curved shape higher at the center than at the edge) can reduce the ion distribution non-uniformity (improve the uniformity) by a factor of about two. This is shown in the graph of FIG. 34 showing etch rate at the wafer surface as a function of radial position that is produced by the stepped showerhead electrode of FIG. 32. The etch rate in FIG. 34 was inferred from the power density distribution. A similar etch rate distribution is produced by the curved showerhead electrode of FIG. 33. In the curved or stepped showerhead electrodes of FIGS. 32 or 33, the center-to-edge deviation in etch rate is reduced is reduced to 20%, which is less than half the deviation (55%) produced by the flat electrode. This is because the stepped or curved center-high showerhead electrodes of FIGS. 32 and 33 confine the plasma in a smaller wafer-to-ceiling gap at the wafer edge than at the center, thereby enhancing plasma ion density near the edge. Such results require a relatively high curvature or steep step in the bottom surface of the electrode. For example, in one implementation of the stepped electrode of FIG. 32, the diameter is about 300 mm and the wafer-to-ceiling gap at the wafer edge, 25 mm, which is a center-to-edge gap difference of about 12 mm. In one implementation of the curved ceiling of FIG. 33, the center-to-edge gap difference is 15 mm. It is not practical to fabricate the gas showerhead electrode of FIGS. 16–20 with such a high curvature or steep step. In particular, fabrication of the large number of narrow annular gas injection openings 908 of FIG. 18, and of the complex assembly of FIG. 19 employing a large number of press-fit plugs, would entail a prohibitive cost.

The present reactor departs from the approach of FIGS. 16–20 to solve the problem of arcing. It will be remembered that the narrow annular shape of each gas opening 908 of FIG. 18 was necessary in order to enhance the rate at which the radial electric field in each opening dropped with height in order to suppress arcing. In the present reactor, we have found that the drop in the radial electric field in a purely cylindrical hole is sufficient to suppress arcing, provided a supply-to-vacuum gas pressure drop in very small orifices is achieved at a sufficient height above the region of high radial electric fields. Therefore, the present reactor employs relatively large cylindrical gas outlet holes at the electrode surface (to avoid high gas pressure in the region of high radial electric fields near the plasma) fed by very small pressure-dropping orifices well above the gas exit holes (so that virtually all of the supply-to-vacuum gas pressure drop occurs above the region of high radial electric fields). An advantage of employing cylindrical hole gas outlets (instead of the annular gas outlets of FIG. 18) is that cylindrical holes can be readily fabricated in highly curved or steeply stepped surfaces, such as the bottom surface of the stepped electrode of FIG. 32 or the bottom surface of the curved electrode of FIG. 33.

Features which aid in suppressing arcing or plasma discharge within each outlet hole include: (1) high conductance (large diameter) of the gas outlet holes to avoid high pressure within the high radial electric field region at or near the plasma, (2) low conductance (small diameter) of the pressure-dropping orifices to drop the gas pressure from the supply pressure to the chamber vacuum pressure before the gas reaches the gas outlet holes, and (3) sufficient axial height of the pressure-dropping orifices above the plasma-facing electrode surface to minimize the radial electric fields in the pressure-dropping orifices. This axial height is sufficient to prevent the combination of gas pressure and radial electric field strength from exceeding the arcing threshold defined by the Paschen curve of FIG. 23. Specifically, within the pressure-dropping orifices, the axial height above the plasma-facing electrode surface is sufficient to produce such a low radial electric field within each orifice that the pressure-field combination corresponds to the high pressure-low field location 930 below the Paschen curve of FIG. 23. This axial height of the pressure-dropping orifices is sufficient to meet that condition at high levels of plasma RF or VHF source power, typically in the thousands of Watts. The required axial height of the pressure-dropping orifices can be on the order of about 50 to 70 mm where the electrode is formed primarily of a metal such as aluminum, for example. (The Paschen curve of FIG. 23 uses the dimension of "pressure" for the horizontal axis, which is convenient for gas holes having uniform diameter along their entire length. However, this dimension is actually "pressure times diameter" for holes whose diameter changes along the length of the hole.)

FIG. 32 illustrates a modification of the reactor of FIG. 15 in which the overhead electrode has a center high stepped surface facing the plasma. In the drawing of FIG. 32, the heating and cooling plates 903, 904 of FIG. 15 are omitted for the sake of simplicity. Referring now to FIG. 32, the surfaces facing the process zone of the stepped gas showerhead electrode 3210 include a circular center flat surface 3210a, and flat annular outer surfaces 3210b, 3210c successively stepped down from the height of the center flat surface 3210a. Although three stepped surfaces are employed in the embodiment of FIG. 32, any suitable number may be employed. The stepped surfaces 3210a, 3210b are smoothly joined by an annular diagonal and arcuate transition surface 3212a. The stepped surfaces 3210b, 3210c are smoothly joined by an annular diagonal and arcuate transition surface 3212b.

Figure 35:
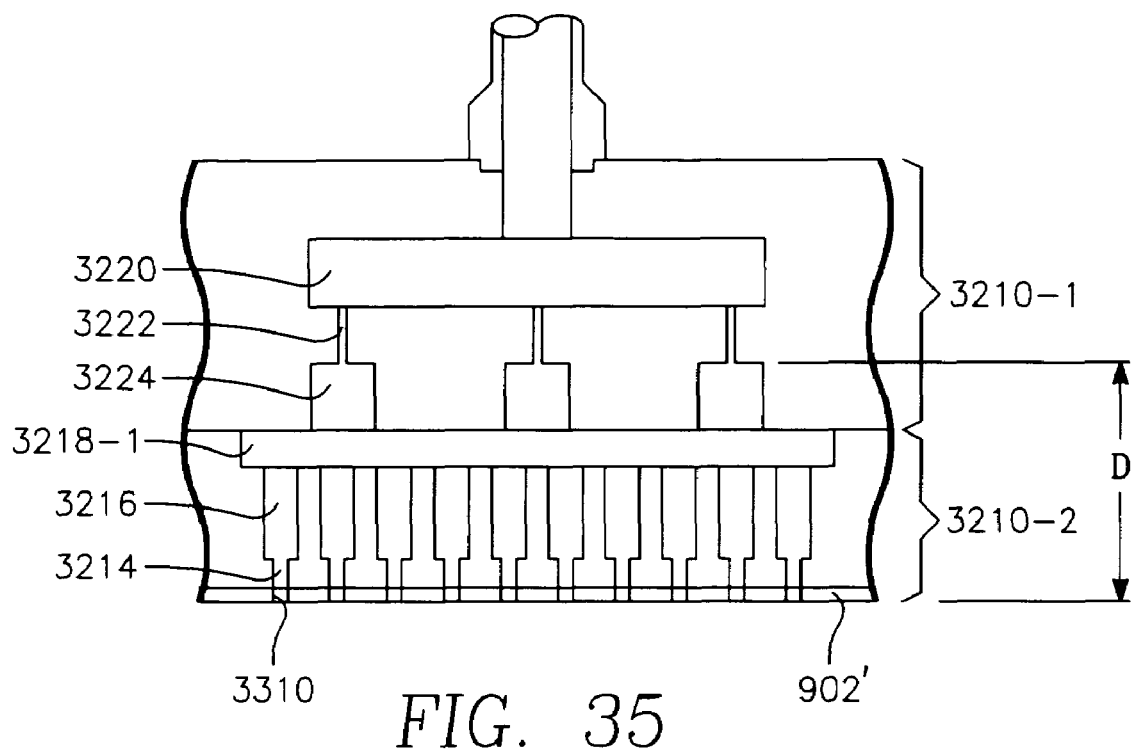
FIG. 35 is an enlarged cross-sectional view of a portion of the electrode of either FIG. 32 or FIG. 33.

Each of these surfaces has a large number of gas outlet holes 3214 drilled therein, their hole diameter being relatively large, on the order of about 50 mils (50 thousandths of an inch). Referring now to the enlarged cross-sectional view of FIG. 35, each outlet hole 3214 expands into a larger upper hole 3216. Referring again to FIG. 32, thin inner and outer plenums 3218-1, 3218-2 extend radially across inner and outer annual zones of the electrode 3210. The inner and outer plenums 3218-1, 3218-2 are coupled (in a manner to be described below) to separate inner and outer groups of gas outlet ports so that the radial distribution of gas flow may be adjusted by adjusting gas flow to the inner and outer plenums separately. The enlarged view of FIG. 35 shows only the inner plenum 3218-1. Together, the inner and outer plenums 3218-1, 3218-2 can be thought of as defining a border between upper and lower sections 3210-1, 3210-2 of the electrode 3210. Referring again to the enlarged view of FIG. 35, gas manifolds 3220 in the top of the upper electrode section 3210-1 feed very small pressure-dropping orifices 3222 coupled to the radially extending plenum 3218 through high conductance passages 3224 having a large diameter between about 200 and 300 mils. The pressure-dropping orifices 3222 are small elongate axially-extending cylindrical holes. Their diameter, which in one implementation was on the order of 10 mils, is sufficiently small to drop the gas pressure from the supply pressure down at least nearly to the vacuum pressure in the reactor chamber, provided the gas conductance through the outlet holes 3214, 3216 in the lower electrode section 3210-2 is sufficiently great. For this reason, the gas outlet holes 3214, 3216 are relatively large in diameter, on the order of about 50 mils. Similarly, each of the radially extending thin plenums 3218-1, 3218-2 has a sufficiently large planar area (having an area on the order of half the area of the overhead electrode) so that, despite the small height of each plenum 3218-1, 3218-2, gas conductance within each plenum 3218-1, 3218-2 is similarly high, to avoid pressure gradients therein.

In order to guarantee axial separation between the high pressure region of the small orifices 3222 and the plasma, the pressure-dropping orifices 3222 are on the order of about 70 mm above the center inner electrode surface 3210a. This axial displacement (D in FIG. 35) is much greater at the outer electrode surface 3210c near the wafer edge due to the stepped configuration of the electrode 3210.) In order to accommodate the different axial heights of each of the stepped surfaces 3210a, 3210b, 3210c, the axial lengths of the intermediate gas holes 3216 vary as a function of radial location, ranging from a maximum length in the outermost surface 3210c to a minimum length in the inner or center surface 3210a. In order to ensure a sufficient minimum axial displacement of the pressure-dropping orifices 3222 above the plasma-facing surface of the electrode, the large gas passages 3224 fed by the orifices 3222 have an axial length almost as long as the minimum displacement required to meet the conditions described above for preventing arcing or plasma breakdown in the gas outlets 3214. This distance is about 70 mm. The most desirable choice for this distance may vary, depending upon the RF or VHF source power level applied to the electrode and depending upon the gas pressure inside the vacuum chamber.

The electrode 3210 may be formed of a metal such as aluminum, for example. A thin silicon carbide protective layer 902' shown in FIG. 35 may be attached to the bottom surface of the electrode 3210. The silicon carbide protective layer 902' corresponds to the silicon carbide protective layer 902 of FIG. 20, except that the silicon carbide protective layer 902' of FIG. 35 does not have annular-shaped gas outlets (FIG. 18) but instead has cylindrical-shaped holes 3310 for gas outlets that match and are in registration with the gas outlet holes 3214 of the electrode 3210. It is the simple cylindrical shape of the gas outlet holes 3310 of the silicon carbide protective layer 902' that makes it practical to fabricate the silicon carbide protective layer 902' with the steep steps of FIG. 32 or the sharp curvature of FIG. 33. The terms steep or sharp refer to a relatively large center-to-edge gap difference, which in the examples of FIGS. 32 and 33 was on the order of 12 mm over a 300 mm diameter, or about 4%.

Figure 36:
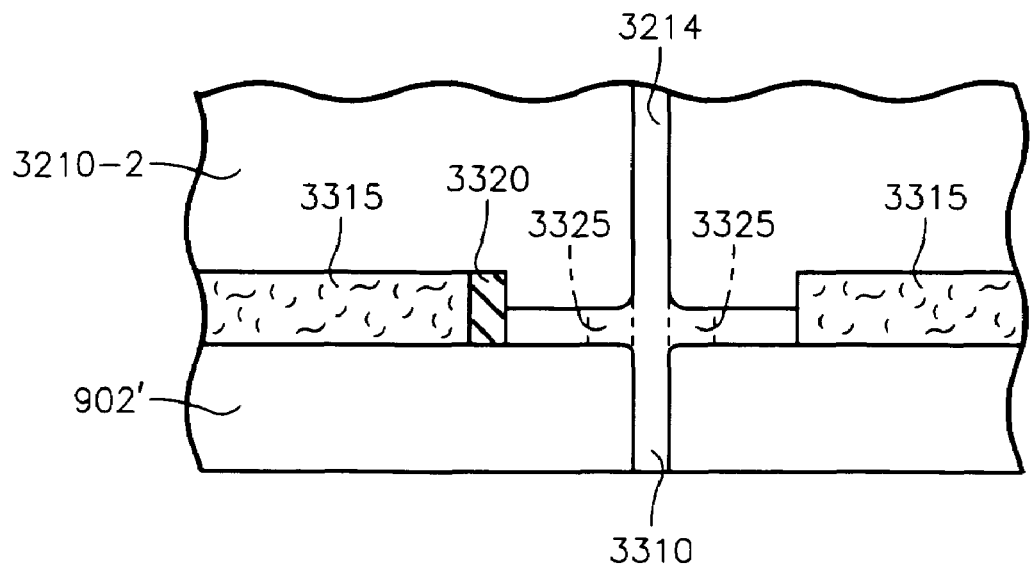
FIG. 36 is an enlarged cross-sectional view of a portion of FIG. 35.

Referring to FIG. 36, the silicon carbide protective layer 902' is bonded to the bottom surface of the electrode 3210 (i.e., the bottom surface of the lower electrode section 3210-2) by an adhesive material 3315 of the type discussed with reference to FIG. 20. Axial posts 3320 extend from the bottom of the electrode and have a height that determines spacing between the electrode 3210 and the protective layer 902'. The electrode 3210 can have axially extending shoulders 3325 protruding downwardly from the bottom surface and surrounding each gas outlet 3214 so as to at least partially shield the adhesive glue 3315 from plasma.

Figure 37:
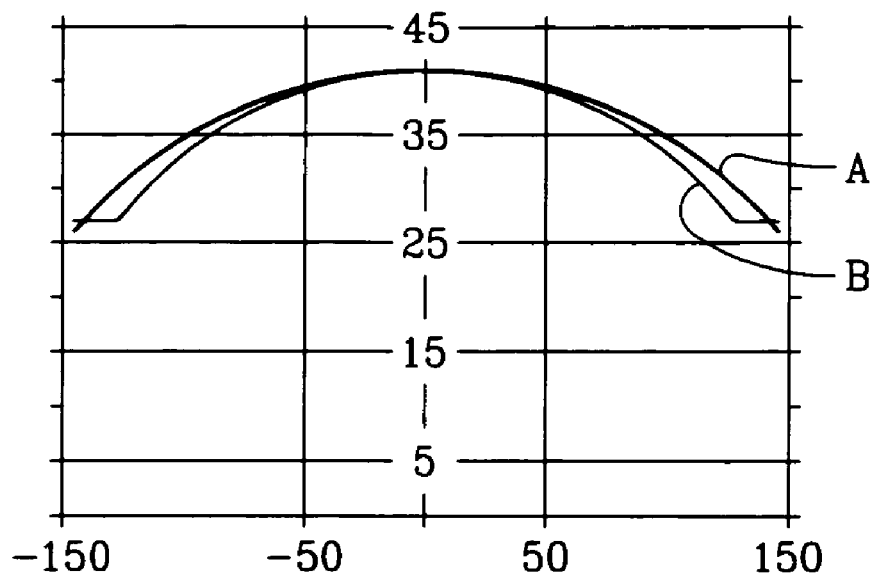
FIG. 37 is a graph illustrating the radial distribution of electrode surface height for different embodiments of a shaped electrode in accordance with FIG. 33.
Figure 38:
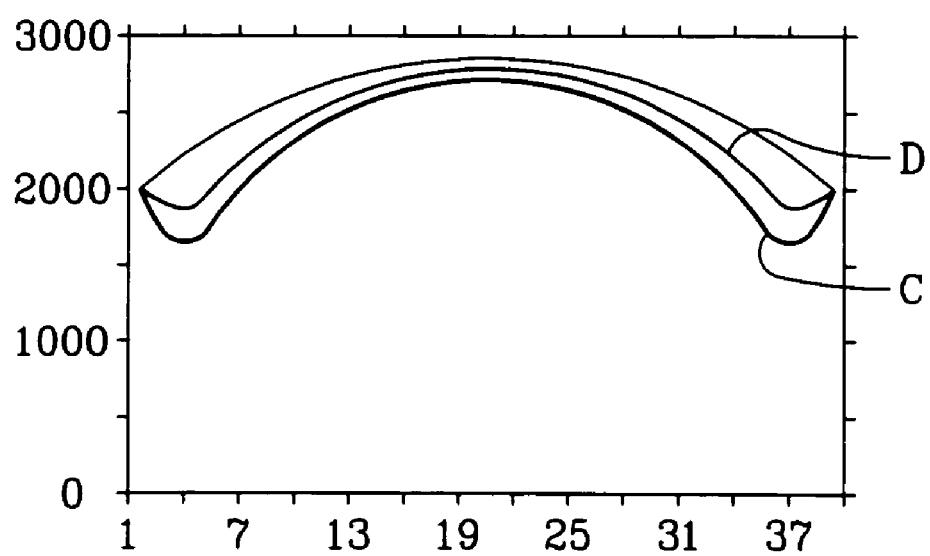
FIG. 38 is a graph illustrating radial distributions of etch rate obtained with respective embodiments represented in FIG. 37.

FIG. 33 illustrates a reactor similar to that of FIG. 32, except that the bottom surface 3210a' of the overhead electrode of FIG. 33 is not stepped but is rather a continuous arcuate surface having a center-high curvature. Different curvatures may be employed in configuring the electrode of FIG. 33, as shown in the graph of FIG. 37. FIG. 37 is a graph depicting electrode height in millimeters (measured at the bottom of the silicon carbide protective layer 902') as a function of radius in millimeters of two different embodiments labeled A and B. The curve labeled A depicts an embodiment having a constant radius of curvature. Other embodiments could be multi-radius domes. The curve labeled B depicts an embodiment in which the outermost 10% of the electrode is flat. FIG. 38 is a graph depicting etch rate as a function of radius. The curve labeled C in FIG. 38 represents the results obtained with the curved electrode configuration A of FIG. 37 while the curve labeled D represents the results obtained with the curved electrode configuration B of FIG. 37 having the flat edge annulus. FIG. 38 indicates that the flattened electrode edge design (B of FIG. 37) reduces non-uniformity in etch rate near the wafer edge. The curvature of both configurations A and B in FIG. 37 is such that the center-to-edge height difference is about 27% of the electrode diameter. This height difference may be in a range of about 20% to 100% of the electrode diameter, for example.

While the reactor has been described in detail by specific reference to preferred embodiments, it is understood that variations and modifications may be made without departing from the true spirit and scope of the reactor.

What is claimed is:

1. In a plasma reactor for processing a workpiece on a support pedestal in a vacuum chamber of the reactor, a radially extending gas distribution electrode forming at least a portion of the ceiling of the reactor, the electrode being an RF plasma source power applicator of the reactor and having a bottom surface facing a processing zone of the reactor, the electrode comprising:

a gas supply manifold for receiving process gas at a supply pressure at a top portion of said electrode;

plural pressure-dropping cylindrical orifices extending axially relative to said electrode from said gas supply manifold at one end of each orifice;

a radial gas distribution manifold within said electrode extending radially across said electrode;

plural axially extending high conductance gas flow passages coupling the opposite ends of respective ones of said plural pressure-dropping orifices to said radial gas distribution manifold; and plural high conductance cylindrical gas outlet holes formed in said bottom surface of said electrode and extending axially to said radial gas distribution manifold.

2. The electrode of claim 1 wherein the bottom surface of the electrode is a non-planar surface comprising one of:
(a) a curved surface;
(b) a stepped surface.

3. The electrode of claim 2 wherein the non-planar bottom surface is a center-high surface.

4. The electrode of claim 3 wherein the non-planar bottom surface has a center-to-edge height difference that is between about 20% and 100% of the diameter of the electrode.

5. The electrode of claim 3 further comprising a protective layer covering the bottom surface, the protective layer being formed of a process-compatible material, the gas outlet holes continuing through the protective layer.

6. The electrode of claim 5 wherein the protective layer comprises a semiconductor-containing material.

7. The electrode of claim 6 wherein the semiconductor-containing material comprises silicon carbide.

8. The electrode of claim 6 wherein the semiconductor-containing material comprises at least one of:
(a) silicon,
(b) carbon,
(c) germanium.

9. The electrode of claim 1 wherein the plural pressure-dropping orifices are on the order of one fifth the diameter of the gas outlet passages.

10. The electrode of claim 9 wherein the pressure-dropping orifices are on the order of 10 mil in diameter.

11. The electrode of claim 1 wherein the high conductance gas flow passages have an axial length defining a minimum axial displacement of the pressure-dropping orifices above the bottom surface.

12. The electrode of claim 11 wherein the minimum displacement is sufficient to prevent arcing or plasma breakdown within the pressure-dropping orifices.

13. The electrode of claim 11 wherein the minimum displacement is sufficient to maintain a radial electrical within each orifice sufficiently low whereby the combination of gas pressure and radial field values within the orifice are insufficient for plasma breakdown.

14. The electrode of claim 1 wherein the high conductance gas flow passages have an axial length on the order of about 70 mm.

15. The electrode of claim 1 wherein the pressure-dropping orifices have a sufficiently small gas conductance and the gas outlet holes have a sufficiently high gas conductance so that the pressure drop through each of the pressure-dropping orifices is at least 80% of the pressure difference between the supply pressure and the vacuum chamber.

16. The electrode of claim 15 wherein the pressure-dropping orifices are sufficiently displaced axially from the bottom surface so that the radial electric field in the pressure-dropping orifices is less than 10% of the maximum radial electric field in the gas outlet holes.

17. The electrode of claim 1 wherein the bottom surface comprises a center-high curved surface having a flat annular periphery.

18. A gas distribution metallic electrode of a plasma reactor, the electrode having a bottom surface facing a low pressure processing zone of the reactor, the electrode comprising:

plural pressure-dropping cylindrical orifices extending axially relative to the electrode and coupled to receive process gas at a supply pressure at one end of each orifice; and plural axially extending high conductance cylindrical gas outlet holes formed in the bottom surface and coupled to a low pressure side of the pressure dropping orifices.

19. The electrode of claim 18 wherein the bottom surface of the electrode is a non-planar surface comprising one of:
(a) a curved surface;
(b) a stepped surface.

20. The electrode of claim 19 wherein the non-planar bottom surface is a center-high surface.

21. The electrode of claim 20 wherein the non-planar bottom surface has a center-to-edge height difference that is between about 20% and 100% of the diameter of the electrode.

22. The electrode of claim 21 further comprising a protective layer covering the bottom surface, the protective layer being formed of a process-compatible material, the gas outlet holes continuing through the protective layer.

23. The electrode of claim 22 wherein the protective layer comprises a semiconductor-containing material.

24. The electrode of claim 23 wherein the semiconductor-containing material comprises silicon carbide.

25. The electrode of claim 23 wherein the semiconductor-containing material comprises at least one of:
(a) silicon,
(b) carbon,
(c) germanium.

26. The electrode of claim 18 wherein the plural pressure-dropping orifices are on the order of one fifth the diameter of the gas outlet passages.

27. The electrode of claim 26 wherein the pressure-dropping orifices are on the order of 10 mil in diameter.

28. The electrode of claim 18 wherein the pressure-dropping orifices are located sufficiently far from the bottom surface to have a reduced radial electric field relative to the bottom surface, and the pressure-dropping orifices are sufficiently narrow to restrict pressure in the gas outlet holes to a pressure at or near a vacuum pressure of the chamber.

29. The electrode of claim 28 wherein the reduced radial electric field is sufficiently small to prevent arcing or plasma breakdown within the pressure-dropping orifices.

30. The electrode of claim 18 wherein the pressure-dropping orifices have a sufficiently small gas conductance and the gas outlet holes have a sufficiently high gas conductance so that the pressure drop through each of the pressure-dropping orifices is at least 80% of the pressure difference between the supply pressure and the vacuum chamber.

31. The electrode of claim 30 wherein the pressure-dropping orifices are sufficiently displaced axially from the bottom surface so that the radial electric field in the pressure-dropping orifices is less than 10% of the maximum radial electric field in the gas outlet holes.

32. The electrode of claim 18 wherein the bottom surface comprises a center-high curved surface having a flat annular periphery.

33. A plasma reactor comprising:

a vacuum chamber;

gas distribution metallic electrode forming a ceiling of the chamber and having an electrode reactance, the electrode having a bottom surface facing a low pressure processing zone of the reactor, the electrode comprising:

plural pressure-dropping cylindrical orifices extending axially relative to the electrode and coupled to receive process gas at a supply pressure at one end of each orifice;

plural axially extending high conductance cylindrical gas outlet holes formed in the bottom surface and coupled to a low pressure side of the pressure dropping orifices;

a VHF source power generator and a fixed impedance match element coupling the generator to the electrode; and the VHF electrode having a reactance that forms a resonance with plasma in the chamber at a plasma resonant frequency that is the same as or nearly the same as the frequency of the VHF source power generator.

34. The reactor of claim 33 wherein the fixed impedance match element has a resonant frequency that is the same as or nearly the same as the resonant frequency.

35. The reactor of claim 34 wherein the fixed impedance match element comprises a tuning stub.

36. The reactor of claim 34 wherein the fixed impedance match element comprises a strip line circuit.

37. The reactor of claim 34 wherein the resonant frequency of the fixed impedance match element and the frequency of the VHF source power generator are offset from the plasma resonant frequency.

38. The electrode of claim 33 wherein the bottom surface of the electrode is a non-planar surface comprising one of:

(a) a curved surface;

(b) a stepped surface.

39. The electrode of claim 38 wherein the non-planar bottom surface is a center-high surface.

40. The electrode of claim 39 wherein the non-planar bottom surface has a center-to-edge height difference that is between about 20% and 100% of the diameter of the electrode.

41. The electrode of claim 33 further comprising a protective layer covering the bottom surface, the protective layer being formed of a process-compatible material, the gas outlet holes continuing through the protective layer.

42. The electrode of claim 41 wherein the protective layer comprises a semiconductor-containing material.

43. The electrode of claim 42 wherein the semiconductor-containing material comprises silicon carbide.

44. The electrode of claim 42 wherein the semiconductor-containing material comprises at least one of:

(a) silicon, (b) carbon, (c) germanium.

45. The electrode of claim 33 wherein the plural pressure-dropping orifices are on the order of one fifth the diameter of the gas outlet passages.

46. The electrode of claim 26 wherein the pressure-dropping orifices are on the order of 10 mil in diameter.

47. The electrode of claim 33 wherein the pressure-dropping orifices are located sufficiently far from the bottom surface to have a reduced radial electric field relative to the bottom surface, and the pressure-dropping orifices are sufficiently narrow to restrict pressure in the gas outlet holes to a pressure at or near a vacuum pressure of the chamber.

48. The electrode of claim 47 wherein the reduced radial electric field is sufficiently small to prevent arcing or plasma breakdown within the pressure-dropping orifices.

* * * * *